United States Patent
Mathuriya et al.

(10) Patent No.: US 12,289,104 B1
(45) Date of Patent: Apr. 29, 2025

(54) FERROELECTRIC OR PARAELECTRIC BASED LOW POWER MULTIPLIER ARRAY

(71) Applicant: Kepler Computing Inc., San Francisco, CA (US)

(72) Inventors: Amrita Mathuriya, Portland, OR (US); Ikenna Odinaka, Durham, NC (US); Rajeev Kumar Dokania, Beaverton, OR (US); Rafael Rios, Austin, TX (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 798 days.

(21) Appl. No.: 17/467,115

(22) Filed: Sep. 3, 2021

Related U.S. Application Data

(63) Continuation of application No. 17/465,784, filed on Sep. 2, 2021.

(51) Int. Cl.
| | | |
|---|---|---|
| *H03K 19/23* | (2006.01) | |
| *G06F 7/57* | (2006.01) | |
| *H10D 1/68* | (2025.01) | |

(52) U.S. Cl.
CPC .............. *H03K 19/23* (2013.01); *G06F 7/57* (2013.01); *H10D 1/682* (2025.01); *H10D 1/694* (2025.01)

(58) Field of Classification Search
CPC .......... G06F 7/57; H01L 28/55; H01L 28/65; H03K 19/23
See application file for complete search history.

(56) References Cited

U.S. PATENT DOCUMENTS

| | | | |
|---|---|---|---|
| 3,260,863 A | | 7/1966 | Burns et al. |
| 3,524,977 A | | 8/1970 | Wang |
| 4,598,382 A | * | 7/1986 | Sato ............... G06F 7/5306 |
| | | | 708/550 |
| 4,748,583 A | * | 5/1988 | Noll ............... G06F 7/5312 |
| | | | 708/626 |
| 4,761,760 A | | 8/1988 | Tomoji |
| 5,381,352 A | | 1/1995 | Shou et al. |

(Continued)

FOREIGN PATENT DOCUMENTS

| | | |
|---|---|---|
| JP | 2000156472 A | 6/2000 |
| KR | 20160089141 A | 7/2016 |
| WO | 2019005175 A1 | 1/2019 |

OTHER PUBLICATIONS

"Kepler Logic", Named for Amalie Emmy Noether @ https://en.wikipedia.org/wiki/Emmy_Noether.

(Continued)

*Primary Examiner* — Kurtis R Bahr
(74) *Attorney, Agent, or Firm* — MUGHAL GAUDRY & FRANKLIN PC

(57) ABSTRACT

A low power adder uses a non-linear polar capacitor to retain charge with fewer transistors than traditional CMOS sequential circuits. The non-linear polar capacitor includes ferroelectric material, paraelectric material, or non-linear dielectric. The adder may include minority gates and/or majority gates. Input signals are received by respective terminals of capacitors having non-linear polar material. The other terminals of these capacitors are coupled to a node where the majority function takes place for the inputs.

20 Claims, 41 Drawing Sheets

(56) References Cited

U.S. PATENT DOCUMENTS

| | | | |
|---|---|---|---|
| 5,570,039 A * | 10/1996 | Oswald | G06F 7/53 |
| | | | 326/38 |
| 5,818,380 A | 10/1998 | Ito et al. | |
| 5,835,045 A | 11/1998 | Ogawa et al. | |
| 5,926,057 A | 7/1999 | Ogawa et al. | |
| 5,978,827 A | 11/1999 | Ichikawa | |
| 6,043,675 A | 3/2000 | Miyamoto | |
| 6,140,839 A * | 10/2000 | Kaviani | H03K 19/17736 |
| | | | 326/39 |
| 6,198,652 B1 | 3/2001 | Kawakubo et al. | |
| 6,208,282 B1 | 3/2001 | Miyamoto | |
| 6,407,442 B2 | 6/2002 | Inoue et al. | |
| 6,505,226 B1 | 1/2003 | Ahn | |
| 7,212,448 B1 | 5/2007 | Trimberger | |
| 7,837,110 B1 | 11/2010 | Hess et al. | |
| 7,897,454 B2 | 3/2011 | Wang et al. | |
| 8,247,855 B2 | 8/2012 | Summerfelt | |
| 8,571,159 B1 | 10/2013 | Soh | |
| 9,276,040 B1 | 3/2016 | Marshall et al. | |
| 9,324,405 B2 | 4/2016 | Evans, Jr. et al. | |
| 9,697,882 B1 | 7/2017 | Evans, Jr. et al. | |
| 9,858,979 B1 | 1/2018 | Derner et al. | |
| 9,912,323 B1 | 3/2018 | Ardalan | |
| 9,973,329 B2 | 5/2018 | Hood et al. | |
| 10,164,618 B1 | 12/2018 | Shi et al. | |
| 10,217,522 B2 | 2/2019 | Wang et al. | |
| 10,622,050 B2 | 4/2020 | El-Mansouri et al. | |
| 10,679,782 B2 | 6/2020 | Manipatruni et al. | |
| 10,944,404 B1 * | 3/2021 | Manipatruni | G06F 7/501 |
| 11,165,430 B1 | 11/2021 | Manipatruni et al. | |
| 11,283,453 B2 | 3/2022 | Manipatruni et al. | |
| 2001/0052619 A1 | 12/2001 | Inoue et al. | |
| 2002/0185690 A1 | 12/2002 | Ueda et al. | |
| 2004/0183508 A1 | 9/2004 | Toyoda et al. | |
| 2006/0195503 A1 * | 8/2006 | Swami | G06F 7/523 |
| | | | 708/620 |
| 2015/0269478 A1 | 9/2015 | Datta et al. | |
| 2015/0337983 A1 | 11/2015 | Dolenti et al. | |
| 2017/0243917 A1 | 8/2017 | Manipatruni et al. | |
| 2017/0337983 A1 | 11/2017 | Wang et al. | |
| 2018/0076815 A1 | 3/2018 | Vigeant et al. | |
| 2018/0240583 A1 | 8/2018 | Manipatruni et al. | |
| 2019/0074295 A1 | 3/2019 | Schröder | |
| 2019/0318775 A1 | 10/2019 | Rakshit et al. | |
| 2019/0348098 A1 | 11/2019 | El-Mansouri et al. | |
| 2020/0091407 A1 | 3/2020 | Liu et al. | |
| 2020/0091414 A1 | 3/2020 | Liu et al. | |
| 2020/0210233 A1 | 7/2020 | Chen et al. | |
| 2020/0258894 A1 | 8/2020 | Lilak et al. | |
| 2021/0226636 A1 | 7/2021 | Manipatruni et al. | |
| 2022/0200600 A1 * | 6/2022 | Manipatruni | H03K 19/23 |
| 2022/0271756 A1 | 8/2022 | Fan et al. | |

OTHER PUBLICATIONS

Fichtner, S., et al. "AlScN: A III-V semiconductor based ferroelectric," Journal of Applied Physics 125, 114103 (2019); https://doi.org/10.1063/1.5084945.

Final Office Action notified Jul. 6, 2020 for U.S. Appl. No. 16/729,269.

Final Office Action notified Nov. 24, 2020 for U.S. Appl. No. 16/797,299.

Final Office Action notified Nov. 27, 2020 for U.S. Appl. No. 16/729,275.

First Office Action & Search Report notified Jun. 25, 2021 for Taiwan Patent Application No. 109146064.

First Office Action notified Jul. 7, 2021 for Taiwan Patent Application No. 109146061.

International Search Report & Written Opinion notified Apr. 15, 2021 for U.S. Patent Application No. PCT/US2020/066961.

International Search Report & Written Opinion notified Apr. 22, 2021 for PCT Patent Application No. PCT/US2020/066963.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., "Threshold Logic and its Applications", New York, Wiley-Interscience. published 1971.

Non-Final Office Action notified Apr. 22, 2020 for U.S. Appl. No. 16/729,275.

Non-Final Office Action notified Aug. 7, 2020 for U.S. Appl. No. 16/729,275.

Non-Final Office Action notified Aug. 11, 2020 for U.S. Appl. No. 16/796,824.

Non-Final Office Action notified Aug. 13, 2020 for U.S. Appl. No. 16/797,299.

Non-Final Office Action notified Mar. 27, 2020 for U.S. Appl. No. 16/729,269.

Non-Final Office Action notified Nov. 24, 2020 for U.S. Appl. No. 16/796,824.

Non-Final Office Action notified Sep. 16, 2021 for U.S. Appl. No. 17/129,824.

Notice of Allowance notified Feb. 3, 2021 for U.S. Appl. No. 16/729,275.

Notice of Allowance notified Feb. 5, 2020 for U.S. Appl. No. 16/796,824.

Notice of Allowance notified Jan. 29, 2020 for U.S. Appl. No. 16/797,299.

Notice of Allowance notified Nov. 3, 2020 for U.S. Appl. No. 16/797,296.

Notice of Allowance notified Oct. 1, 2021 for Taiwan Patent Application No. 109146061.

Notice of Allowance notified Sep. 21, 2020 for U.S. Appl. No. 16/729,269.

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

Final Office Action notified Dec. 15, 2021 for U.S. Appl. No. 17/129,824.

Final Office Action notified Nov. 26, 2021 for U.S. Appl. No. 17/129,800.

Non-Final Office Action notified Nov. 3, 2021 for U.S. Appl. No. 17/129,800.

Notice of Allowance notified Dec. 3, 2021 for U.S. Appl. No. 17/129,830.

Notice of Allowance notified Dec. 21, 2021 for U.S. Appl. No. 17/129,800.

Notice of Allowance notified Oct. 28, 2021 for Taiwan Patent Application No. 109146064.

Final Office Action notified Apr. 4, 2022 for U.S. Appl. No. 17/129,849.

Non-Final Office Action notified Feb. 22, 2022 for U.S. Appl. No. 17/129,849.

Notice of Allowance notified Apr. 14, 2022 for U.S. Appl. No. 17/129,849.

Notice of Allowance notified Mar. 2, 2022 for U.S. Appl. No. 17/129,821.

Advisory Action notified Nov. 15, 2023 for U.S. Appl. No. 17/467,061.

Final Office Action notified Sep. 7, 2023 for U.S. Appl. No. 17/467,061.

Hou et al., "Ultrahigh Energy Density in SrTIO3 Film Capacitors," ACS Appl. Mater. Interfaces 2017, 9, 24, 20484-20490 Publication Date: May 30, 2017, https://doi.org/10.1021/acsami. 7b02225, (7 pages).

International Preliminary Report on Patentability notified Jul. 7, 2022 for PCT Patent Application No. PCT/US2020/066961.

International Preliminary Report on Patentability notified Jul. 7, 2022 for PCT Patent Application No. PCT/US2020/066963.

Navi et al., "Two novel ultra-high speed carbon nanotube Full-Adder cells," IEICE Electronics Express, vol. 6, No. 19, 1395-1401, doi :10.1587/elex.6.1395. Publication date Oct. 10, 2009, (7 pages).

Non-Final Office Action notified Apr. 17, 2023 for U.S. Appl. No. 17/467,061.

Non-Final Office Action notified Dec. 27, 2022 for U.S. Appl. No. 17/654,055.

(56) References Cited

OTHER PUBLICATIONS

Non-Final Office Action notified Feb. 21, 2024 for U.S. Appl. No. 18/056,243.
Non-Final Office Action notified Jan. 12, 2024 for U.S. Appl. No. 17/467,061.
Non-Final Office Action notified Jun. 15, 2023 for U.S. Appl. No. 17/503,124.
Non-Final Office Action notified Sep. 9, 2022 for U.S. Appl. No. 17/317,482.
Notice of Allowance notified Aug. 9, 2023 for U.S. Appl. No. 17/503,124.
Notice of Allowance notified Feb. 23, 2024 for U.S. Appl. No. 18/320,163.
Notice of Allowance notified Jul. 15, 2022 for U.S. Appl. No. 17/183,181.
Notice of Allowance notified Mar. 31, 2023 for U.S. Appl. No. 17/654,055.
Notice of Allowance notified Sep. 23, 2022 for U.S. Appl. No. 17/317,482.
Notice of Allowance notified Sep. 29, 2021 for TW Patent Application No. 109146061.

\* cited by examiner

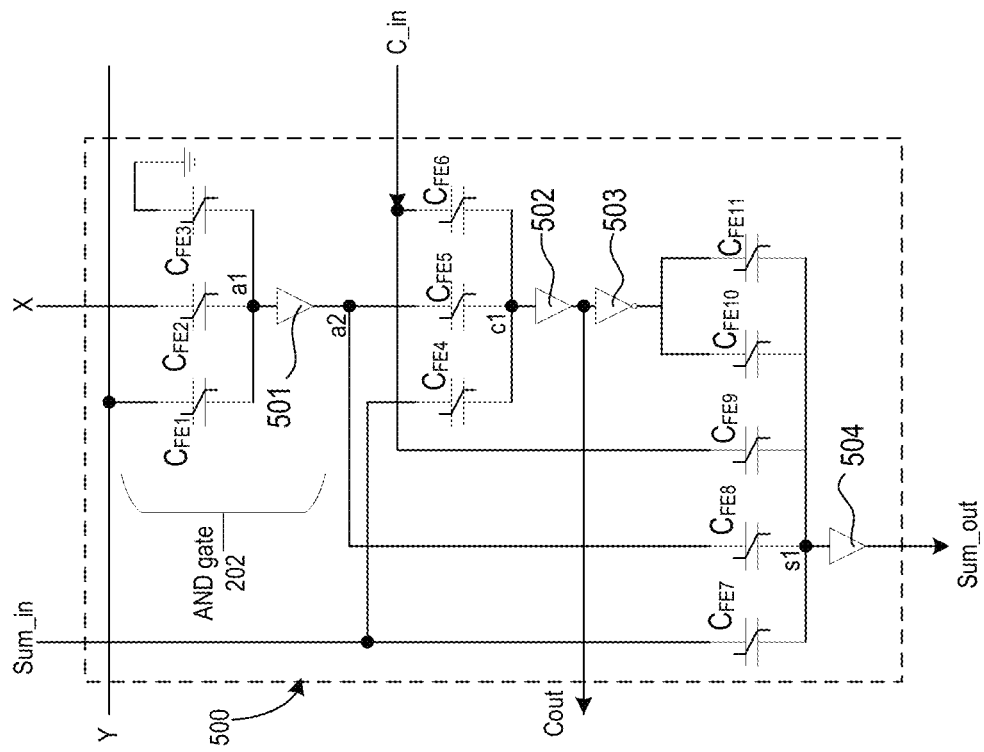
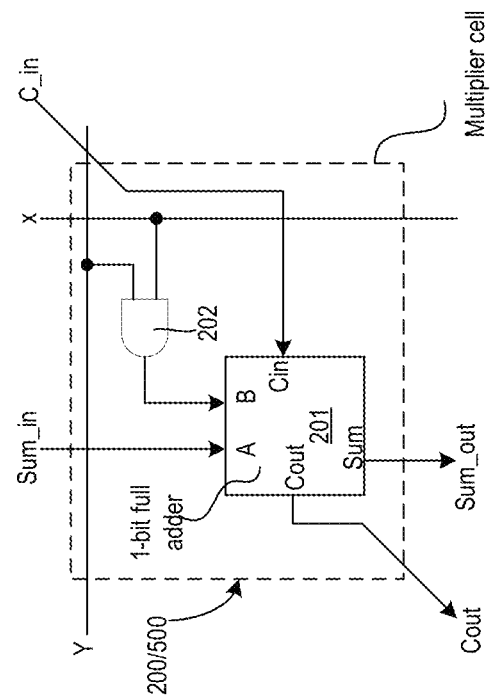
Fig. 5A

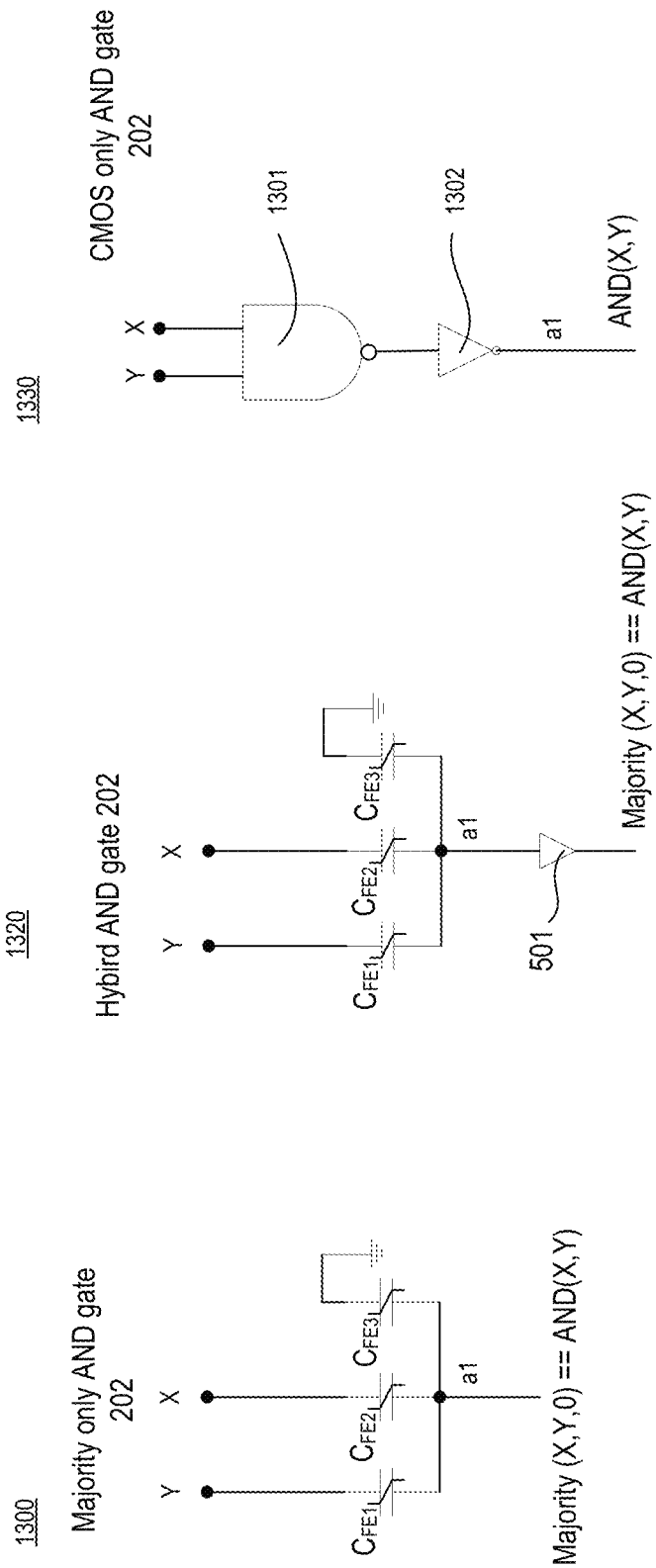

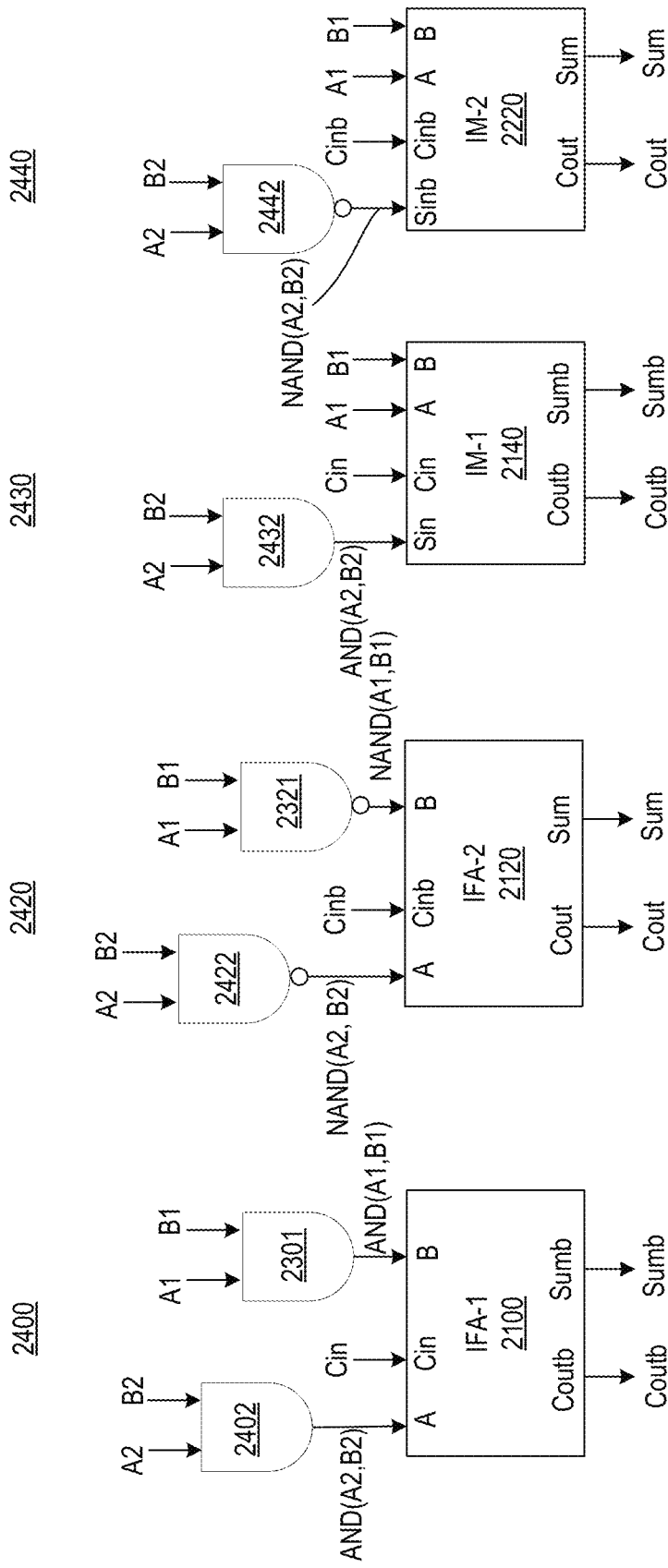

FERROELECTRIC OR PARAELECTRIC BASED LOW POWER MULTIPLIER ARRAY

CLAIM OF PRIORITY

This application is a continuation of, and claims priority of, U.S. application Ser. No. 17/465,784 titled "FERROELECTRIC OR PARAELECTRIC BASED LOW POWER MULTIPLIER," filed 2 Sep. 2021, which is incorporated by reference in its entirety.

BACKGROUND

Typical multiplier cell includes a 1-bit full adder and an AND gate. The 1-bit full adder receives three or more inputs and may consist of several logic gates such as AND gate, OR, gate, XOR gates, inverters, and buffers. In complementary metal oxide semiconductor (CMOS) logic, a 2-input AND gate derived from a 2-input NAND gate and an inverter consists of six transistors. A 2-input OR gate derived from a 2-input NOR gate and an inverter consists of six transistors. A 2-input XOR gate may consist of at least six transistors. As the number of transistors increases, power consumption and area also increase. As devices are pushing down the power envelope to save battery power, existing circuit architecture for a multiplier cell presents challenges to the goal of lower power consumption.

The background description provided here is for the purpose of generally presenting the context of the disclosure. Unless otherwise indicated here, the material described in this section is not prior art to the claims in this application and are not admitted being prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5A illustrates a multiplier cell having a full-adder and an AND gate using majority or minority gates with non-linear input capacitors, in accordance with some embodiments.

FIGS. 13A-C illustrate a majority only AND gate using non-linear input capacitors, a hybrid AND gate with non-linear input capacitors and CMOS buffer, and CMOS only AND gate, respectively for use in implementing the AND gate of the multiplier cell, in accordance with some embodiments of the disclosure.

FIGS. 24A-D illustrate a cell with 1-bit inverted full-adder coupled to two AND gates, a cell with 1-bit inverted full-adder coupled to two NAND gates, a cell with inverted multiplier cell coupled to a AND gate, and a cell with inverted multiplier cell coupled to a NAND gate, respectively, in accordance with some embodiments.

DETAILED DESCRIPTION

Figure 1:
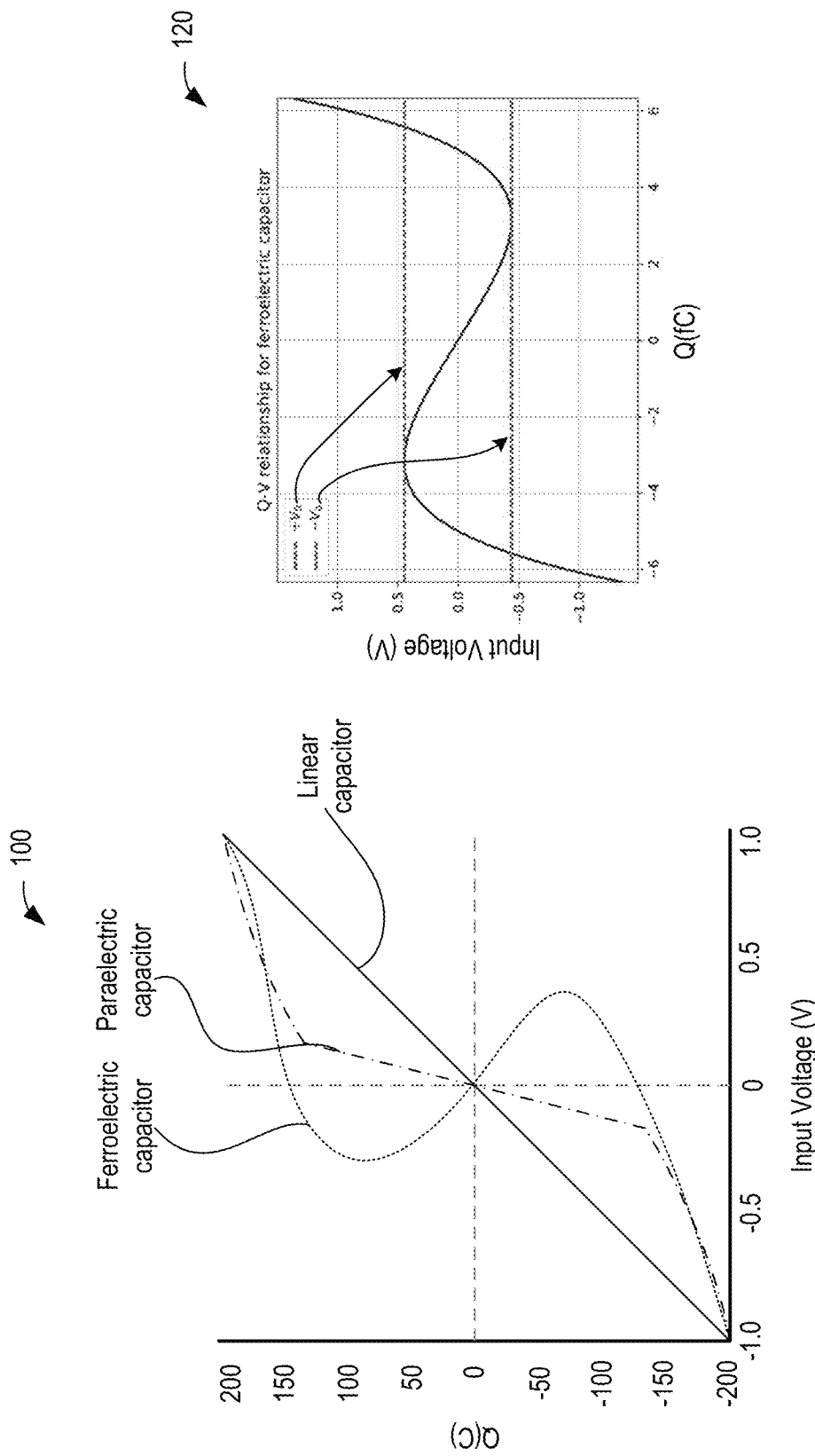
FIG. 1 illustrates a set of plots showing behavior of a ferroelectric capacitor, a paraelectric capacitor, and a linear capacitor.

In some embodiments, a multiplier cell is derived from a 1-bit full adder and an AND gate. In various embodiments, the 1-bit full adder is derived from majority and/or minority gates. In some embodiments, the majority and/or minority gates include non-linear polar material (e.g., ferroelectric or paraelectric material). In some embodiments, the multiplier cell is a hybrid of majority and/or minority gates and complementary metal oxide semiconductor (CMOS) based inverters and/or buffers.

A full adder adds binary numbers. A one-bit full-adder adds three one-bit numbers, A, B, and $C_{in}$, where A and B are the operands, and $C_{in}$ is a carry-in bit which is carried in from a previous, less-significant stage. A full adder is usually derived as a cascade of adders. These adders add, for example, 8, 16, 32, etc. bit binary numbers. The output of a 1-bit full adder circuit produces a 2-bit output. One of the output bits is a carry output and the other output bit is a sum. The carry is typically represented by signal Cout while the sum is typically represented by signal S, where the sum equals $2C_{out}+S$. Implementing a 1-bit adder requires many logic gates such as AND logic gate, OR logic gate, inverters, and sometime state elements such as flip-flops.

Some embodiments describe a new class of logic gates that use non-linear polar material. These new class of logic gates becomes the basis of a 1-bit full-adder, and hence the basis of a multiplier cell. The logic gates include multi-input minority gates, majority gates, and threshold gates. Input signals are received by respective terminals of capacitors having the non-linear polar material. The other terminals of these capacitors are coupled to a node where the majority function takes place for the inputs. The output from the majority function can then be directly used in a subsequent logic (e.g., another majority, minority, or threshold gate) or a driver circuitry. The driver circuitry can be any suitable logic gate such as a buffer, inverter, multiplexer, NAND gate, NOR gate, etc. As such, the majority gate, the minority gate, or the threshold gate of various embodiments can be combined with existing transistor technologies such as complementary metal oxide semiconductor (CMOS), tunneling field effect transistor (TFET), GaAs based transistors, bipolar junction transistors (BJTs), Bi-CMOS transistors, etc.

In some embodiments, the multiplier cell includes a 1-bit full adder coupled to an AND gate. In some embodiments, the AND gate comprises a majority gate or a minority gate having non-linear polar material. In some embodiments, the 1-bit full adder comprises a majority gate or a minority gate coupled to the AND gate, wherein the 1-bit full adder comprises non-linear polar material. In some embodiments, the AND gate receives a multiplier and a multiplicand. In some embodiments, the AND gate comprises: a first capacitor to receive the multiplier, wherein the first capacitor is coupled to a node (e.g., majority node). The AND gate comprises a second capacitor to receive the multiplicand, wherein the second capacitor is coupled is to the node. The AND gate comprises a third capacitor which is coupled to a ground node. Another terminal of the third capacitor is coupled to the node. In various embodiments, the first capacitor, the second capacitor, and the third capacitor include non-linear polar material. In some embodiments, a driver circuitry (e.g., a buffer) is provided which has a capacitive input coupled to the node, and an output which is to provide a majority logic function of the multiplier, the multiplicand, and a voltage on the ground node. In some embodiments, the 1-bit full adder receives a sum-in input as a first input. The 1-bit full adder receives an output of the AND gate as a second input. The 1-bit full adder receives a carry-in input as a third input. The 1-bit full adder generates a carry-out output and a sum output. In some embodiments, the 1-bit full adder comprises a 3-input minority gate to receive the first input, the second input, and the third input, wherein the 3-input minority gate is to generate a first output which is a minority function of the first input, the second input, and the third input. In some embodiments, the 1-bit full adder comprises a 5-input majority gate to receive the first output, the first input, the second input, the third input, wherein the third 5-input majority gate is to generate a second output which is majority function of two times the first output, the first input, the second input, the third input. In some embodiments, an inverted version of the first output is the carry-out output, wherein the second output is the sum output. In some embodiments, the multiplier cell comprises a buffer to drive the sum output. In some embodiments, the non-linear polar material includes one of: ferroelectric material, paraelectric material, or non-linear dielectric.

In some embodiments, an additional fixed or programmable input is coupled to the majority node via a capacitor. This additional fixed or programmable input can be a positive or negative bias. The bias behaves as a threshold or offset added or subtracted to or from the voltage (or current) on the majority node and determines the final logic value of the logic gate. Depending on the polarity or voltage value of the bias, AND gate or OR logic gate functions are realized, in accordance with various embodiments.

There are many technical effects of the various embodiments. For example, extremely compact multiplier circuitry is formed using the design of various embodiments. The non-linear polar material used in the multiplier can be ferroelectric material, para-electric material, or non-linear dielectric. The majority gate, minority gate and/or threshold gate of various embodiments lowers the power consumption of the multiplier circuit because the majority gate, minority gate and/or threshold gate do not use switching transistors and the interconnect routings are much fewer than the interconnect routings used in transitional CMOS logic gates. For example, 10× fewer interconnect length is used by the majority gate and threshold gate of various embodiments than traditional CMOS circuits for the same function and performance. The capacitor with non-linear polar material provides non-volatility that allows for intermittent operation and zero power drain when not in use.

For example, a processor having such multiplier circuits can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power.

The capacitor with non-linear polar material can be used with any type of transistor. For example, the capacitor with non-linear polar material of various embodiments can be used with planar or non-planar transistors. The transistors can be formed in the frontend or backend of a die. The capacitors with non-linear polar material can be formed in the frontend or backend of the die. As such, the logic gates can be packed with high density compared to traditional logic gates. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots 100 and 120 showing behavior of a ferroelectric capacitor, a paraelectric capacitor, and a linear capacitor. Plot 100 compares the transfer function for a linear capacitor, a paraelectric (PE) capacitor (a non-linear capacitor) and a ferroelectric (FE) capacitor (a non-linear capacitor). Here, x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization, perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as a FEC) is a non-linear capacitor with its potential VF (QF) as a cubic function of its charge. Plot 120 illustrates characteristics of a FEC. Plot 120 is a charge-voltage (Q-V) plot for a block of $Pb(Zr_{0.5}Ti_{0.5})O_3$ of area $(100 \text{ nm})^2$ and thickness 20 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

Figure 2:
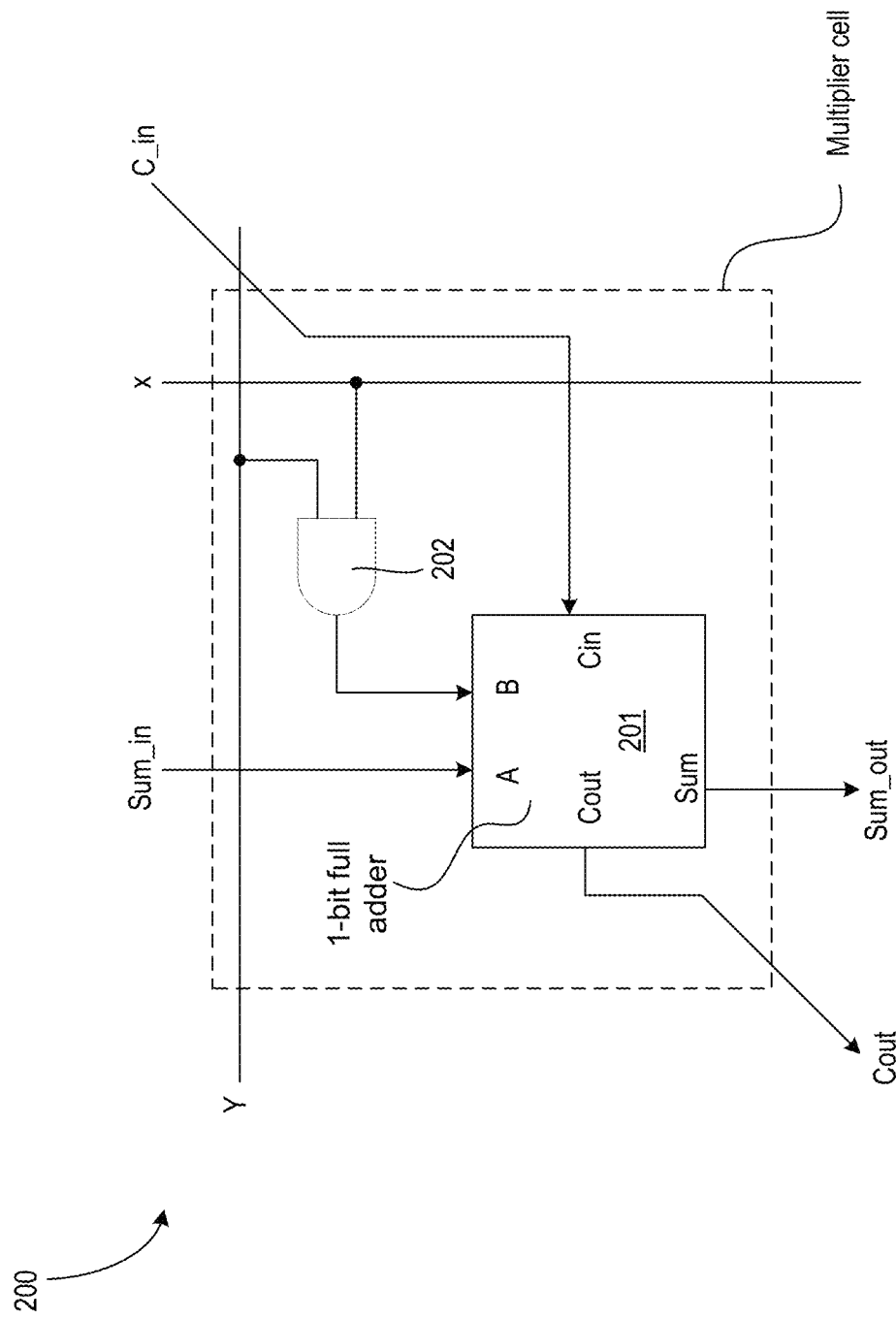
FIG. 2 illustrates a multiplier cell comprising a 1-bit full adder and an AND gate, wherein at least one of the 1-bit full adder and/or the AND gate comprise ferroelectric or paraelectric material, in accordance with some embodiments.

FIG. 2 illustrates multiplier cell 200 comprising a 1-bit full adder and an AND gate, wherein at least one of the 1-bit full adder and/or the AND gate comprise ferroelectric or paraelectric material, in accordance with some embodiments. Multiplier cell 200 comprises a 1-bit full adder 201 and a AND gate 202. 1-bit full adder 201 receives inputs A and B along with carry-in (Cin). Input A is a Sum_in input and C_in is a carry-in input from another multiplier cell. In an array of multipliers, for a first multiplier cell, Sum_in and C_in have fixed values (e.g., logical 0). The two inputs X and Y are multiplied in view of Sum_in (sum input) and C_in (carry_in) inputs. AND gate 202 receives the two inputs X and Y and provides an output which is received as input B by 1-bit full adder 201.

In some embodiments, AND gate 202 is a CMOS (or any other transistor technology) based AND gate (e.g., a NAND gate followed by an inverter). In some embodiments, AND gate 202 is a threshold gate. In some embodiments, AND gate 202 is a majority only gate. In some embodiments, AND gate is a hybrid gate which is a mix of majority gate and CMOS based devices. AND gate 202 produces a partial multiplication result of multiplying X and Y, while adder 201 adds that partial multiplication result with a multiplication result Sum_in from a previous multiplier cell (not shown) to generate a full multiplication result as Sum_out. The Carry-out (Cout) of adder 201 becomes the Cin for the subsequent multiplier cell (not shown). Sum_out can be used as a result and/or as Sum_in for a subsequent multiplier cell. As such, an N×N multiplier is made using the basic multiplier cell 200 repeated N×N times and connected as discussed herein. In various embodiments, adder 201 and/or AND gate 202 include non-linear polar material.

Figure 3:
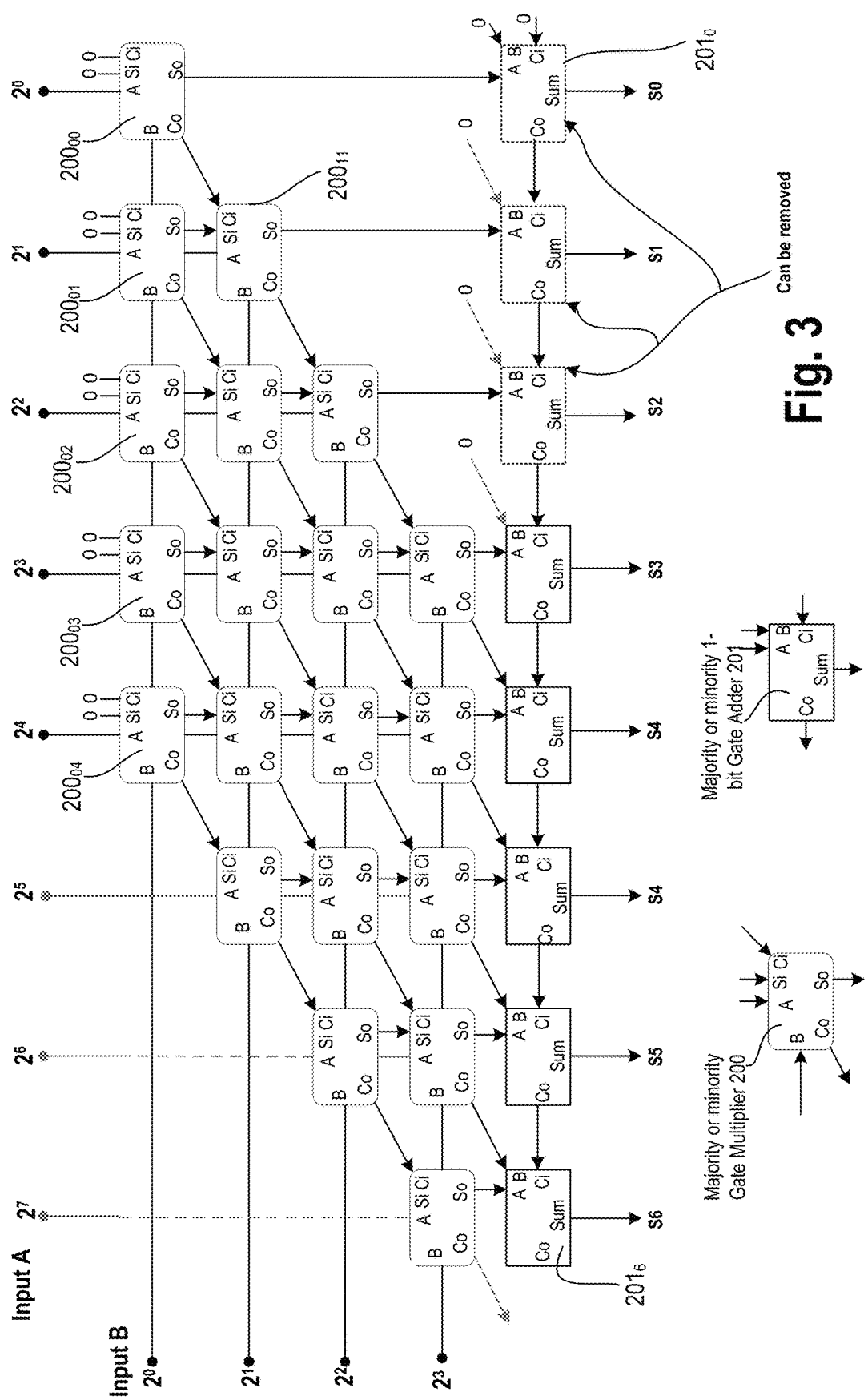
FIG. 3 illustrates an N×N multiplier array, wherein each cell of the array includes a 1-bit full adder and an AND gate, wherein at least one of the 1-bit full adder and/or the AND gate comprise ferroelectric or paraelectric material, in accordance with some embodiments.

FIG. 3 illustrates an N×N multiplier array 300, wherein each cell of the array includes a 1-bit full adder and an AND gate, wherein at least one of the 1-bit full adder and/or the AND gate comprises ferroelectric or paraelectric material, in accordance with some embodiments. To form N×N multiplier 300, multiplier cells are organized in an array (e.g., rows and columns), where N is a number. Inputs A are shown as columns while input B are shown as rows. In some embodiments, the first row of majority gate multipliers with integrated AND functions (e.g., $200_{00}$ to $200_{04}$) have sum_input (Si) and carry-in input (Ci) that are set to predetermined or programmable values (e.g., 0). In some embodiments, full 1-bit adders that do not receive input B from another multiplier cell, have that input set to a predetermined or programmable value (e.g., 0). Such full 1-bit adders can be replaced with half adders. In some embodiments, adders in the next row (e.g., $200_{11}$) are full 1-bit adders. The values can be programmed by software (e.g., firmware, operating system) or hardware (e.g., fuses, registers).

Full 1-bit adder is provided for each column that sums a locally computed partial product (X. Y), an input passed into the majority or minority gate multiplier cell from above (Sum In), and a carry Ci passed from a majority or minority gate multiplier cell diagonally above. It generates a carry-out (Cout or Co) and a new sum (Sum Out or So). N×N multiplier 300 shows the interconnection of 16 of these majority or minority gate multiplier cells to implement the full multiplier function. However, any number of majority or minority gate multiplier cells can be used. The input Ai values are distributed along cell diagonals and the input Bi values are passed along rows. This implementation uses the same gate count as the previous one: 16 AND gates and 12 adders. In various embodiments, the top row may not use adders. The outputs S0 though S6 of 1-bit adders $201_0$ through $201_6$ are the results of the bit-wise multiplication. In some embodiments, adders $201_0$ through $201_2$ (shown as dotted boxes) can be removed since they are simply adding zero to the input A. In one such example, the output of $200_0$ is S0 and the output of $200_1$ is S1. Various figures here describe the different implementations of multiplier cell 200 and 1-bit full adder 201.

Figure 4A:
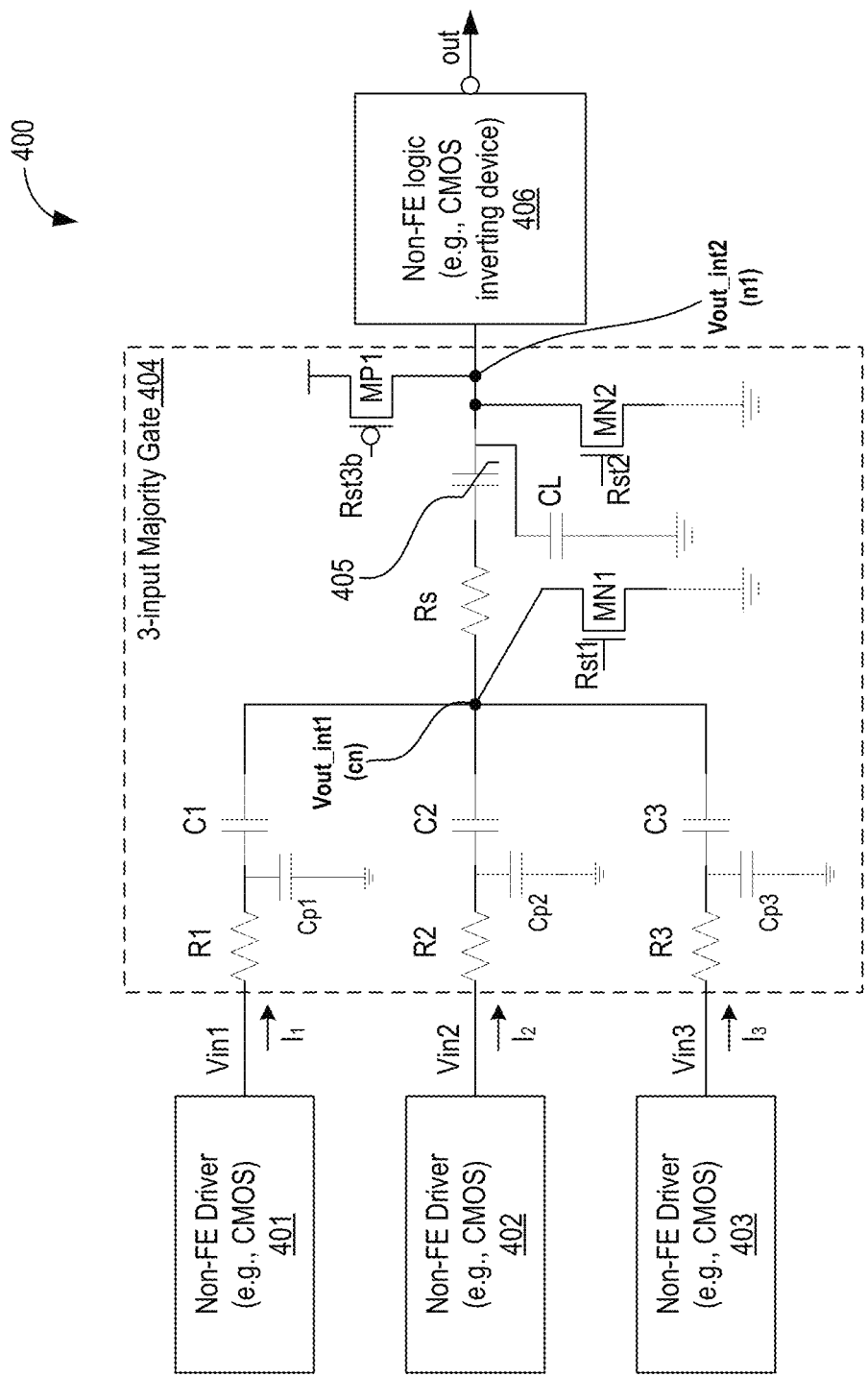
FIG. 4A illustrates a 3-input majority or minority gate with linear input capacitors and non-linear output capacitor, in accordance with some embodiments.

FIG. 4A illustrates a 3-input majority or minority gate 400 with linear input capacitors and non-linear output capacitor, in accordance with some embodiments. Logic Gate 400 comprises first, second, and third drivers 401, 402, and 403, respectively. These drivers can be analog drivers generating analog signals or digital drivers generating signals that toggle between ground and the power supply rail, or a combination of analog or digital drivers. For example, driver 401 is a CMOS driver such as a buffer, inverter, a NAND gate, NOR gate, etc., while driver 402 is an amplifier generating a bias signal. The drivers provide input signals Vin1 (and current $I_1$), Vin2 (and current $I_2$), and Vin3 (and current $I_3$) to the three inputs of 3-input majority gate 404.

In various embodiments, 3-input majority gate 404 comprises three input nodes Vin1, Vin2, and Vin3. Here, signal names and node names are interchangeably used. For example, Vin1 refers to node Vin1 or signal Vin1 depending on the context of the sentence. 3-input majority gate 404 further comprises capacitors C1, C2, and C3. Here, resistors R1, R2, and R3 are interconnect parasitic resistances coupled to capacitors C1, C2, and C3 respectively. In various embodiments, capacitors C1, C2, and C3 are non-ferroelectric capacitors. In some embodiments, the non-ferroelectric capacitor includes one of: dielectric capacitor, paraelectric capacitor, or non-linear dielectric capacitor.

A dielectric capacitor comprises first and second metal plates with a dielectric between them. Examples of such dielectrics are: HfO, ABO3 perovskites, nitrides, oxy-fluorides, oxides, etc.

A paraelectric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95), HfZrO2, Hf—Si—O, La-substituted PbTiO3, PMN-PT based relaxor ferroelectrics.

A dielectric capacitor comprises first and second metal plates with non-linear dielectric capacitor between them. The range for dielectric constant is 1.2 to 10000. The capacitors C1, C2, and C3 can be implemented as MIM (metal-insulator-metal) capacitor technology, transistor gate capacitor, hybrid of metal capacitors or transistor capacitor. The capacitors C1, C2, and C3 can be implemented as MIM (metal-insulator-metal) capacitor technology, transistor gate capacitor, or hybrid of metal capacitors or transistor capacitor.

One terminal of the capacitors C1, C2, and C3 is coupled to a common node cn. This common node is coupled to node n1, which is coupled to a first terminal of a non-linear polar capacitor 405. The majority function is performed at the common node cn, and the resulting voltage is projected on to capacitor 405. For example, the majority function of the currents ($I_1$, $I_2$, and $I_3$) on node cn results in a resultant current that charges capacitor 405. Table 1 illustrates the majority function f(Majority Vin1, Vin2, Vin3).

TABLE 1

| Vin1 | Vin2 | Vin3 | cn (f(Majority Vin1, Vin2, Vin3)) |
|------|------|------|-----------------------------------|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Referring to FIG. 4A, in some embodiments, N odd number of capacitors are coupled to a single FEC to form a majority gate. In this case, N=3. The measured charge on the FEC (QF) is the output of the majority gate. Solving for a steady-state solution, the parasitic resistors are ignored and the input potentials $V_i$ (or Vin) are assumed to be constant. In this case, the charge across each linear capacitor (C1, C2, C3) is:

$$Q_i = C_i \cdot (V_i - V_F) \tag{1}$$

The charge summed at node Cn and across FEC 405 is express as:

$$Q_F = \Sigma_i Q_i \quad (2)$$

$$Q_F = \Sigma_i C_i V_i - \Sigma_i C_i V_F \quad (3)$$

$$Q_F = \Sigma_i C_i V_i - C V_F(Q_F) \quad (4)$$

$$V_F(Q_F) = \sum_i \frac{C_i}{C} V_i - \frac{Q_F}{c} \quad (5)$$

Here, $C = \Sigma_i C_i$ is the sum of the capacitances. In the limit, $C \to \infty$, the following is achieved:

$$V_F(Q_F) = \sum_i \frac{C_i}{C} V_i = \overline{V} \quad (6)$$

The potential across FEC 405 is the average of all the input potentials weighted by the capacitances (e.g., C1, C2, and C3).

When $$C_i = C/N$$

are all equal, $V_F$ is just a simple mean. To ensure that $$Q_F = V_F^{-1}(\overline{V}) \quad (7)$$

is well defined, all possible values of $\overline{V}$ have magnitudes greater than $V_c$, the coercive potential. Assuming binary input of $+/-V_s$, the potential with the smallest magnitude is:

$$\overline{V} = V_s/N \quad (8)$$

This occurs when $(N+1)/2$ of the inputs are $+V_s$ and $(N-1)/2$ are $-V_s$. Then, $$V_s > N V_C \quad (9)$$

As an example, for N=3, the possible inputs are:

$$\overline{V} \in \left\{ -\frac{3}{3} V_s, -\frac{1}{3} V_s, +\frac{1}{3} V_s, +\frac{3}{3} V_s \right\} \quad (10)$$

Referring to FIG. 4A, since capacitor 405 is a non-linear polar capacitor, both terminals of the capacitor are pre-discharged to ground or to a known predetermined voltage via n-type transistors pull-down transistors MN1 and MN2, and p-type pull-up transistors. The predetermined voltage can be programmable. The pre-determined voltage can be positive or negative. In some embodiments, n-type transistor MN1 is coupled to node Vout_int1 (internal Vout node) and is controllable by clock or reset signal Rst1. In some embodiments, n-type transistor MN2 is coupled to node Vout_int2 (internal Vout node) and is controllable by clock or reset signal Rst2. In some embodiments, p-type transistor MP1 is coupled to node Vout_int2 and is controllable by Rst3b.

In some embodiments, the n-type transistors MN1 and MN2 are replaced with p-type transistors to pre-charge both terminals (Vout_int1 and Vout_int2) of capacitor 405 to a supply voltage or another predetermined voltage, while the p-type transistor MP1 is replaced with an n-type transistor coupled to ground or a negative supply rail. The predetermined voltage can be programmable. The pre-determined voltage can be positive or negative.

In some embodiments, the pre-charge or pre-discharge of the terminals of capacitor 405 (or nodes cn and n1) is done periodically by a control signals Rst1, Rst2, and Rst3b. The controls can be a non-clock signal that is generated by a control logic (not shown). For example, the control can be issued every predetermined or programmable time. In some embodiments, control signals Rst1, Rst2, and Rst3b are issued in a reset phase, which is followed by an evaluation phase where inputs Vin1, Vin2, and Vin3 are received, and majority function is performed on them.

Rst1 has a pulse larger than the pulse widths of Rst2 and Rst3b. Rst3b is an inverse of Clk3 (not shown). In some embodiments, Rst1 is first asserted which begins to discharge node Vout_int1. While node Vout_int1 is being discharged, Rst2 is asserted. Rst2 may have a pulse width which is substantially half of the pulse width of Rst1. When Rst2 is asserted, node Vout_int2 is discharged. This sequence assures that both terminals of the non-linear polar material of capacitor 405 are discharged sequentially. In various embodiments, before discharging node Vout_int2, Rst3b is de-asserted which turns on transistor MP1, causing Vout_int2 to be charged to a predetermined value (e.g., supply level). The pulse width of Rst3b is smaller than the pulse width of Rst1 to ensure the Rst3b pulsing happens within the Rst1 pulse window. This is useful to ensure non-linear polar capacitor 405 is initialized to a known programmed state along with the other capacitors (e.g., C1, C2, C3) which are initialized to 0 V across them. The pulsing on Vout_int2 creates the correct field across the non-linear polar capacitor 405 in conjunction with Vout_int1 to put it in the correct state, such that during operating mode, if Vout_int1 goes higher than Vc value (coercive voltage value), it triggers the switching for non-linear polar capacitor 405, thereby resulting into a voltage build up on Vout_int2.

In some embodiments, load capacitor CL is added to node Vout_int2. In some embodiments, load capacitor CL is a regular capacitor (e.g., a non-ferroelectric capacitor). The capacitance value of CL on Vout_int2 is useful to ensure that the FE switching charge (of FE capacitor 405) provides the right voltage level. For a given FE size (area A), with polarization switching density (dP) and desired voltage swing of Vdd (supply voltage), the capacitance of CL should be approximately CL=dP*A/Vdd. There is slight deviation from the above CL value as there is charge sharing on Vout_int2 due to dielectric component of FE capacitor 405. The charge sharing responds relative to voltage on Vout_int1, and capacitor divider ratio between the dielectric component of the FE capacitor 405, and load capacitor (CL). Note, the capacitance of CL can be an aggregate of all the capacitances (e.g., parasitic routing capacitance on the node, gate capacitance of the output stage 406, and drain or source capacitance of the reset devices (e.g., MN2, MP1) on the Vout_int2 node). In some embodiments, for a given size of non-linear polar capacitor 405, CL requirement can be met by just the load capacitance of non-FE logic 406, and parasitic component itself, and may not need to have it as a separate linear capacitor.

In some embodiments, the non-linear polar material of capacitor 405 includes one of: ferroelectric (FE) material, paraelectric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

In some embodiments, f-orbital materials (e.g., lanthanides) are doped to the ferroelectric material to make para-electric material. Examples of room temperature paraelectric material include: $SrTiO3$, $Ba(x)Sr(y)TiO3$ (where x is −0.5, and y is 0.95), $HfZrO2$, Hf—Si—O, and/or La-substituted $PbTiO3$, PMN-PT based relaxor ferroelectrics.

In various embodiments, the FE material can be any suitable low voltage FE material that allows the FE material to switch its state by a low voltage (e.g., 100 mV). In some embodiments, the FE material comprises a perovskite of the type $ABO3$, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted $BiFeO3$, $BiCrO3$, $BiCoO3$ class of materials, La or rare earth substitution into the Bi site can tune the spontaneous distortion.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in $PbTiO3$ a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched $SrRuO3$ bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—$CoO3$, $SrRuO3$, La—Sr—$MnO3$, $YBa2Cu3O7$, $Bi2Sr2CaCu2O8$, $LaNiO3$, and $ReO3$.

In some embodiments, the FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A; it can be an element from the Lanthanides series. B' is a dopant for atomic site B; it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-$RMnO3$, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO5$ polyhedra, accompanied by displacements of the Y ions, which lead to a net electric polarization. In some embodiments, hexagonal FE includes one of: $YMnO3$ or $LuFeO3$. In various embodiments, when the FE material comprises hexagonal ferroelectrics, the conductive oxides adjacent to the FE material are of $A2O3$ (e.g., $In2O3$, $Fe2O3$) and $AB2O3$ type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are $LuFeO3$ class of materials or super lattice of ferroelectric and paraelectric materials $PbTiO3$ (PTO), and $SnTiO3$ (STO), respectively, and $LaAlO3$ (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, the FE material includes one of: $Al(1-x)Sc(x)N$, $Ga(1-x)Sc(x)N$, $Al(1-x)Y(x)N$, or $Al(1-x-y)Mg(x)Nb(y)N$, y doped $HfO2$, where x includes one of: Al, Ca, Ce, Dy, Er, Gd, Ge, La, Sc, Si, Sr, Sn, or Y, wherein 'x' is a fraction. In some embodiments, the FE material includes Bismuth ferrite (BFO), lead zirconate titanate (PZT), BFO with doping material, or PZT with doping material, wherein the doping material is one of Nb or; and relaxor ferroelectrics such as PMN-PT.

In some embodiments, the FE material includes Bismuth ferrite (BFO), BFO with a doping material where in the doping material is one of Lanthanum, or any element from the lanthanide series of the periodic table. In some embodiments, the FE material includes lead zirconium titanate (PZT), or PZT with a doping material, wherein the doping material is one of La, Nb. In some embodiments, the FE material includes a relaxor ferro-electric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), and/or Barium Titanium-Barium Strontium Titanium (BT-BST).

In some embodiments, the FE material includes Hafnium oxides of the form, $Hf1-x Ex Oy$ where E can be Al, Ca, Ce, Dy, er, Gd, Ge, La, Sc, Si, Sr, Sn, or Y. In some embodiments, the FE material includes Niobate type compounds $LiNbO3$, $LiTaO3$, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, Polyvinylidene fluoride or polyvinylidene difluoride (PVDF).

The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

The charge developed on node n1 produces a voltage and current that is the output of the majority gate 404. Any suitable driver 406 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, etc. In some embodiments, output "out" is reset by driver 406 via Rst1 signal. For example, NAND gate with one input coupled to Vout_int2 and the other input coupled to Rst1 can be used to reset "out" during a reset phase.

While FIG. 4A illustrates a 3-input majority gate, the same concept can be extended to more than 3 inputs to make an N-input majority gate, where N is greater than 2. For example, a 5-input majority gate is like 3-input majority gate 404 but for additional inputs Vin4 and Vin5. These inputs can come from the same drivers (e.g., any one of drivers 401, 402, 403) or from different drivers. Input Vin4 and Vin5 can be analog, digital, or a combination of them. For example, Vin4 is a digital signal while Vin5 is an analog signal. The additional inputs Vin4 and Vin5 are coupled to additional non-ferroelectric capacitors C4 and C5, respectively (not shown). The composition and size of the capacitors C4 and C5 are like that of C1, C2, and C3. Here, resistors R4 and R5 are parasitic resistors.

The majority function is performed at the common node cn, and the resulting voltage is projected on to capacitor 405. For example, the majority function of the currents ($I_1$, $I_2$, $I_3$, $I_4$, and $I_5$) on node cn results in a resultant current that charges capacitor 405. Table 2 illustrates the majority function f(Majority Vin1, Vin2, Vin3, Vin4, Vin5) of a 5-input majority gate.

TABLE 2

| Vin1 | Vin2 | Vin3 | Vin4 | Vin5 | cn (f(Majority Vin1, Vin2, Vin3, Vin4, Vin5)) |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 1 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 0 |
| 0 | 1 | 1 | 0 | 0 | 0 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | 0 |
| 1 | 0 | 0 | 1 | 1 | 1 |
| 1 | 0 | 1 | 0 | 0 | 0 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 0 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 0 | 1 |

Figure 4B:
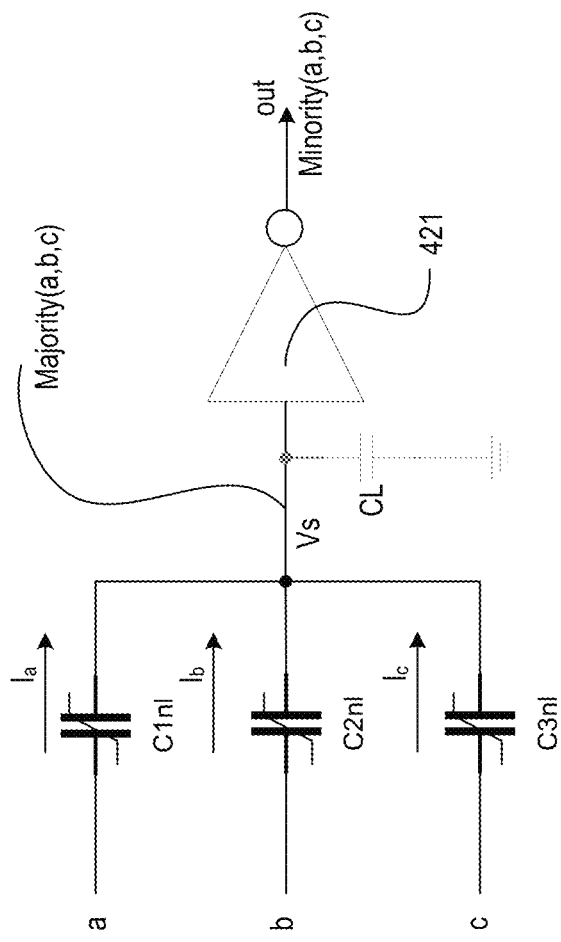
FIG. 4B illustrates a 3-input majority or minority gate with non-linear input capacitors, in accordance with some embodiments.

FIG. 4B illustrates a 3-input majority or minority gate 420 with non-linear input capacitors, in accordance with some embodiments. In some embodiments, 3-input majority gate 420 comprises non-linear input capacitors C1*nl*, C2*nl*, and C3*nl* that receives digital signals a, b, and c, respectively. Here, signal names and node names are interchangeably used. For example, 'a' refers to node 'a' or signal 'a' depending on the context of the sentence. One end or terminal of capacitor C1*nl* is coupled to node a while the other end of capacitor C1*nl* is coupled to summing node Vs. The same is true for other non-linear capacitors C2*nl* and C3*nl* as shown. In some embodiments, 3-input majority gate 400 comprises a driver circuitry 421. In this example, driver circuitry 421 is an inverter. In other embodiments, other types of driver circuitries can be used such as NAND gate, NOR gate, multiplexer, buffer, and other logic gates. The majority function is performed at summing node Vs as Majority(a,b,c). In this example, since driver 421 is an inverter, minority function is performed at output "out" as Minority(a,b,c).

In some embodiments, in addition to the gate capacitance of driver circuitry 421, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, para-electric capacitor, or non-linear dielectric capacitor. A dielectric capacitor comprises first and second metal plates with a dielectric between them. Examples of such dielectrics are: HfO, ABO3 perovskites, nitrides, oxy-fluorides, oxides, etc. A paraelectric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, and/or PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor. In various embodiments, there is enough capacitance on node Vs that the capacitor CL is not needed.

In some embodiments, the non-linear input capacitors C1$nl$, C2$nl$, and C3$nl$ comprise non-linear polar material. In some embodiments, the non-linear polar material includes one of: ferroelectric (FE) material, paraelectric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

The majority function is performed at the summing node Vs, and the resulting voltage is projected on to capacitance of driver circuitry 421. Table 3 illustrates the majority function f(Majority a, b, c).

TABLE 3

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 420. Any suitable driver 421 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 4B illustrates a 3-input majority gate, the same concept can be extended to more than 3 inputs to make an N-input majority gate, where N is greater than 2. In various embodiments, 'N' is an odd number. For example, a 5-input majority gate is like an input majority gate 420 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configure the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 421 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion:
$$f(x_1, x_2, \ldots x_n) = V_{C_1, C_2, \ldots C_n} f(x_1, x_2, \ldots x_n) \wedge x_1^{C_1} \wedge x_2^{C_2} \wedge x_3^{C_3} \ldots \wedge x_n^{C_n}$$
where $C_i$ is either 0 or 1. When $C_i$ is 1, $x_i^{C_i} = x_i$ (the input is used in its original form). When $C_i$ is 0, $x_i^{C_i} = \overline{x_i}$ (the input is used in its inverted form). The first level of logic is represented by at most $2^n$ AND gates (Δ), one for each of the $2^n$ possible combinations of 0 and 1 for $C_1, C_2, \ldots C_n$. The second level of logic is represented by a single OR gate (V). Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 4C:
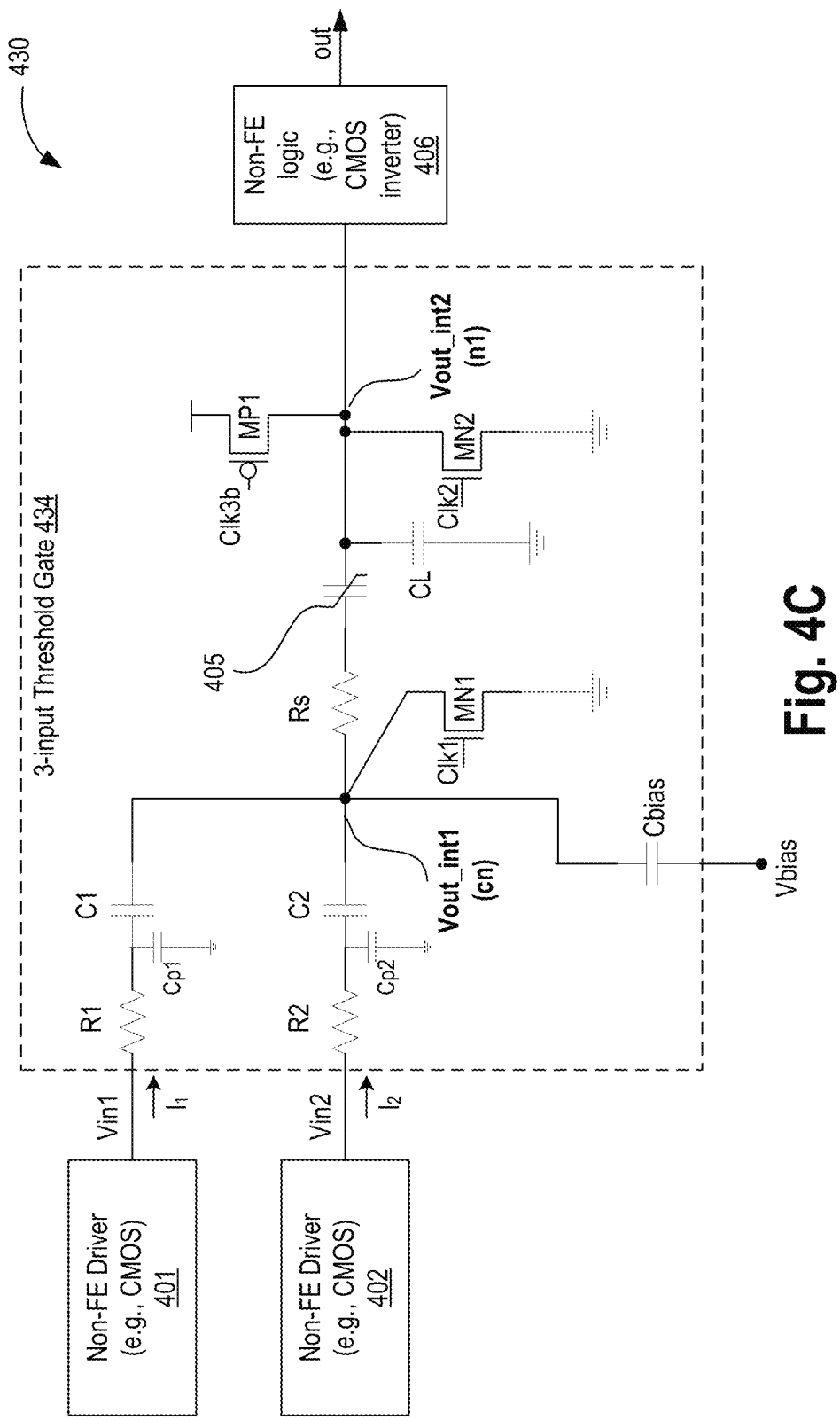
FIG. 4C illustrates a 3-input threshold gate with non-linear input capacitors, in accordance with some embodiments.

FIG. 4C illustrates a 3-input threshold gate 430 with non-linear input capacitors, in accordance with some embodiments. Logic gate 430 is like logic gate 400 but for removing the third input Vin and adding an input Vbias. This additional input bias makes the logic gate a threshold gate 434. Threshold gate 434 is referred to as a 3-input threshold gate because of the three inputs Vin1, Vin2, and Vbias. It can also be referred to as 2-input threshold gate if the Vbias input is not counted as a separate input. In various embodiments, threshold gate 434 comprises an additional capacitor Cbias that has one terminal coupled to node cn and another terminal coupled to Vbias. The material for capacitor Cbias can be same as material for capacitors C1, C2, and C3. For example, capacitor Cbias comprises non-ferroelectric material.

Vbias can be positive or negative voltage depending on the desired logic function of threshold gate 434. Any suitable source can generate Vbias. For example, a bandgap reference generator, a voltage divider such as a resistor divider, a digital to analog converter (DAC), etc. can generate Vbias. Vbias can be fixed or programmable (or adjustable). For example, Vbias can be adjusted by hardware (e.g., fuses, register), or software (e.g., operating system). In some embodiments, when Vbias is positive, the majority function on node cn is an OR function. For example, the function at node cn is OR(Vin1, Vin2, 0). In some embodiments, when Vbias is negative, the majority function on node cn is an AND function. For example, the function at node cn is AND (Vin1, Vin2, 1). Table 4 and Table 5 summarize the function of threshold gate 434. Applying a positive voltage or Vbias can be akin to applying an input signal logic high as well. Likewise, applying a negative voltage on Vbias can be askin to applying an input signal logic low as well.

TABLE 4

| Vin1 | Vin2 | Vbias | cn OR(Vin1, Vin2, Vbias) |
|---|---|---|---|
| 0 | 0 | Positive or logic 1 | 0 |
| 0 | 1 | Positive or logic 1 | 1 |
| 1 | 0 | Positive or logic 1 | 1 |
| 1 | 1 | Positive or logic 1 | 1 |

TABLE 5

| Vin1 | Vin2 | Vbias | cn AND(Vin1, Vin2, Vbias) |
|---|---|---|---|
| 0 | 0 | Negative or logic 0 | 0 |
| 0 | 1 | Negative or logic 0 | 0 |
| 1 | 0 | Negative or logic 0 | 0 |
| 1 | 1 | Negative or logic 0 | 1 |

Compared to transitional CMOS AND logic gate and OR logic gate, here the AND function and the OR function are performed by a network of capacitors. The output of the majority or threshold function on node cn is then stored in the non-linear polar capacitor 305. This capacitor provides the final state of the logic in a non-volatile form. As such, the logic gate of various embodiments describes a non-volatile multi-input AND or OR gate with one or two transistors for pre-discharging or pre-charging nodes cn and n1. The silicon area of the AND or OR gates of various embodiments is orders of magnitude smaller than traditional AND or OR gates. While FIG. 4C illustrates a 3-input threshold gate, the same concept can be extended to more than 3 inputs to make an N-input threshold gate, where N is greater than 2 and an odd number. The reset mechanism of FIG. 4C is like the one described with reference to FIG. 4A.

FIG. 5A illustrates multiplier cell 500 having a full-adder and a AND gate using majority or minority gates with non-linear input capacitors, in accordance with some embodiments. In some embodiments, multiplier cell 500 comprises an AND gate comprising a 3-input majority gate having input capacitors $C_{FE1}$, $C_{FE2}$, and $C_{FE3}$ with non-linear polar material. A first terminal of capacitor $C_{FE1}$ is coupled to input Y. A first terminal of capacitor $C_{FE2}$ is coupled to input X. A first terminal of capacitor $C_{FE3}$ is coupled to ground. In various embodiments, the second terminal of capacitors $C_{FE1}$, $C_{FE2}$, and $C_{FE3}$ is coupled to a common node a1 (which is also referred to as a majority node). At node a1, a majority function of inputs Y, X, and ground take place. This majority function is an AND function. As such, node a1 provides the output of the AND gate. In some embodiments, buffer 501 is coupled to node a1 to buffer the output to node a2. Node a2 is coupled to the 1-bit full adder, in accordance with various embodiments.

In some embodiments, the 1-bit full adder comprises 3-input minority gate followed by a 5-input majority gate. In some embodiments, the 3-input minority gate comprises input capacitors $C_{FE4}$, $C_{FE5}$, and $C_{FE6}$ with non-linear polar material. A first terminal of capacitor $C_{FE4}$ is coupled to input Sum_in. A first terminal of capacitor $C_{FE5}$ is coupled to node a2. A first terminal of capacitor $C_{FE6}$ is coupled to C_in. In various embodiments, the second terminal of capacitors $C_{FE4}$, $C_{FE5}$, and $C_{FE6}$ is coupled to a common node c1 (which is also referred to as a majority node). At node c1, a majority function of inputs Sum_in, voltage on node a2, and input C_in take place. In some embodiments, buffer 502 is coupled to node c1 to drive output Cout. In some embodiments, the output of buffer 502 is coupled to inverter 503. The output of inverter 503 provides a minority function of inputs Sum_in, voltage on node a2, and input C_in. The output of inverter 503, Sum_in, node a2, and C_in are received by the 5-input majority gate.

Figure 5B:
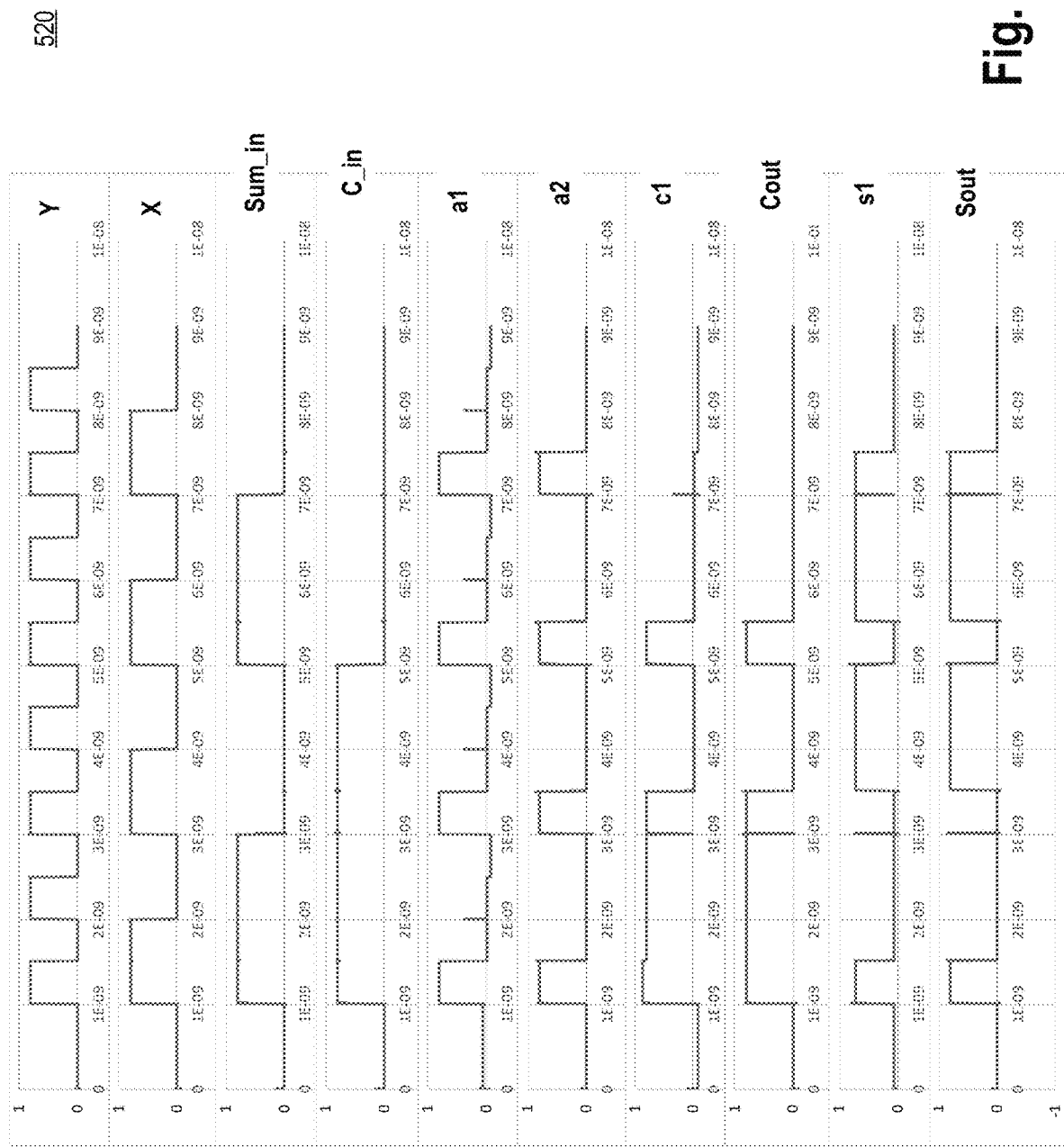
FIG. 5B illustrates a timing diagram of the implementation of FIG. 5A, in accordance with some embodiments.

In some embodiments, the 5-input minority gate comprises input capacitors $C_{FE7}$, $C_{FE8}$, $C_{FE9}$, $C_{FE10}$, and $C_{FE11}$ with non-linear polar material. A first terminal of capacitor $C_{FE7}$ is coupled to input Sum_in. A first terminal of capacitor $C_{FE8}$ is coupled to node a2. A first terminal of capacitor $C_{FE9}$ is coupled to C_in. A first terminal of capacitor $C_{FE10}$ and a first terminal of $C_{FE11}$ is coupled to the output of inverter 503. In various embodiments, the second terminal of capacitors $C_{FE7}$, $C_{FE8}$, $C_{FE9}$, $C_{FE10}$, and $C_{FE11}$ with is coupled to a common node s1 (which is also referred to as a majority node). At node s1, a majority function of inputs Sum_in, voltage on node a2, input C_in, and two times the output of inverter 503 take place. In some embodiments, buffer 504 is coupled to node s1 to drive output Sum_out. Compared to traditional multiplier cells, fewer transistors are used here. Further, the capacitors can be formed above an active region, thus reducing an overall footprint of multiplier cell 500 compared to traditional CMOS only multiplier cells. The power consumption of multiplier cell 500 is also smaller than power consumption of traditional CMOS only multiplier cells. FIG. 5B illustrates timing diagram 520 of the implementation of FIG. 5A, in accordance with some embodiments.

Figure 6A:
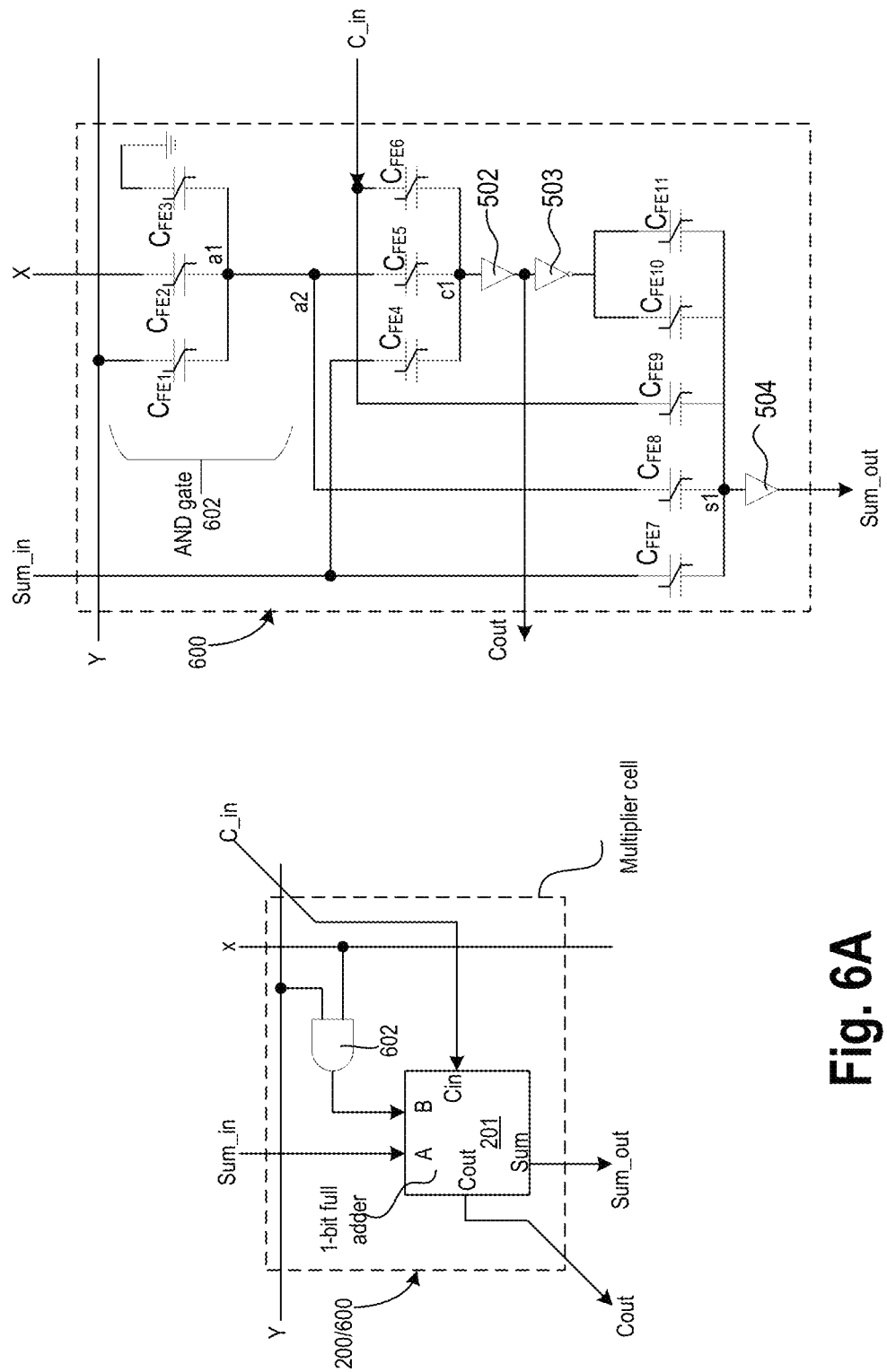
FIG. 6A illustrates a multiplier cell having a full-adder and an AND gate using majority or minority gates with non-linear input capacitors and with direct connection between AND gate and the full-adder, in accordance with some embodiments.
Figure 6B:
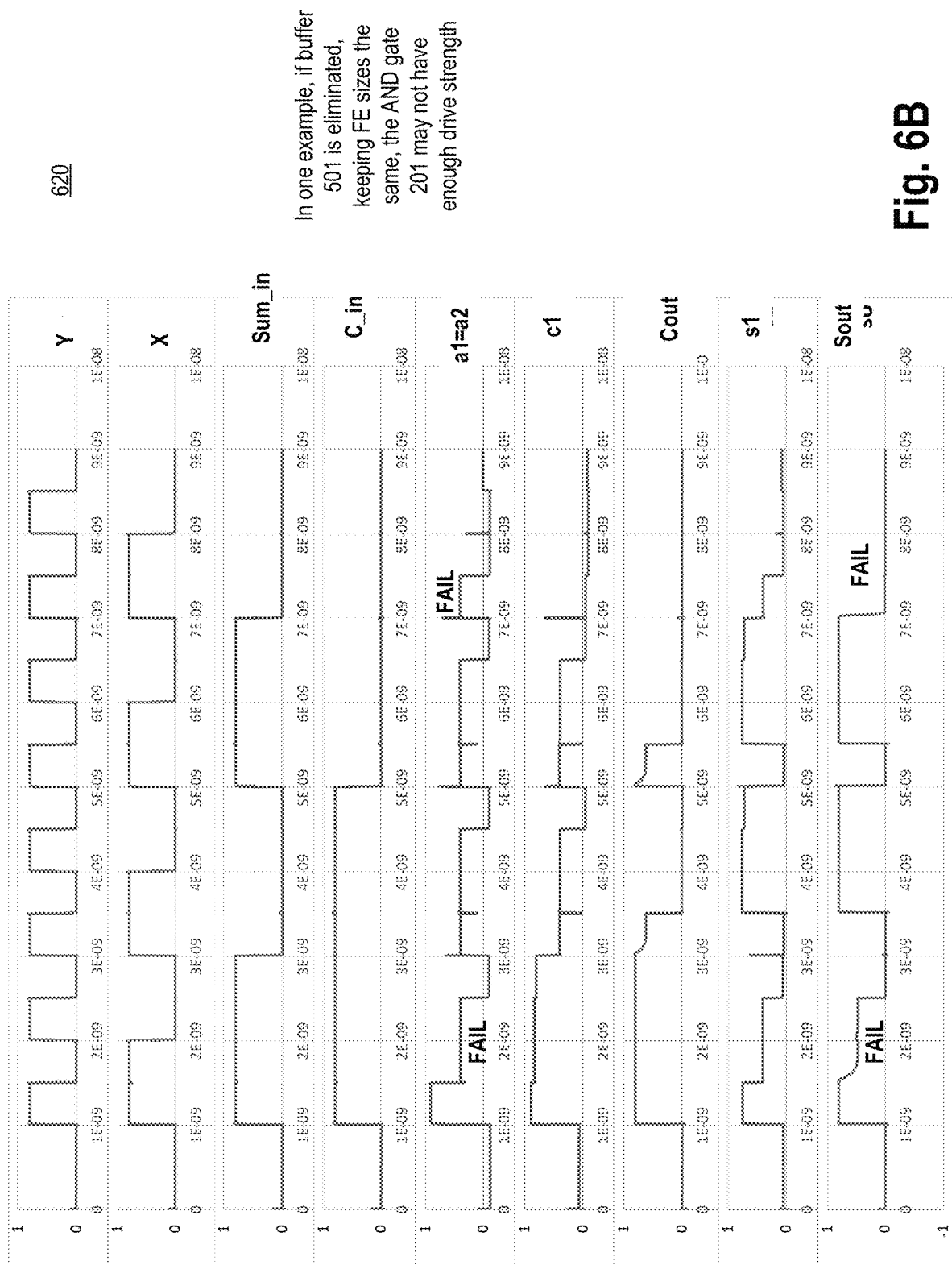
FIG. 6B illustrates a timing diagram of the implementation of FIG. 6A, in accordance with some embodiments.

FIG. 6A illustrates multiplier cell 600 having a full-adder and a AND gate using majority or minority gates with non-linear input capacitors and with direct connection between AND gate and the full-adder, in accordance with some embodiments. Compared to multiplier cell 500, here buffer 501 is removed. Node a1 is directly connected to node a2. In some cases, it is possible that the AND gate comprising input capacitors $C_{FE1}$, $C_{FE2}$, and $C_{FE3}$ with non-linear polar material do not have enough drive strength to drive subsequent capacitors $C_{FE5}$ and $C_{FE8}$. This may result in failures. For examples, buffer 502 may not trip causing incorrect output. In other examples, removing buffer 501 and optimizing the sizes of the capacitors of the AND gate can mitigate any failures, and as such provide a smaller multiplier cell. FIG. 6B illustrates timing diagram 620 of the implementation of FIG. 6A, in accordance with some embodiments.

Figure 7A:
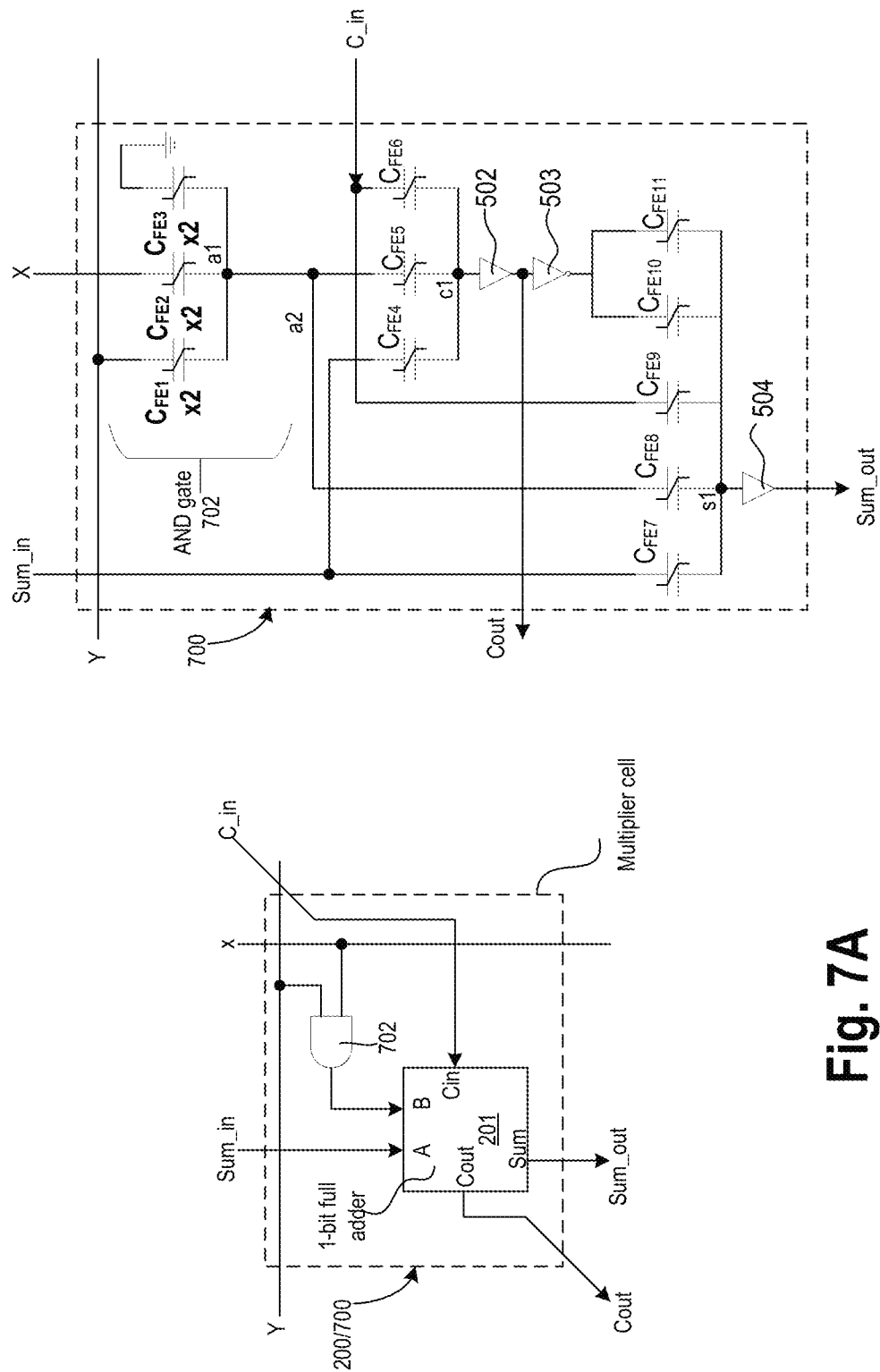
FIG. 7A illustrates a multiplier cell of FIG. 6A with non-linear input capacitors upsized by 2×, in accordance with some embodiments.
Figure 7B:
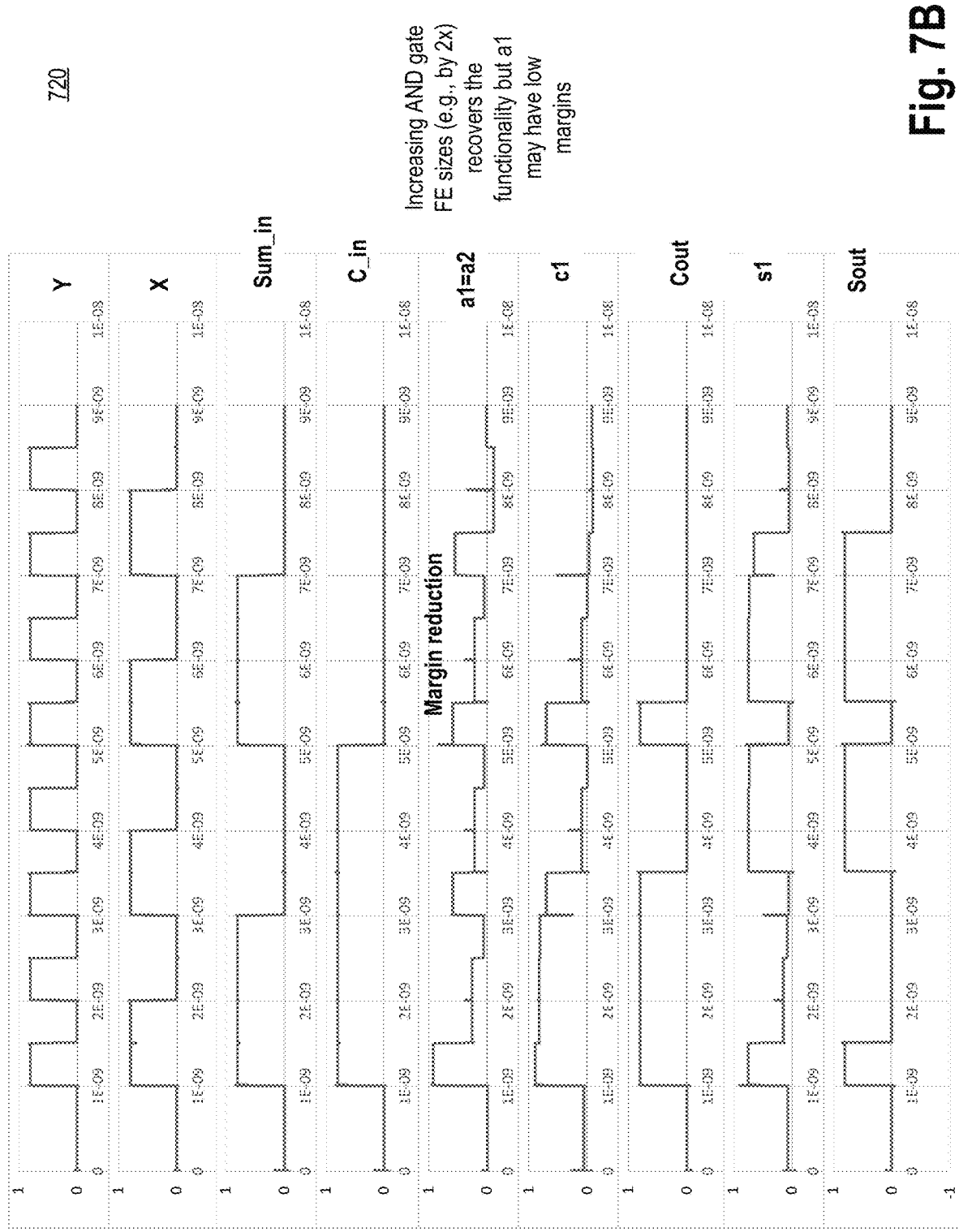
FIG. 7B illustrates a timing diagram of the implementation of FIG. 7A, in accordance with some embodiments.

FIG. 7A illustrates multiplier cell 700 of FIG. 6A with non-linear input capacitors upsized by 2×, in accordance with some embodiments. In some embodiments, when the sizes of input capacitors $C_{FE1}$, $C_{FE2}$, and $C_{FE3}$ with non-linear polar material of the AND gate are increased by 2 times (e.g., 2×) compared to the sizes in FIG. 6A, then functionality of multiplier cell improves. In this case, voltage developed on node a1 (same as node a2), which is a majority function of inputs on input capacitors $C_{FE1}$, $C_{FE2}$, and $C_{FE3}$, retains enough voltage level to demonstrate proper AND function. The voltage margin on node a1 can be further optimized by resizing input capacitors $C_{FE1}$, $C_{FE2}$, and $C_{FE3}$. FIG. 7B illustrates timing diagram 720 of the implementation of FIG. 7A, in accordance with some embodiments.

Figure 8A:
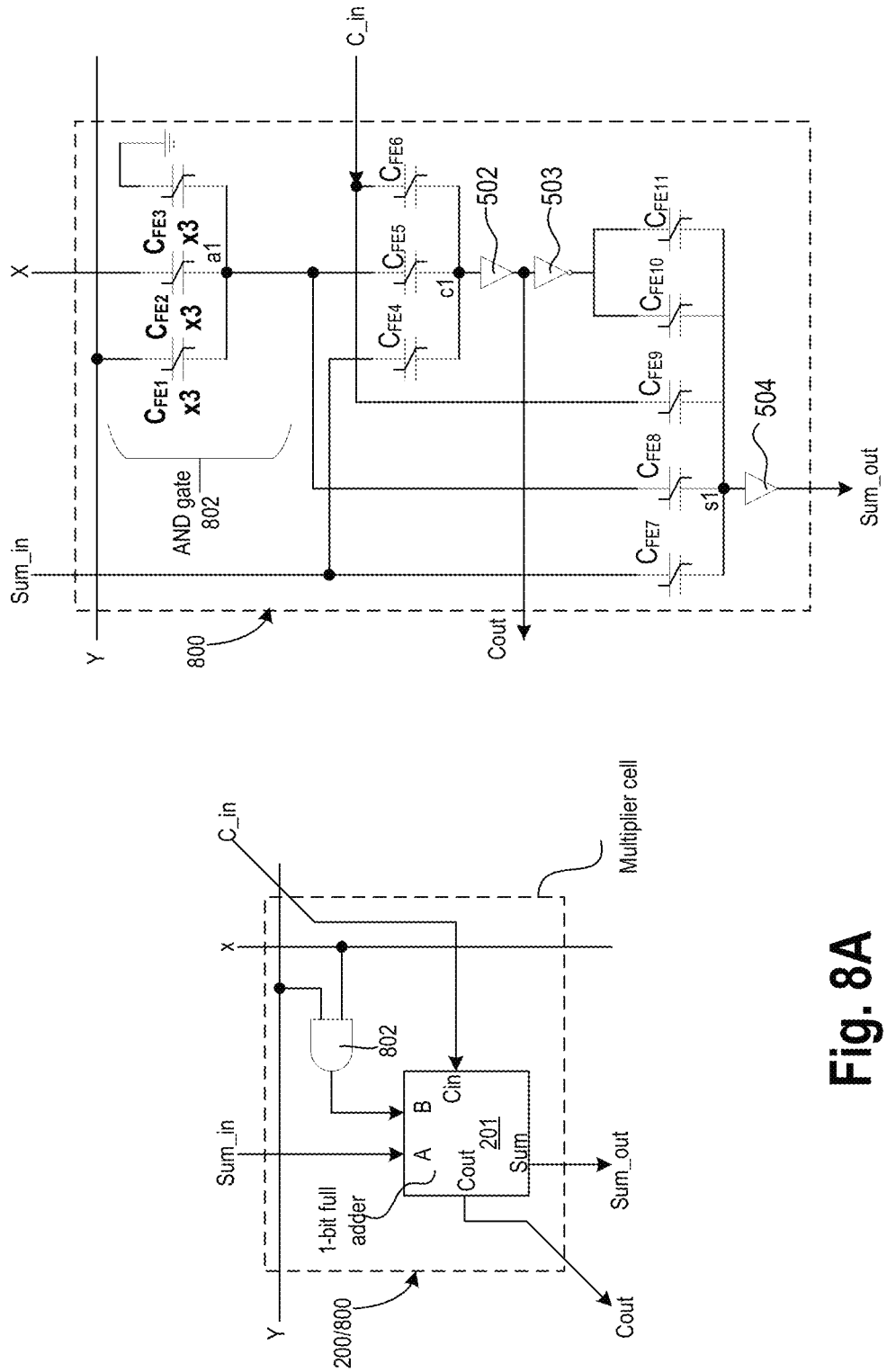
FIG. 8A illustrates a multiplier cell of FIG. 6A with non-linear input capacitors upsized by 3×, in accordance with some embodiments.
Figure 8B:
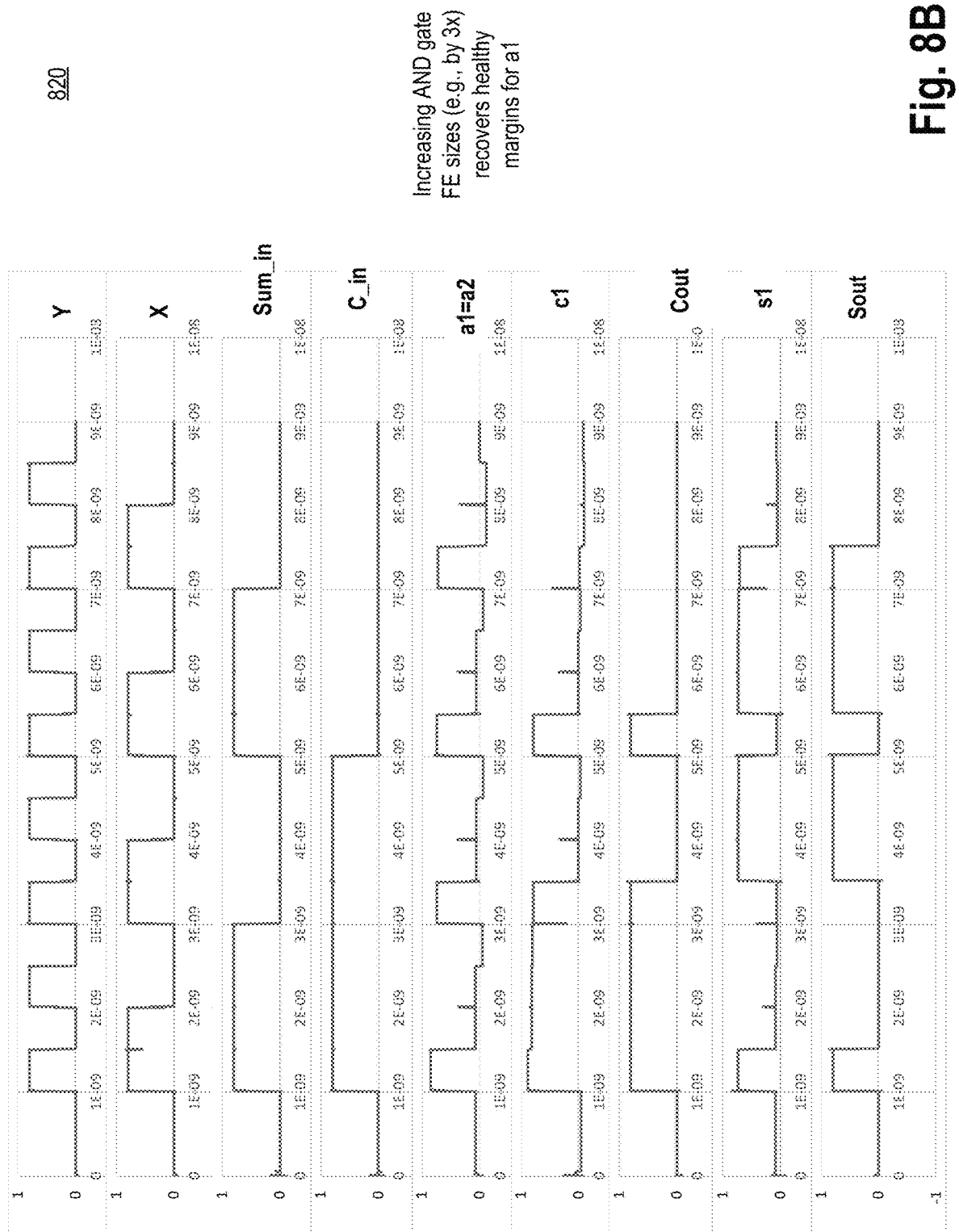
FIG. 8B illustrates a timing diagram of the implementation of FIG. 8A, in accordance with some embodiments.

FIG. 8A illustrates multiplier cell 800 of FIG. 6A with non-linear input capacitors upsized by 3×, in accordance with some embodiments. In some embodiments, when the sizes of input capacitors $C_{FE1}$, $C_{FE2}$, and $C_{FE3}$ with non-linear polar material of the AND gate are increased by 3 times (e.g., 3×) compared to the sizes in FIG. 6A, then functionality of multiplier cell is normal. In this case, voltage developed on node a1 (same as node a2), which is a majority function of inputs on input capacitors $C_{FE1}$, $C_{FE2}$, and $C_{FE3}$, retains enough voltage level for proper AND function, and voltage on node a1 retains a healthy margin. FIG. 8B illustrates timing diagram 820 of the implementation of FIG. 8A, in accordance with some embodiments.

Figure 9A:
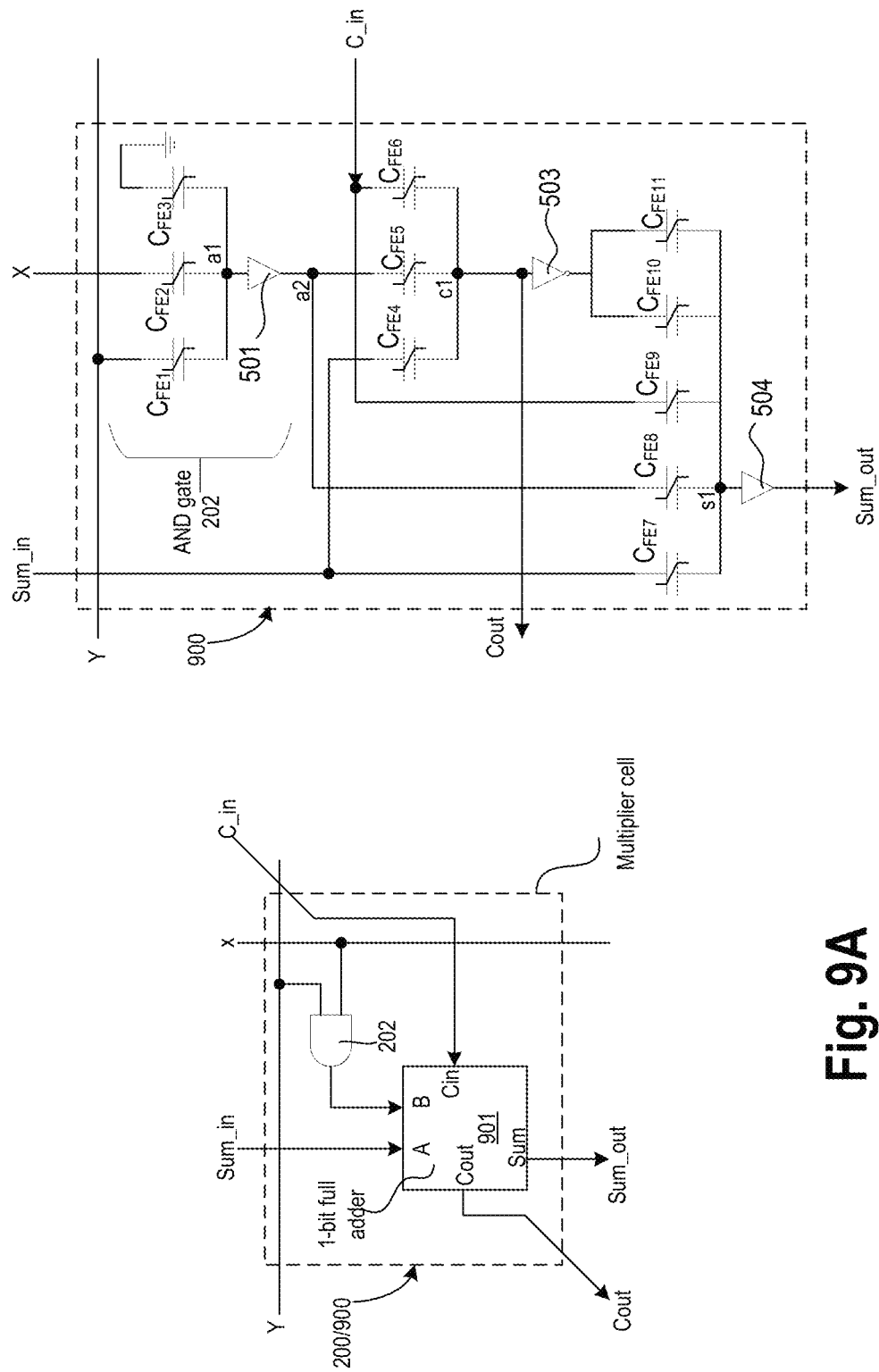
FIG. 9A illustrates a multiplier cell having a full-adder and an AND gate using majority or minority gates with non-linear input capacitors and without an internal buffer in the full-adder, in accordance with some embodiments.
Figure 9B:
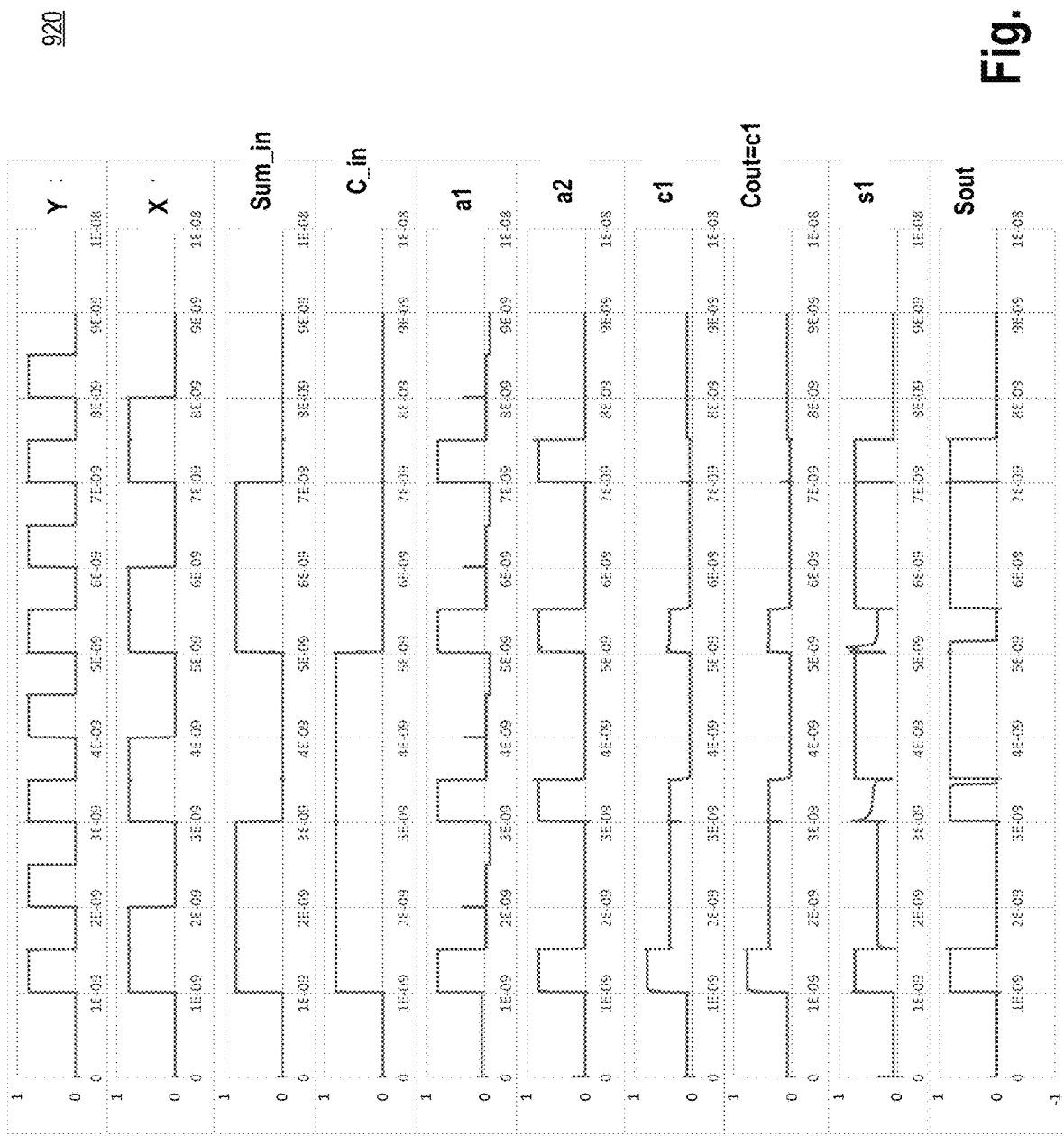
FIG. 9B illustrates a timing diagram of the implementation of FIG. 9A, in accordance with some embodiments.

FIG. 9A illustrates multiplier cell 900 having a full-adder and a AND gate using majority or minority gates with non-linear input capacitors and without an internal buffer in the full-adder, in accordance with some embodiments. Compared to multiplier cell 500, here buffer 502 is removed. Removing buffer 502 may reduce the voltage margin on node Cout because the majority function output on node c1 may not have enough voltage margin. In this case, voltage developed on node c1 (same as node Cout), which is a majority function of inputs on input capacitors $C_{FE4}$, $C_{FE5}$, and $C_{FE6}$, retains enough voltage level to demonstrate proper majority function. Such an embodiment can be used to reduce the footprint of the multiplier cell. FIG. 9B illustrates timing diagram 920 of the implementation of FIG. 9A, in accordance with some embodiments.

Figure 10A:
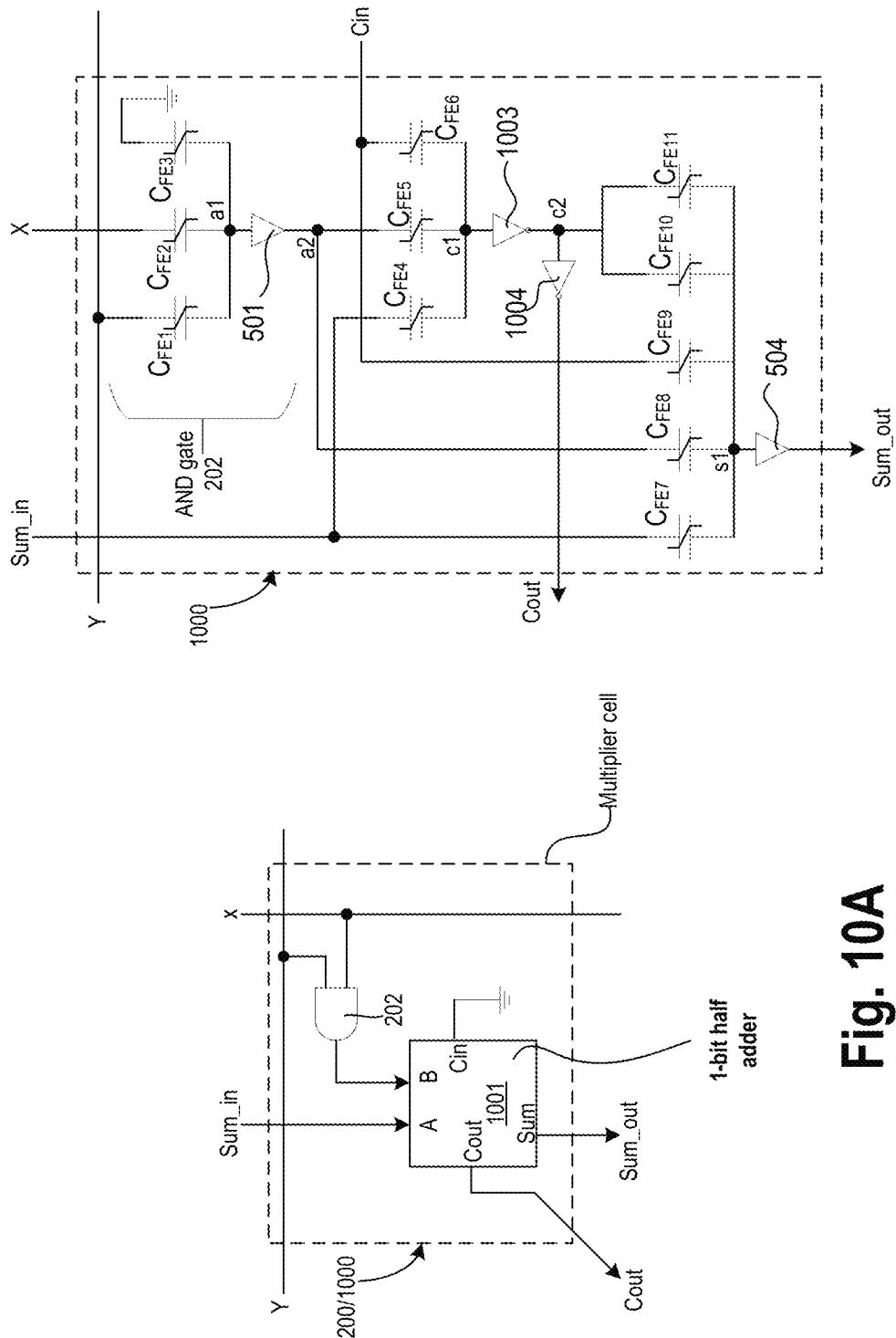
FIG. 10A illustrates a multiplier cell having a full-adder and a AND gate using majority or minority gates with non-linear input capacitors and with fewer transistors but delayed carry-out Cout, in accordance with some embodiments.
Figure 10B:
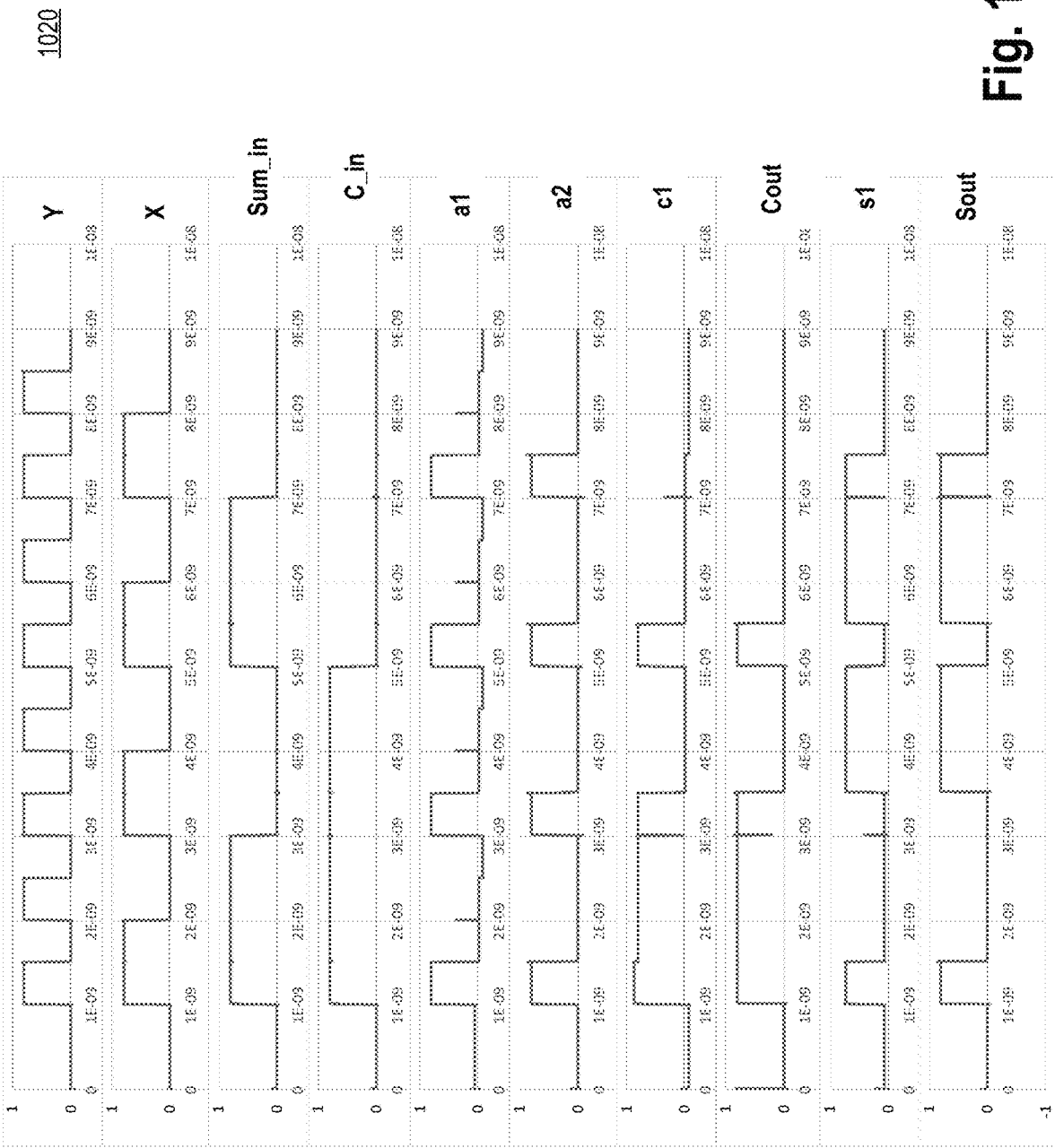
FIG. 10B illustrates a timing diagram of the implementation of FIG. 10A, in accordance with some embodiments.

FIG. 10A illustrates multiplier cell 1000 having a full-adder and a AND gate using majority or minority gates with non-linear input capacitors and with fewer transistors but delayed carry-out Cout), in accordance with some embodiments. Compared to multiplier cell 500, here buffer 502 and inverter 503 are removed. In some embodiments, buffer 502 is replaced with inverter 1003 having an input coupled to node c1 and an output coupled to node c2, which is in turn coupled to capacitors $C_{FE10}$ and $C_{FE11}$. In some embodiments, inverter 1004 is coupled to node c2 to drive the node Cout. In some cases, it is possible that there is contention between nodes c2 and s1 that may lead to increase in delay for Cout. This additional delay on Cout may be a tradeoff between lower transistor count (and thus low power) and faster Cout. FIG. 10B illustrates timing diagram 1020 of the implementation of FIG. 10A, in accordance with some embodiments.

Figure 11:
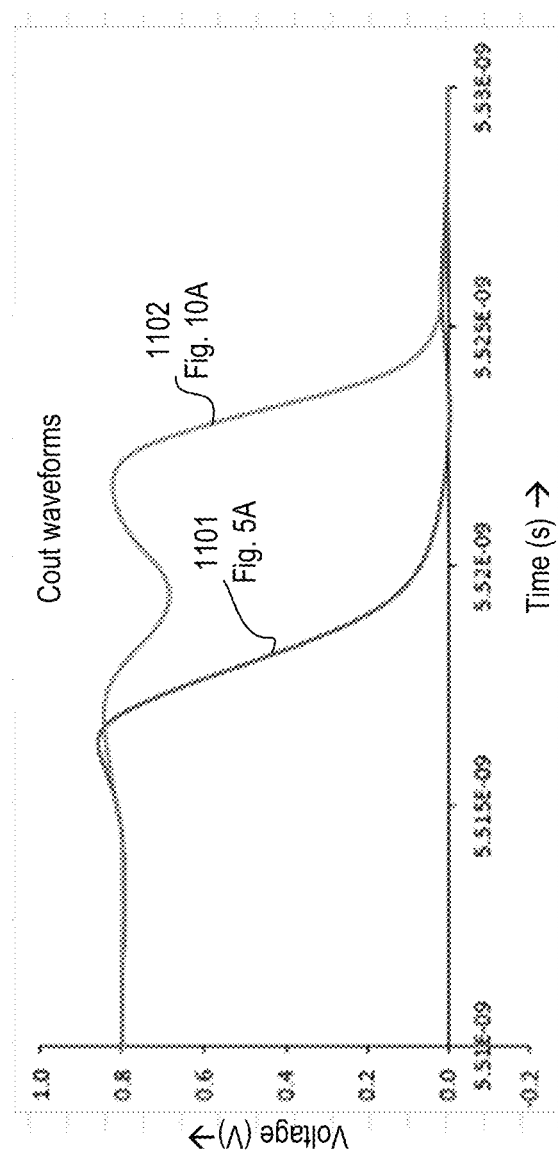
FIG. 11 illustrates a plot showing delay added to Cout in the embodiment of FIG. 10A compared to the embodiment of FIG. 5A, in accordance with some embodiments.

FIG. 11 illustrates plot 1100 showing delay added to Cout in the embodiment of FIG. 10A compared to the embodiment of FIG. 5A, in accordance with some embodiments. Here, x-axis is time while y-axis is voltage. Plot 1100 shows Cout being delayed due to removal of buffer 502 and insertion of inverters 1003 and 1004. In this example, falling edge delay is shown for Cout. Waveform 1101 is the falling edge of Cout for FIG. 5A while waveform 1102 is the falling edge of Cout for FIG. 10A.

Figure 12A:
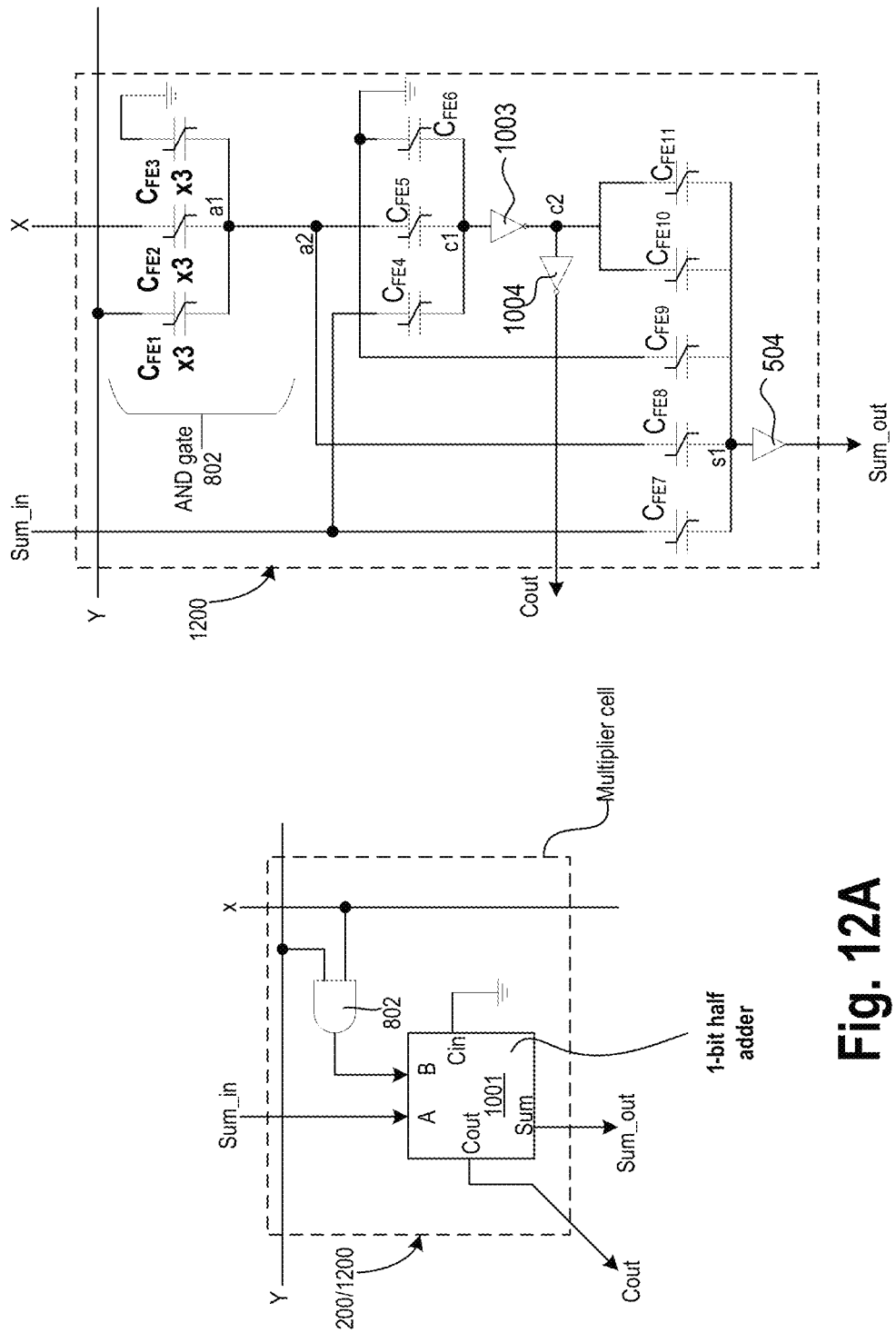
FIG. 12A illustrates a multiplier cell having a full-adder and a AND gate using majority or minority gates with non-linear input capacitors and with fewer transistors but delayed carry-out, and direct connection between the AND gate and the full-adder, in accordance with some embodiments.
Figure 12B:
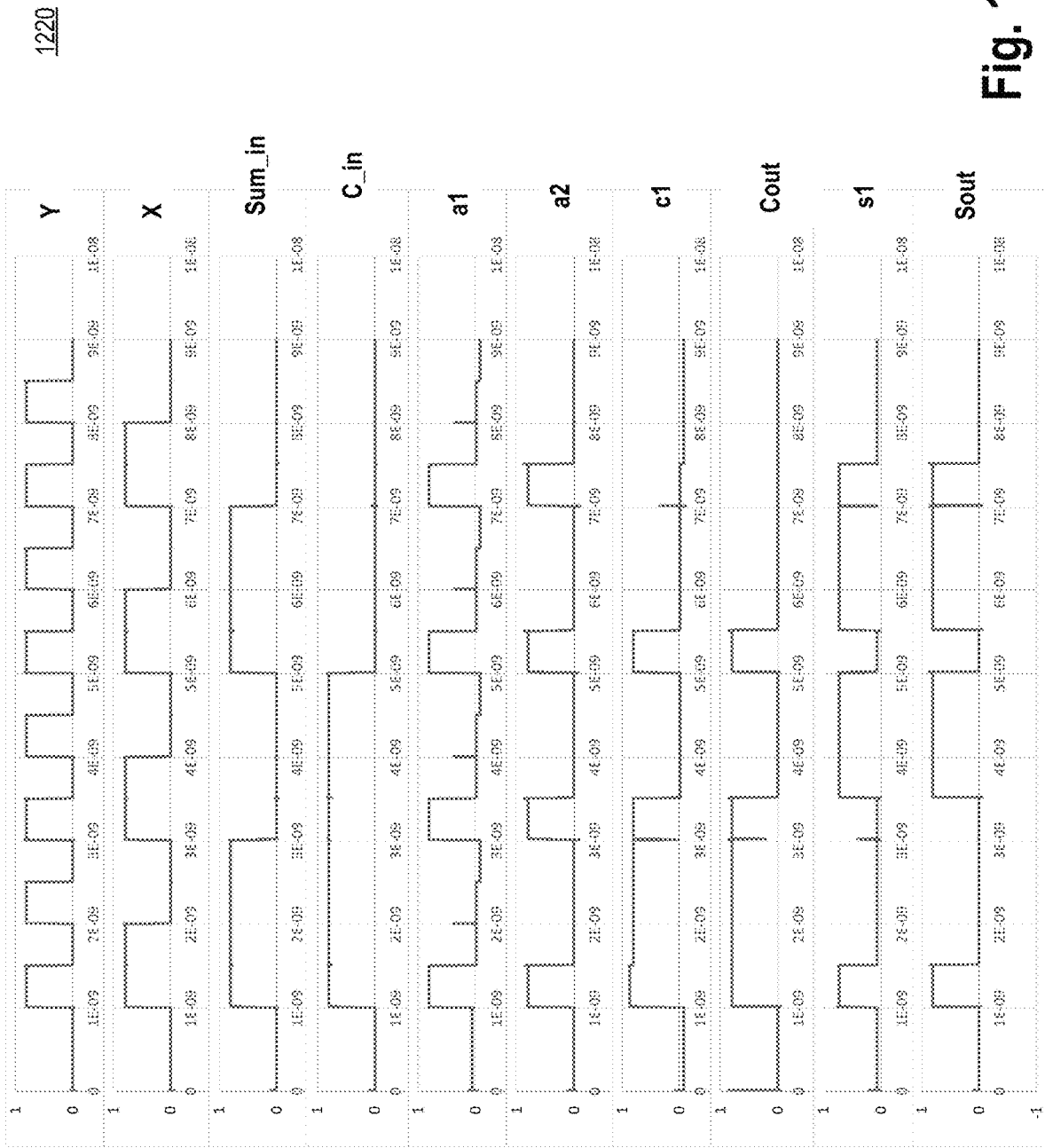
FIG. 12B illustrates a timing diagram of the implementation of FIG. 12A, in accordance with some embodiments.

FIG. 12A illustrates multiplier cell 1200 having a full-adder and a AND gate using majority or minority gates with non-linear input capacitors and with fewer transistors but delayed carry-out, and direct connection between the AND gate and the full-adder, in accordance with some embodiments. Compared to multiplier cell 1000, here buffer 501 is also removed like in FIG. 8A where the size of input capacitors $C_{FE1}$, $C_{FE2}$, and $C_{FE3}$ with non-linear polar material of the AND gate is increased by 3 times (e.g., 3×) compared to the sizes in FIG. 10A. This design provides more area and transistor savings (thus power savings) compared to other designs described herein. For example, the transistor count relative to FIG. 5A reduces from 14 to 8. Power savings are also realized (e.g., 2.5% or more) even with increasing size of input capacitors $C_{FE1}$, $C_{FE2}$, and $C_{FE3}$. FIG. 12B illustrates timing diagram 1220 of the implementation of FIG. 12A, in accordance with some embodiments.

FIGS. 13A-C illustrate a majority only AND gate 1300 using non-linear input capacitors, a hybrid AND gate 1320 with non-linear input capacitors and CMOS buffer, and CMOS only AND gate 1330, respectively for use in implementing the AND gate of the multiplier cell, in accordance with some embodiments of the disclosure. AND gate 1300 comprises three input capacitors $C_{FE1}$, $C_{FE2}$, and $C_{FE3}$ with non-linear polar material, where one of the capacitors (e.g., $C_{FE3}$) is coupled to ground. The other two capacitors (e.g., $C_{FE1}$, $C_{FE2}$) are coupled to inputs Y and X. The output of the AND gate is a majority function of X, Y, and 0 on node a1. AND gate 1300 is merely capacitor based with no active components. AND gate 1320 is a hybrid AND gate in that is includes $C_{FE1}$, $C_{FE2}$, and $C_{FE3}$ with non-linear polar material and CMOS based buffer 501 coupled to majority node a1. AND gate 1320 occupies more area than AND gate 1300 but provides additional drive strength for subsequent circuits. AND gate 1320 may be useful when inputs Y and X are not driven by strong drivers. AND gate 1330 is a traditional AND gate comprising CMOS NANG gate 1301 followed by CMOS based inverter 1302. AND gate 1330 uses the most active area since it is merely transistor based. Any of these AND gate versions can be used in the various multiplier cells described herein.

Figure 14:
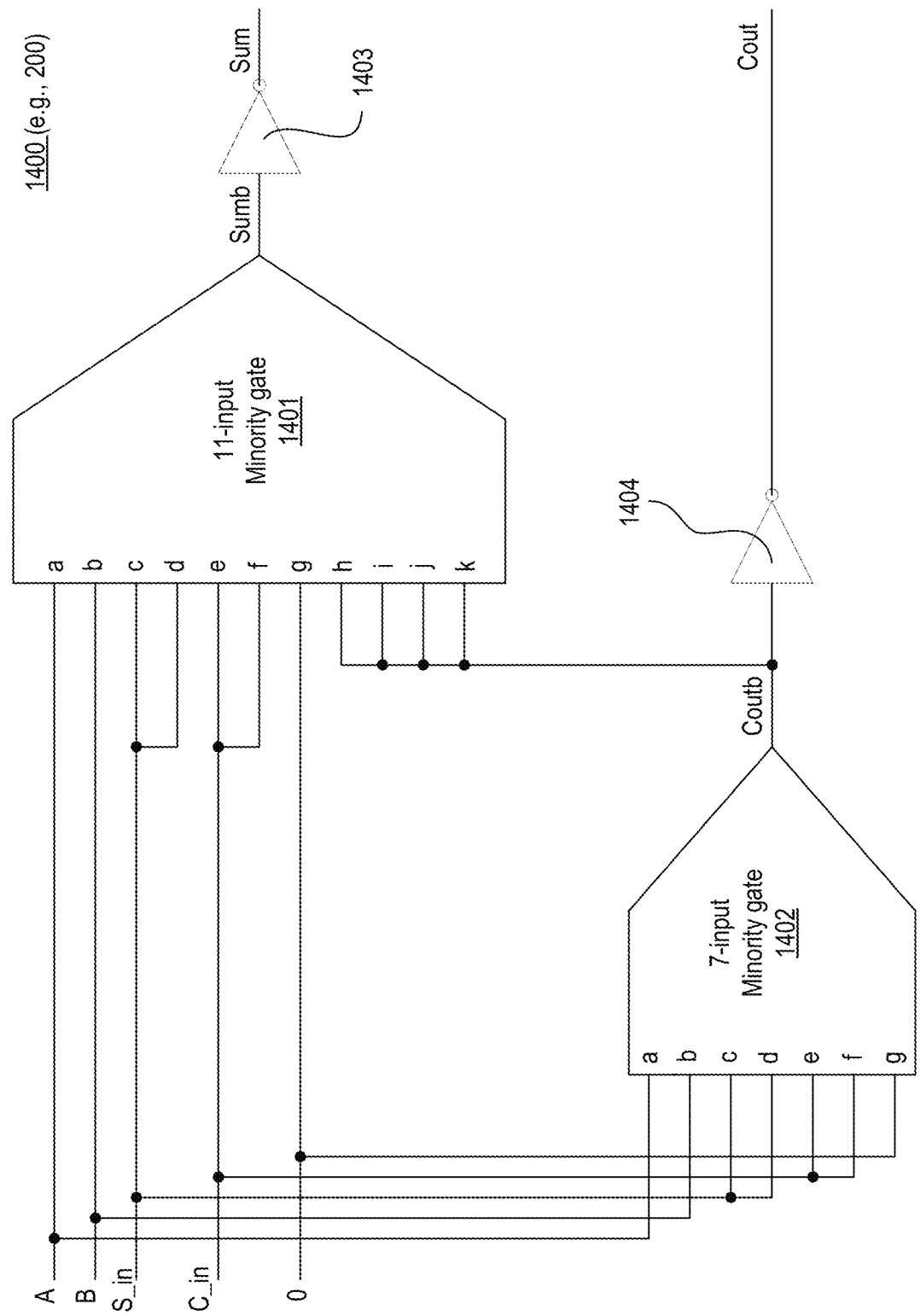
FIG. 14 illustrates a multiplier cell using wide minority gates having non-linear polar material, in accordance with some embodiments.

FIG. 14 illustrates multiplier cell 1400 using wide minority gates having non-linear polar material, in accordance with some embodiments. In some embodiments, multiplier cell 1400 comprises an 11-input minority gate 1401, a 7-input minority gate 1402, and inverters 1403 and 1404 coupled as shown. Implementation of 11-input minority gate 1401 and 7-input minority gate 1402 can be according to any one of implementations of FIG. 4A or FIG. 4B. In some embodiments, input 'a' of 11-input minority gate 1401 receives multiplier input A. In some embodiments, input 'b' of 11-input minority gate 1401 receives multiplicand input B. In some embodiments, input 'c' and input 'd' of 11-input minority gate 1401 receives sum input S_in. In some embodiments, input 'e' and input 'f' of 11-input minority gate 1401 receives carry input C_in. In some embodiments, input 'g' of 11-input minority gate 1401 receives a fixed voltage (e.g., ground). In some embodiments, input 'h', input 'i', input 'j', and input 'k' of 11-input minority gate 1401 receive carry output C_out from 7-input minority gate 1402. The output of 11-input minority gate 1401 is Sumb, which is inverted by inverter 1403 to generate Sum. In some embodiments, input 'a' of 7-input minority gate 1402 receives multiplier input A. In some embodiments, input 'b' of 7-input minority gate 1402 receives multiplicand input B. In some embodiments, input 'c' and input 'd' of 7-input minority gate 1402 receives sum input S_in. In some embodiments, input 'e' and input 'f' of 7-input minority gate 1402 receives carry input C_in. In some embodiments, input 'g' is coupled to ground. The output of 7-input minority gate 1402 is Coutb which is inverted by inverter 1404, to generate Cout. Table 6 is the truth table for multiplier cell 1400.

TABLE 6

| A | B | S_in (sum in) | C_in (carry in) | Cout (carry out) | Sum |
|---|---|---|---|---|---|
| 1 | 1 | 1 | 1 | 1 | 1 |
| 0 | 1 | 1 | 1 | 1 | 0 |
| 1 | 0 | 1 | 1 | 1 | 0 |
| 0 | 0 | 1 | 1 | 1 | 0 |
| 1 | 1 | 0 | 1 | 1 | 0 |
| 0 | 1 | 0 | 1 | 0 | 1 |
| 1 | 0 | 0 | 1 | 0 | 1 |
| 0 | 0 | 0 | 1 | 0 | 1 |
| 1 | 1 | 1 | 0 | 1 | 0 |
| 0 | 1 | 1 | 0 | 0 | 1 |
| 1 | 0 | 1 | 0 | 0 | 1 |
| 0 | 0 | 1 | 0 | 0 | 1 |
| 1 | 1 | 0 | 0 | 0 | 1 |
| 0 | 1 | 0 | 0 | 0 | 0 |
| 1 | 0 | 0 | 0 | 0 | 0 |
| 0 | 0 | 0 | 0 | 0 | 0 |

The functional description of the outputs Sum and Cout can be expressed as follows:

Cout=Majority((A AND B),S_in,C_in)

Sum=XOR((A AND B),S_in,C_in)

In various embodiments, the input configuration of 7-input minority gate 1402 performs an integrated AND function of inputs A and B, and the result of this AND function is used in the majority function with other inputs S_in and C_in. The output Coutb is inverted by inverter 1404. As such, the output of inverter 1404 (i.e., Cout) is a majority function of (A AND B), S_in, and C_in. In various embodiments, the input configuration of 11-input minority gate 1401 performs an integrated AND function of inputs A and B, and then an exclusive-OR (XOR) function of the AND result, S_in, and C_in. The output Sumb is inverted by inverter 1403 to generate Sum. By using a wide-input ferroelectric or paraelectric based multiplier cell 1400 allows for shorter propagation delay because the depth of majority or minority gates is 2.

Figure 15:
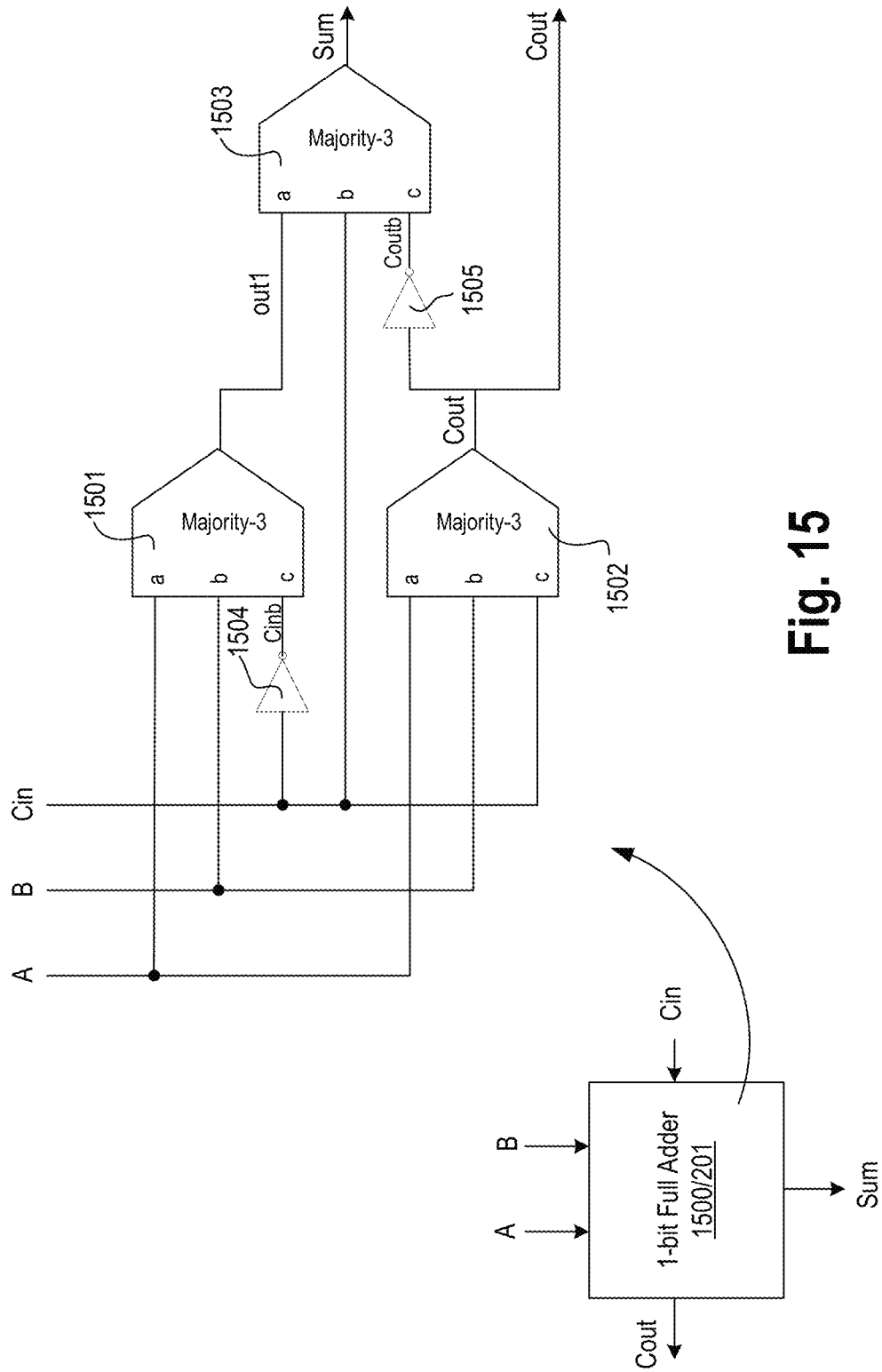
FIG. 15 illustrates a 1-bit adder having a 3-input majority gate with ferroelectric or paraelectric material, in accordance with some embodiments.

FIG. 15 illustrates a 1-bit adder having a 3-input majority gate 1500 with ferroelectric or paraelectric material, in accordance with some embodiments. In some embodiments, 1-bit full adder 1500 comprises a first 3-input majority gate 1501, a second 3-input majority gate 1502, a third 3-input majority gate 1503, a first inverter 1504, and a second inverter 1505. Each majority gate here has three inputs 'a', 'b', and 'c', which are coupled to various nodes as shown. In various embodiments, first 3-input majority gate 1501 receives a first input (e.g., A), a second input (e.g., B), and an inverted version of a third input (e.g., Cinb), wherein the first input is a first operand, wherein the second input is a second operand, and wherein the third input is a carry-in bit. In various embodiments, the inverted version of a third input is generated by inverter 1504. In some embodiments, inverter 1504 can be replaced with any suitable inverting logic such as NAND gate, NOR gate, etc.

In various embodiments, first 3-input majority gate 1502 generates a first output out1 which is a first majority function of the first input, the second input, and the inverted version of the third input. In some embodiments, second 3-input majority gate 1502 receives the first input, the second input, and the third input. In various embodiments, second 3-input majority gate 1502 generates second output Cout which is a second majority function of the first input, the second input, and the third input. In some embodiments, third 3-input majority gate 1503 receives the first output, an inverted version of the second output, and the third input. In some embodiments, third 3-input majority gate 1503 generates third output Sum which is a third majority function of the first output, the inverted version of the second output (Coutb), and the third input. In various embodiments, the second output Cout is a carry-out, while the third output is a sum of the operands. In some embodiments, first 3-input majority gate 1501, second 3-input majority gate 1502, and third 3-input majority gate 1503 include non-linear polar material. In some embodiments, the non-linear polar material includes one of: ferroelectric material, paraelectric material, or non-linear dielectric.

In some embodiments, first 3-input majority gate 1501 comprises a first capacitor that receives the first input, wherein the first capacitor is coupled to a node. In some embodiments, first 3-input majority gate 1501 comprises a second capacitor that receives the second input, wherein the second capacitor coupled to the node. In some embodiments, first 3-input majority gate 1501 comprises a third capacitor that receives the inverted version of the third input, wherein the third capacitor is coupled to the node. In various embodiments, the first capacitor, the second capacitor, and the third capacitor include the non-linear polar material. In some embodiments, a buffer is added on the node to drive the majority function output. Other majority gates 1502 and 1503 have similar input capacitors with non-linear polar material.

1-bit adder 1500 has three inputs, and it spits out carry Cout and sum as the outputs. In various embodiments, 1-bit adder 1500 can be built with minimum of three gates using 3-input majority gates (or 3-input minority gates). In various embodiments, the carry output Cout of full adder 1500 directly maps to the majority operation of its three inputs. In some embodiments, the sum operation is an XOR operation of its three inputs. XOR is a non-linear function and uses at least a depth of 2 to build it. Carry output Cout is inverted by inverter 1505 and can be utilized for getting the final sum output using another majority gate 1503. 1-bit full adder cell 1500 can also be used as half-adder cell, where one of the inputs is set to zero. In some embodiments, 1-bit full adder cell 1500 is a fundamental building block of multiplier and adder circuits, and wherever an addition operation can be utilized.

Figure 16:
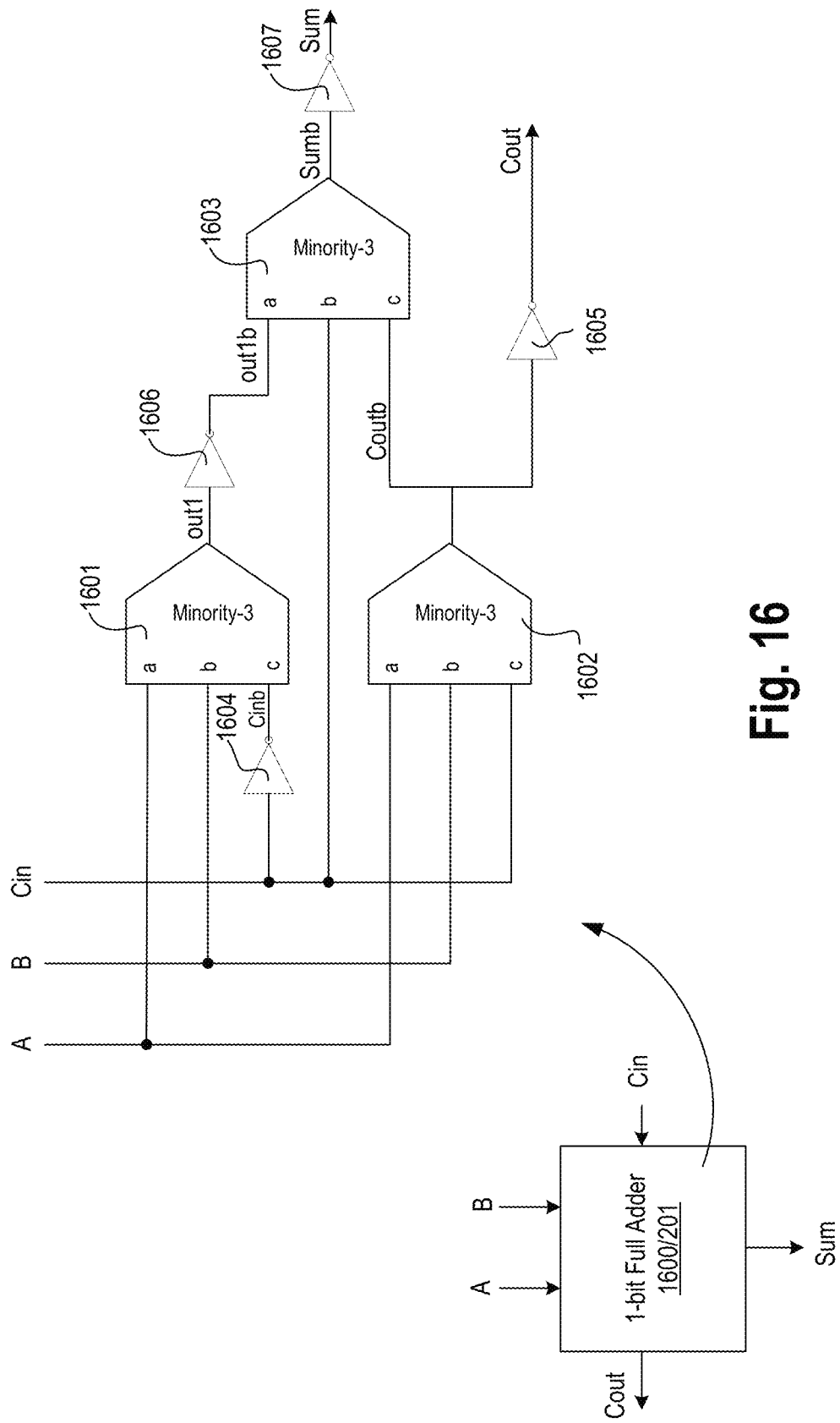
FIG. 16 illustrates a 1-bit 3-input minority gate-based adder with ferroelectric or paraelectric material, in accordance with some embodiments.

FIG. 16 illustrates a 1-bit 3-input minority gate-based adder 1600 with ferroelectric or paraelectric material, in accordance with some embodiments. Compared to adder 1500, here majority gates are replaced with minority gates. In some embodiments, 1-bit full adder 1600 comprises a first 3-input minority gate 1601, a second 3-input minority gate 1602, a third 3-input minority gate 1603, a first inverter 1604, a second inverter 1605, third inverter 1606, and fourth inverter 1607. Each minority gate here has three inputs 'a', 'b', and 'c', which are coupled to various nodes as shown. In various embodiments, first 3-input minority gate 1601 receives a first input (e.g., A), a second input (e.g., B), and an inverted version of a third input (e.g., Cinb), wherein the first input is a first operand, wherein the second input is a second operand, and wherein the third input is a carry-in bit. In various embodiments, the inverted version of a third input is generated by inverter 1604. In some embodiments, inverter 1604 can be replaced with any suitable inverting logic such as NAND gate, NOR gate, etc.

In various embodiments, first 3-input minority gate 1601 generates a first output out1 which is a first minority function of the first input, the second input, and the inverted version of the third input. In some embodiments, second 3-input minority gate 1602 receives the first input, the second input, and the third input. In various embodiments, second 3-input majority gate 1602 generates second output Coutb which is a second minority function of the first input, the second input, and the third input. In some embodiments, third 3-input minority gate 1603 receives an inverted version of the first output out1, the second output Coutb, and the third input. In various embodiments, the inverted version of the first output out1 is generated by inverter 1606. In some embodiments, third 3-input majority gate 1603 generates a third output Sumb which is a third minority function of out1b (which is an inverted version of the first output out1), the second output Coutb, and the third input Cin. In various embodiments, the third output Sumb is inverted by inverter 1607 to generate Sum. In various embodiments, the second output Coutb is inverted by inverter 1605 to generate Cout which is a carry-out, while the third output is a sum of the operands. In some embodiments, first 3-input minority gate 1601, second 3-input minority gate 1602, and third 3-input minority gate 1603 include non-linear polar material. In some embodiments, the non-linear polar material includes one of: ferroelectric material, paraelectric material, or non-linear dielectric.

In some embodiments, first 3-input minority gate 1601 comprises a first capacitor that receives the first input, wherein the first capacitor is coupled to a node. In some embodiments, first 3-input minority gate 1601 comprises a second capacitor that receives the second input, wherein the second capacitor is coupled to the node. In some embodiments, first 3-input minority gate 1601 comprises a third capacitor that receives the inverted version of the third input, wherein the third capacitor is coupled to the node (e.g., summing node). In various embodiments, the first capacitor, the second capacitor, and the third capacitor include the non-linear polar material. A majority function of the inputs on the capacitor terminals is performed on the node. In some embodiments, first 3-input minority gate 1601 comprises a driver circuitry having a capacitive input coupled to the node, and an output which converts the majority function on the node to a minority function output at the output of the driver circuitry. Other minority gates 1602 and 1603 here have similar input capacitors with non-linear polar material.

In various embodiments, 1-bit full adder 1600 is built with minority-3 gates. Minority gates can be fabricated directly or using majority gates and an inverter. Minority logic operation is inverse of majority logic operation. And, therefore, the full adder truth table can be mapped to minority gates as well. Here, the carry output Cout is synthesized as 3-input minority gate 1602 followed by inverter 1605 to get the majority function of the three inputs A, B, and Cin. Inverted carry bit Coutb is reutilized to calculate the sum bit, which is an XOR of the three of its inputs, in accordance with various embodiments.

Figure 17:
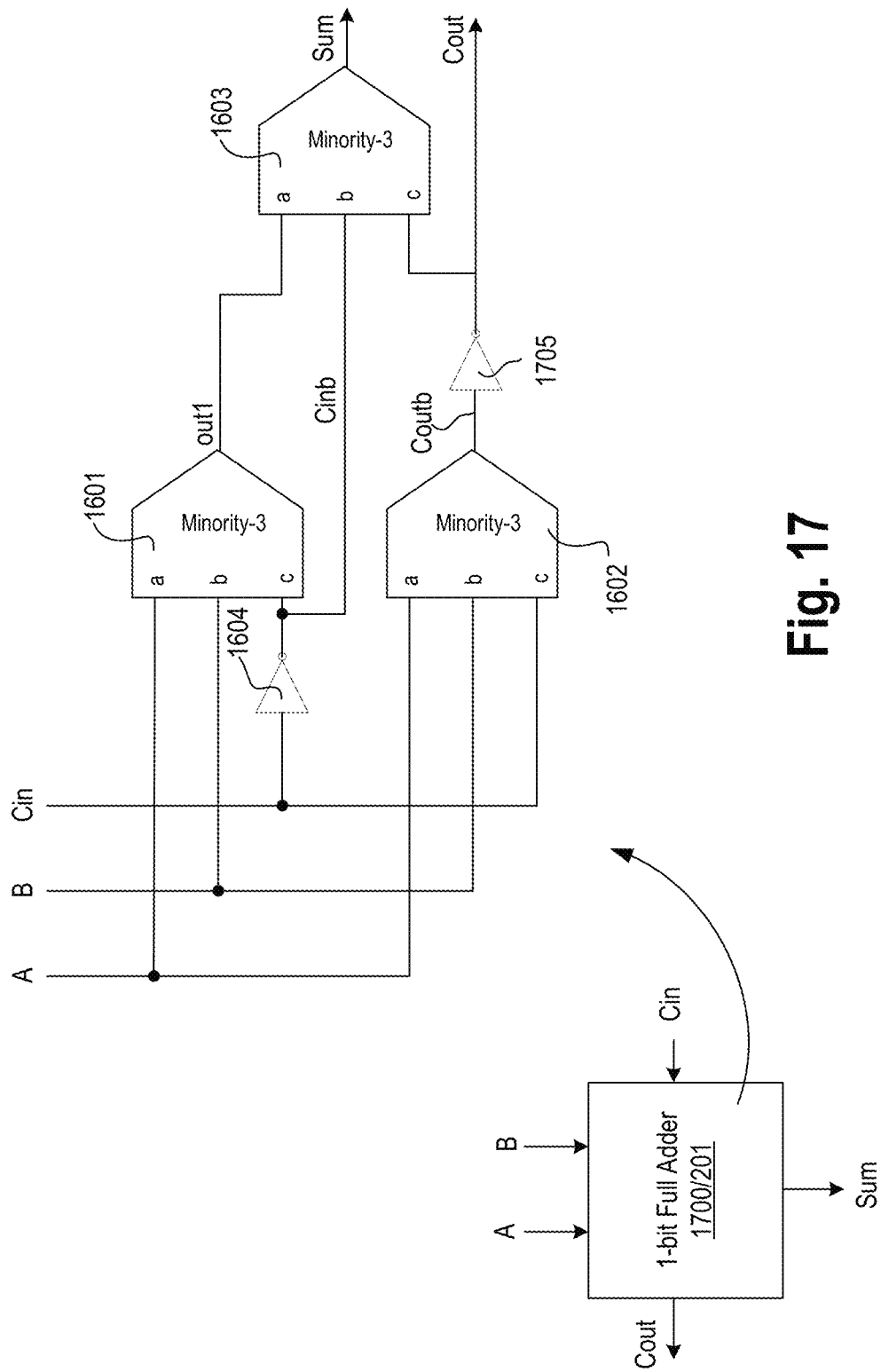
FIG. 17 illustrates a 1-bit 3-input minority gate-based adder with ferroelectric or paraelectric material and with fewer transistors than the adder of FIG. 16, in accordance with some embodiments.

FIG. 17 illustrates a 1-bit 3-input minority gate-based adder 1700 with ferroelectric or paraelectric material and with fewer transistors than the adder of FIG. 16, in accordance with some embodiments. Each minority gate here has three inputs 'a', 'b', and 'c', which are coupled to various nodes as shown. The inputs to first minority gate 1601 and second minority gate 1602 are same as those shown in adder 1600. The inputs to third minority gate 1603 are modified to reduce the number of inverters compared to adder 1600. Compared to adder 1600, here inverter 1606 is removed and the first output out1 is provided as input 'a' to third minority gate 1603. Input 'b' of third minority gate 1603 is Cinb, which is an inverted version of third input Cin. Input 'c' of third minority gate 1603 is Cout which is an inverted version of the output of second minority gate 1602. In some embodiments, adder 1700 comprises inverter 1705 which generates the inverted version of Coutb. As discussed herein, full adder 1700 is very similar to adder 1600, but uses inverters in different places. These different variations of the circuits play different roles while optimizing layout of these standard cells for power, performance, and area.

Figure 18:
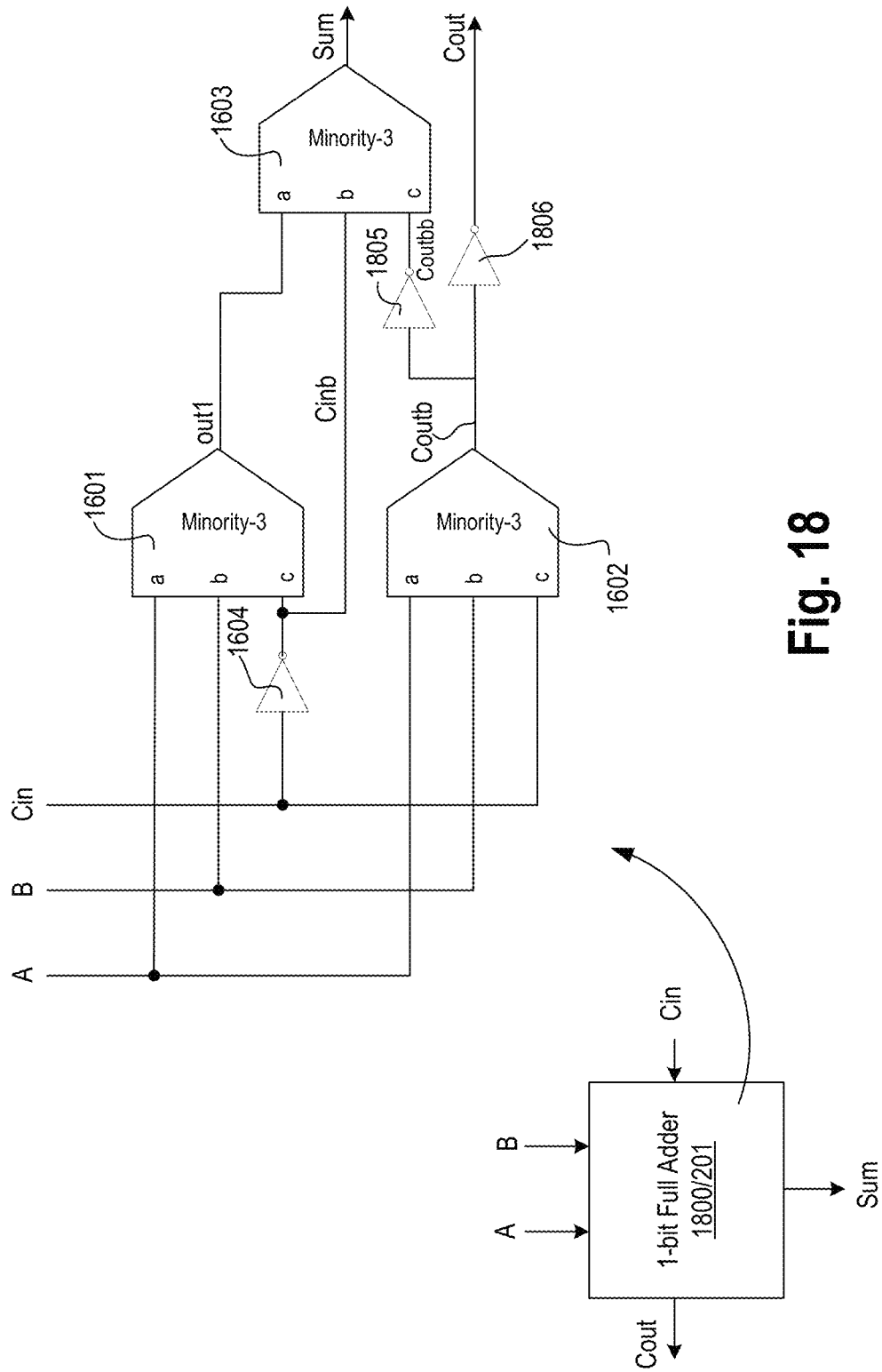
FIG. 18 illustrates a 1-bit 3-input minority gate-based adder with buffer carry path from a sum path, in accordance with some embodiments.

FIG. 18 illustrates a 1-bit 3-input minority gate-based adder 1800 with buffer carry path from a sum path, in accordance with some embodiments. Adder 1800 is like adder 1700. The inputs to first minority gate 1601 and second minority gate 1602 are same as those shown in adder 1700. The inputs to third minority gate 1603 are also same as those shown in adder 1700. Here, the output of second minority gate 1602 is split by two inverters 1805 and 1806. The output of inverter 1805 is Coutbb (which is an inverted version of output Coutb, where Coutbb is logically same as Cout). The output of inverter 1806 is Cout, which may be provided to another adder as input Cin, for example. Adder 1800 is a variation of adders 1600 or 1700 and may provide trade-off of area, power and delay by optimizing the fan-in count needed for the transistors of the inverters in the circuit for their drive strength and for removing glitches, in accordance with some embodiments.

Figure 19:
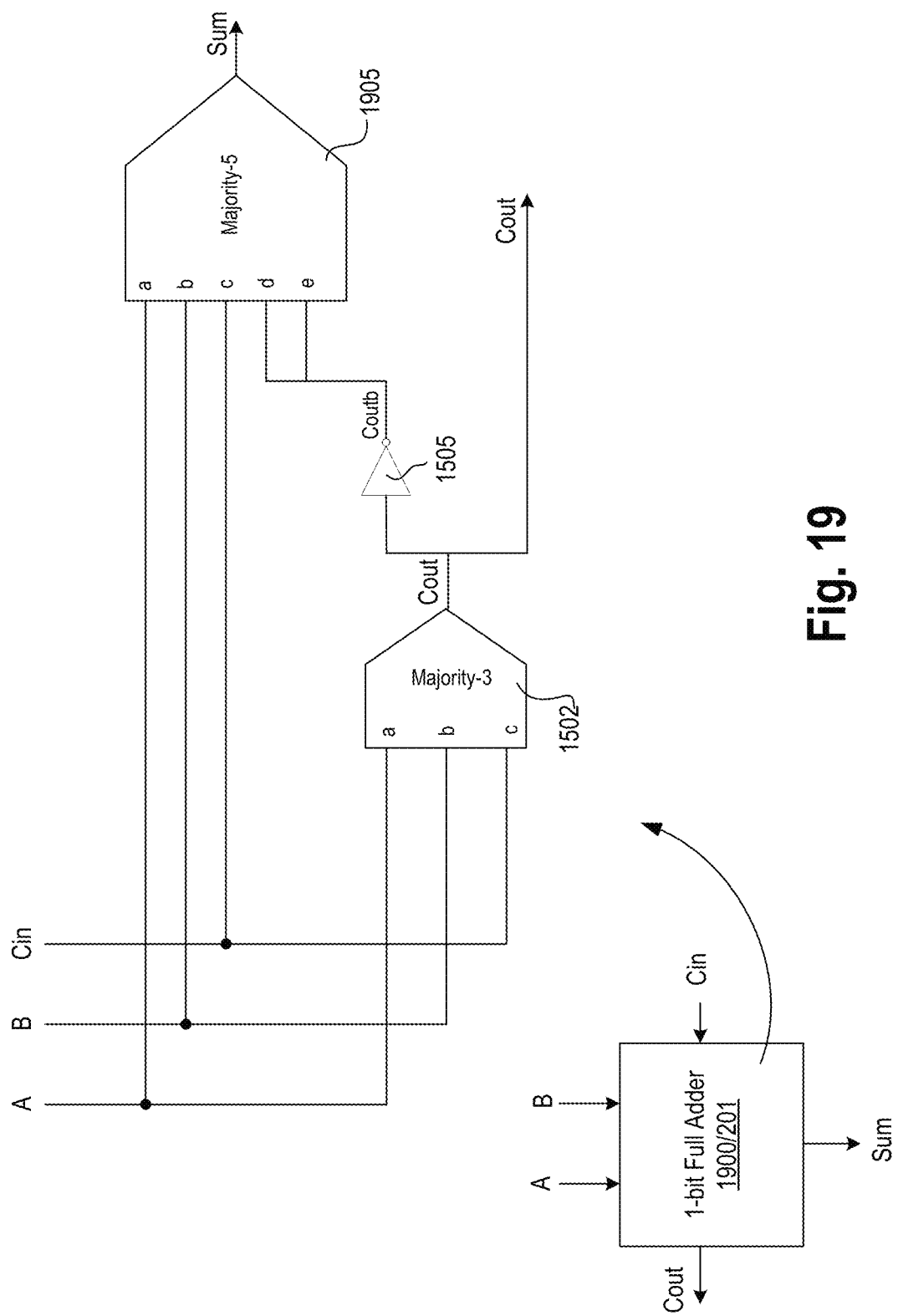
FIG. 19 illustrates a 1-bit full adder with 5-input majority gate, in accordance with some embodiments.

FIG. 19 illustrates 1-bit full adder 1900 with 5-input majority gate, in accordance with some embodiments. Like various adders discussed herein, adder 1900 has a depth of 2. Here depth refers to the number of majority or minority gates from inputs (e.g., A, B, and Cin) to output Sum. Adder 1900 comprises 3-input majority gate 1502, inverter 1505, and 5-input majority gate 1905. Inputs 'a', 'b', and 'c' of 3-input majority gate 1502 are coupled to inputs A, B, Cin, respectively. The output Cout of 3-input majority gate 1502 is inverted by inverter 1505. In various embodiments, the output Coutb of inverter 1505 is provided as inputs 'd' and 'e' of 5-input majority gate 1905 while inputs 'a', 'b', and 'c' of 5-input majority gate 1905 receives inputs A, B, and Cin, respectively. In various embodiments, majority gates 1502 and 1905 are implemented using one of the designs of FIG. 4A and FIG. 4B.

Like the 1-bit adder circuits described in other embodiments, Adder 1900 also uses 3-input majority operation for generating the carry output Cout. However, by using 5-input majority logic, the sum output can be synthesized using a single extra 5-input majority gate 1905. Adder 1900 has benefits in cases when a reliable 5-input majority or minority gate can be fabricated in a smaller area compared to two 3-input minority gates or two 3-input majority gates.

Figure 20:
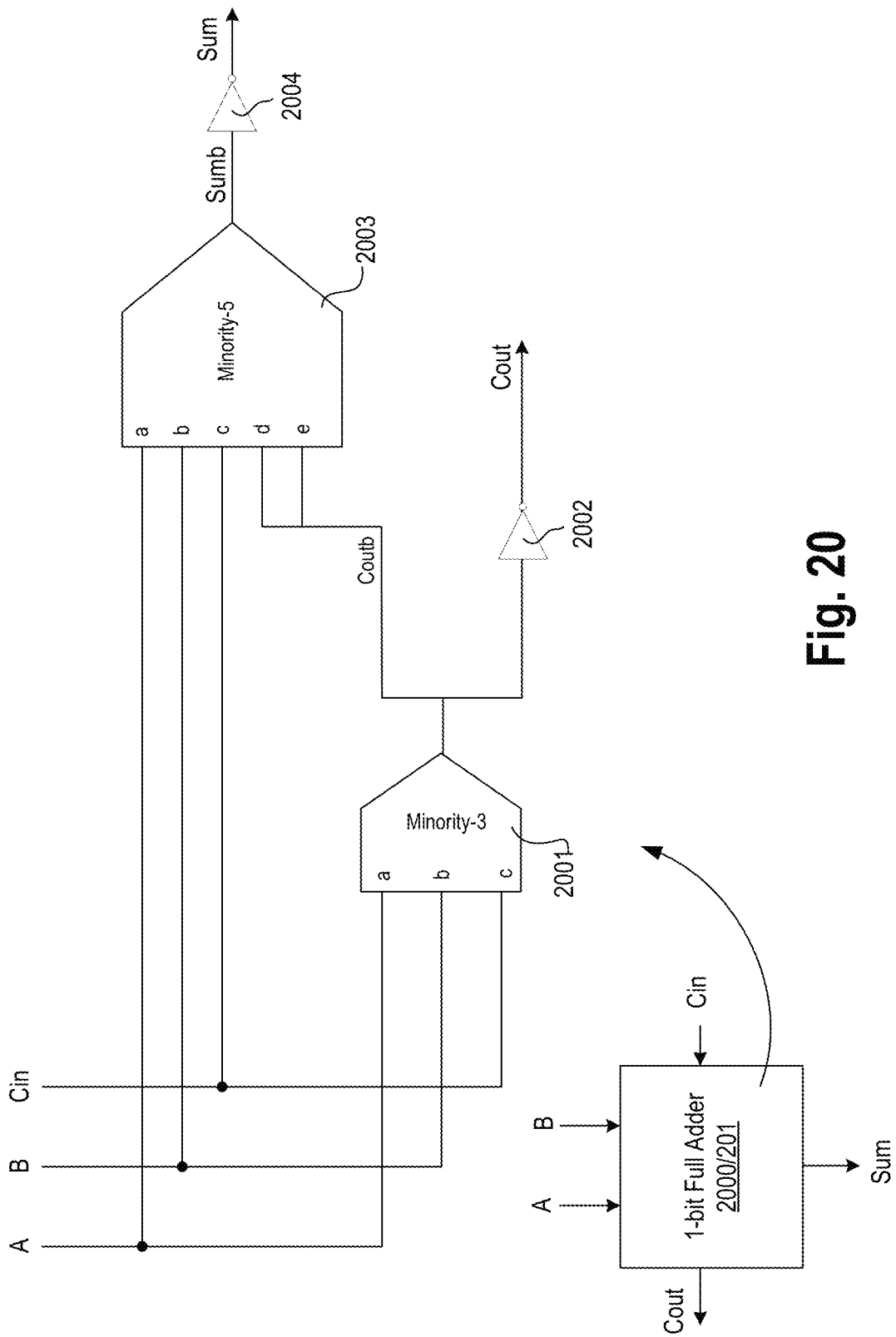
FIG. 20 illustrates a 1-bit full adder with 5-input minority gate, in accordance with some embodiments.

FIG. 20 illustrates 1-bit full adder 2000 with 5-input minority gate, in accordance with some embodiments. Adder 2000 has the same basic architecture as that of adder 1900 but replaces the majority gates with minority gates. Adder 2000 comprises 3-input minority gate 2001, inverter 2002, and 5-input minority gate 2003. Inputs 'a', 'b', and 'c' of 3-input minority gate 801 are coupled to inputs A, B, Cin, respectively. The output Coutb of 3-input minority gate 2001 is inverted by inverter 2002 to generate Cout. In various embodiments, the output Cout of 3-input minority gate 2001 is provided as inputs 'd' and 'e' of 5-input minority gate 2003 while inputs 'a', 'b', and 'c' of 5-input minority gate 2003 receives inputs A, B, and Cin, respectively. The output of 5-input minority gate 2003 is Sumb, which is inverted by inverter 2004 to generate sum. In various embodiments, minority gates 2001 and 2003 are implemented using one of the designs of FIG. 4A and FIG. 4B.

Adder 2000 is logically equivalent adder 1900 with the Boolean algebra. In some embodiments, minority gates are used instead of majority gates as the basic gates. In some embodiments, where inverter is plugged in at the summation node of the capacitive logic, it provides higher resolution to separate out Boolean logic levels of 0 and 1, and in some cases may be preferred over majority gate based implementations.

Figure 21A:
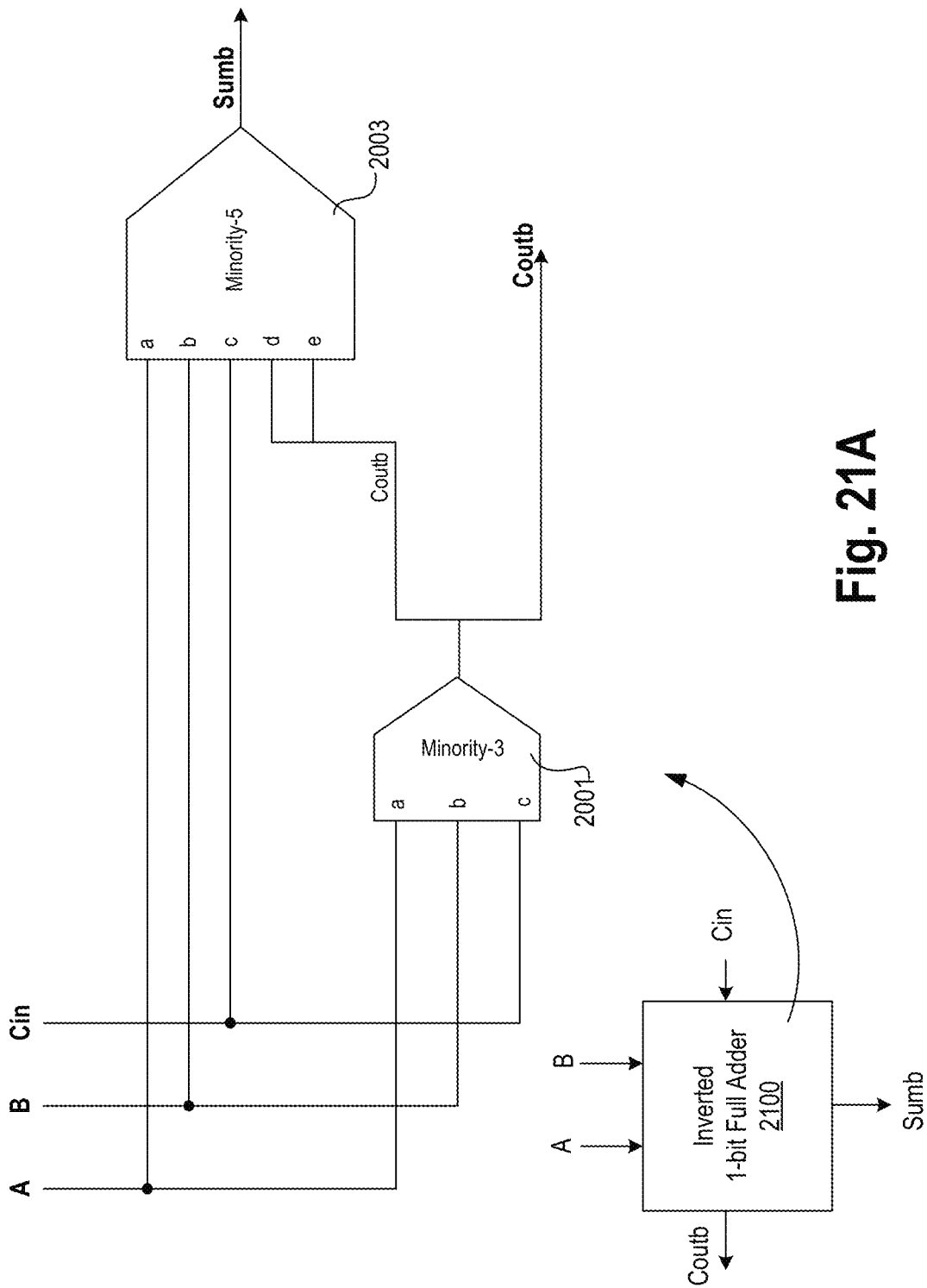
FIG. 21A illustrates a 1-bit inverted full adder, in accordance with some embodiments.

FIG. 21A illustrates 1-bit inverted full adder 2100, in accordance with some embodiments. In some embodiments, it may be desirable to generate inverted sum (sumb) and carry out signal Coutb to reduce overall logic delay. One such example of an adder is illustrated by adder 2100. Adder 2100 comprises 3-input minority gate 2001 and 5-input minority gate 2003. Inputs 'a', 'b', and 'c' of 3-input minority gate 2001 are coupled to inputs A, B, and Cin, respectively. The output Coutb of 3-input minority gate 2001 is provided as inputs 'd' and 'e' of 5-input minority gate 2003 while inputs 'a', 'b', and 'c' of 5-input minority gate 2003 receive inputs A, B, and Cin, respectively. In various embodiments, minority gates 2001 and 2003 are implemented using one of the designs of FIG. 4A and FIG. 4B.

In 1-bit inverted full adder 2100, the outputs of the circuit are inverted sum (sumb) and inverted carry (Coutb), rather than sum and carry, respectively. 1-bit inverted full adder 2100 is highly useful to optimize the number of inverters in a bigger circuit, where the inverted versions of carry and sum outputs of the full adder cell can be used.

Figure 21B:
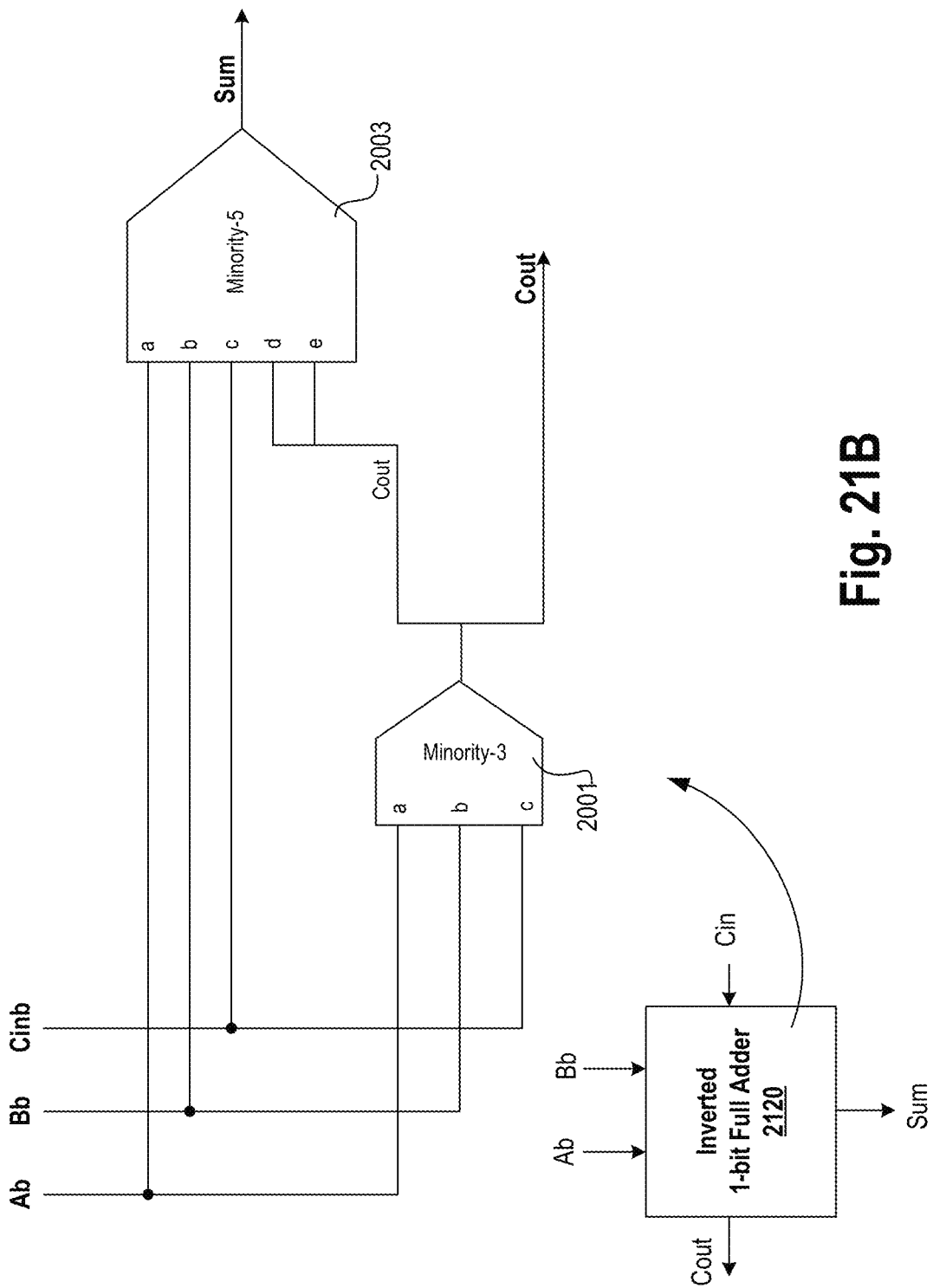
FIG. 21B illustrates a 1-bit inverted full adder, in accordance with some other embodiments.

FIG. 21B illustrates 1-bit inverted full adder 2120, in accordance with some other embodiments. In some embodiments, it may be desirable to generate sum and carry out signal Cout using inverted operands Ab, Cb, and carry-in Cinb to reduce overall logic delay. One such example of an adder is illustrated by adder 2120. Adder 2120 comprises 3-input minority gate 2001 and 5-input minority gate 2003. Inputs 'a', 'b', and 'c' of 3-input minority gate 2001 are coupled to inverted inputs Ab, Bb, and Cinb, respectively. The output Cout of 3-input minority gate 2001 is provided as inputs 'd' and 'e' of 5-input minority gate 2003 while inputs 'a', 'b', and 'c' of 5-input minority gate 2003 receive inverted inputs Ab, Bb, and Cinb, respectively. In various embodiments, minority gates 2001 and 2003 are implemented using one of the designs of FIG. 4A and FIG. 4B.

Figure 21C:
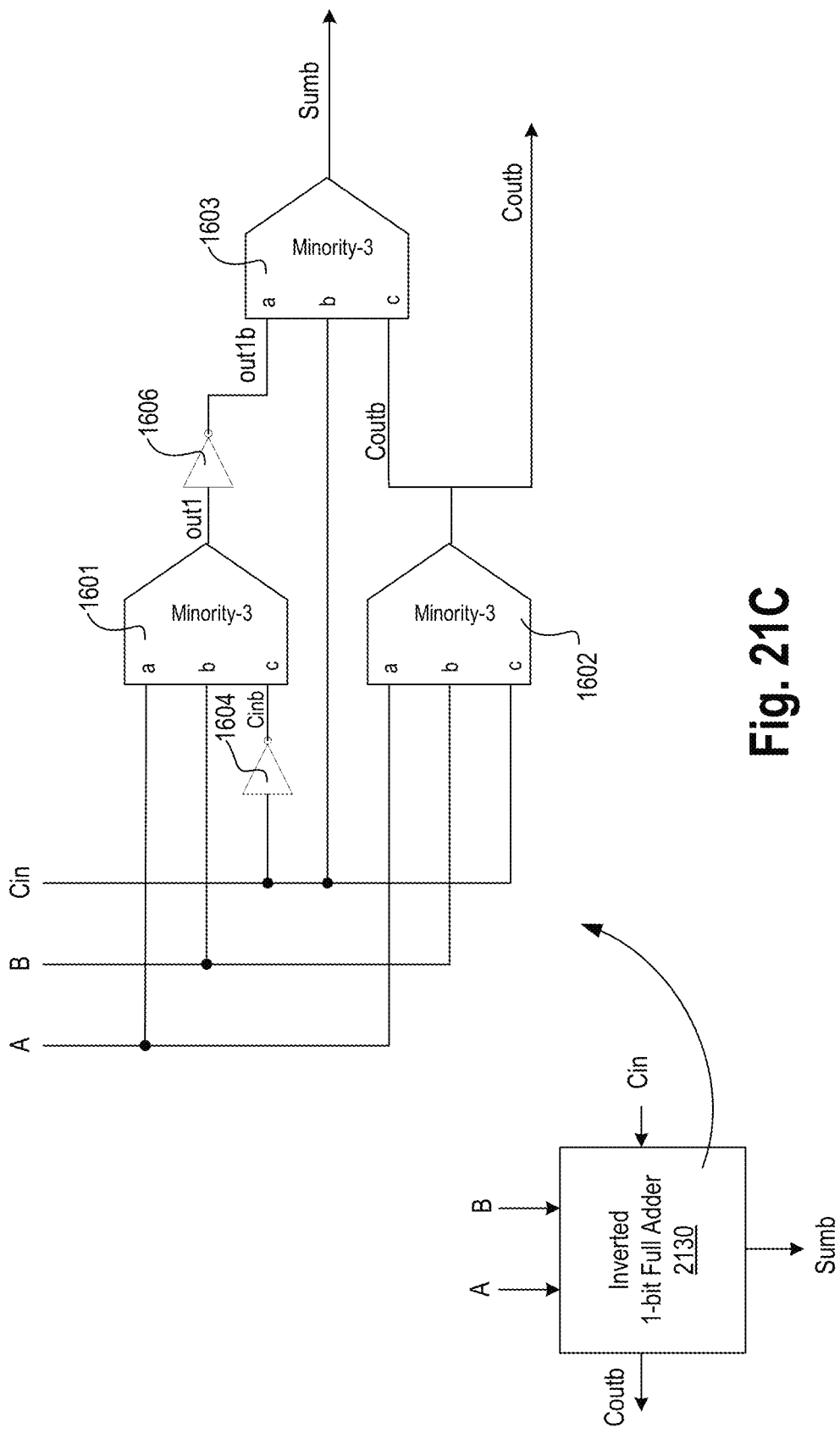
FIG. 21C illustrates a 1-bit inverted full adder, in accordance with some embodiments.

FIG. 21C illustrates 1-bit inverted full adder 2130, in accordance with some embodiments. 1-bit inverted full adder 2130 is like 1-bit full adder 1600 but without output inverters 1605 and 1607. As such, output of 1-bit inverted full adder 2130 is Sumb and Coutb.

Figure 22A:
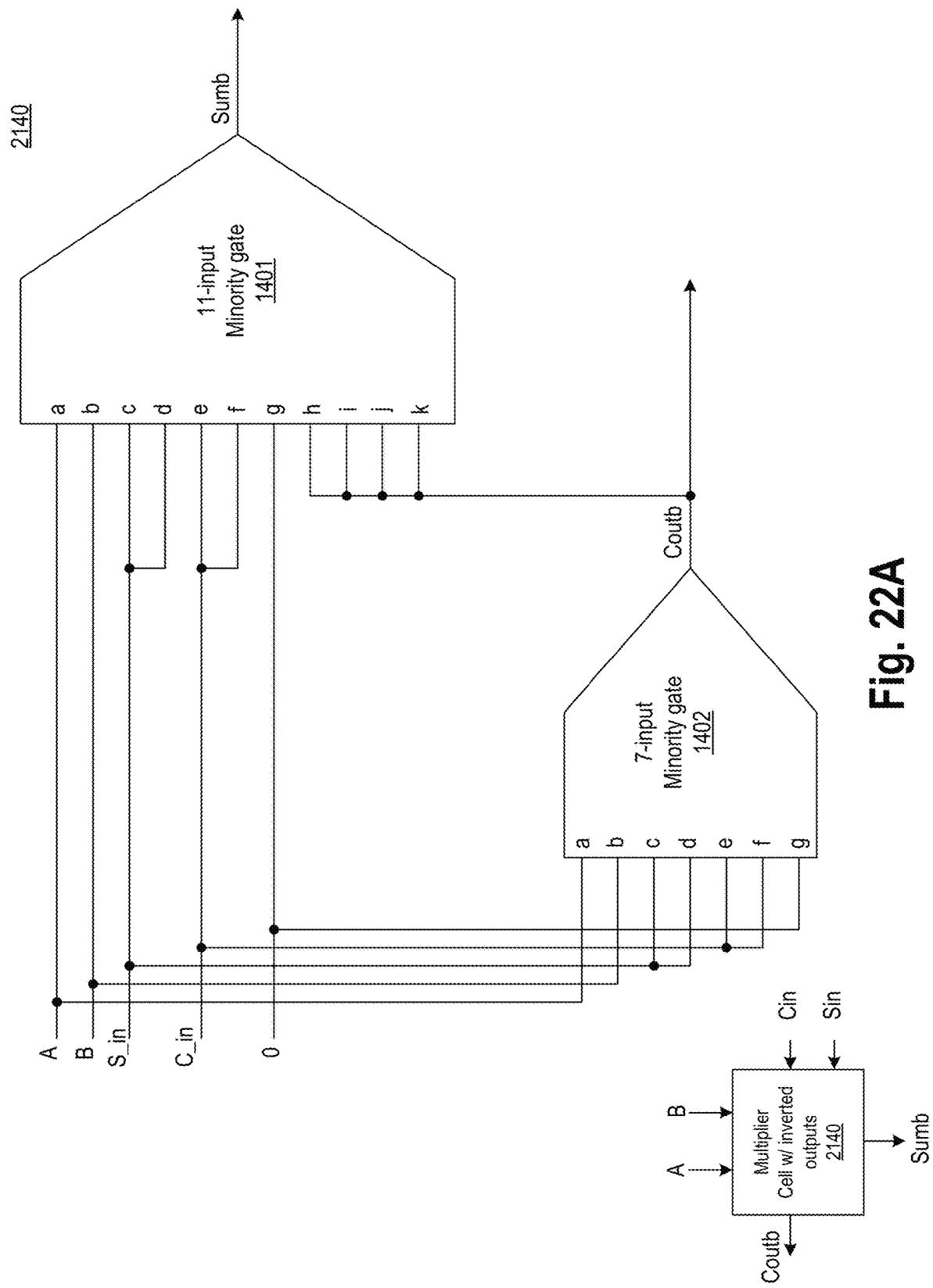
FIG. 22A illustrates a multiplier cell using wide-input minority gates and with inverted outputs, in accordance with some embodiments.

FIG. 22A illustrates multiplier 2140 cell using wide-input minority gates and with inverted outputs, in accordance with some embodiments. Multiplier cell 2140 is like multiplier cell 1400 but without output inverters 1403 and 1404. As such, output of multiplier cell 2130 is Sumb and Coutb. The functions of Sumb and Coutb can be expressed as:

Coutb=NOT(Majority((A AND B),S_in,C_in))

Sumb=NOT(XOR((A AND B),S_in,C_in))

In various embodiments, the input configuration of 7-input minority gate 1402 performs an integrated AND function of inputs A and B, and the result of this AND function is used in the majority function with other inputs S_in and C_in. The output of the majority function is inverted to generate Coutb. In various embodiments, the input configuration of 11-input minority gate 1401 performs an integrated AND function of inputs A and B, and then an exclusive-OR (XOR) function of the AND result, S_in, and C_in. The output of the exclusive OR is inverted to generate Sumb. By using a wide-input ferroelectric or paraelectric based inverted multiplier cell 1400 allows for shorter propagation delay because the depth of majority or minority gates is 2.

Figure 22B:
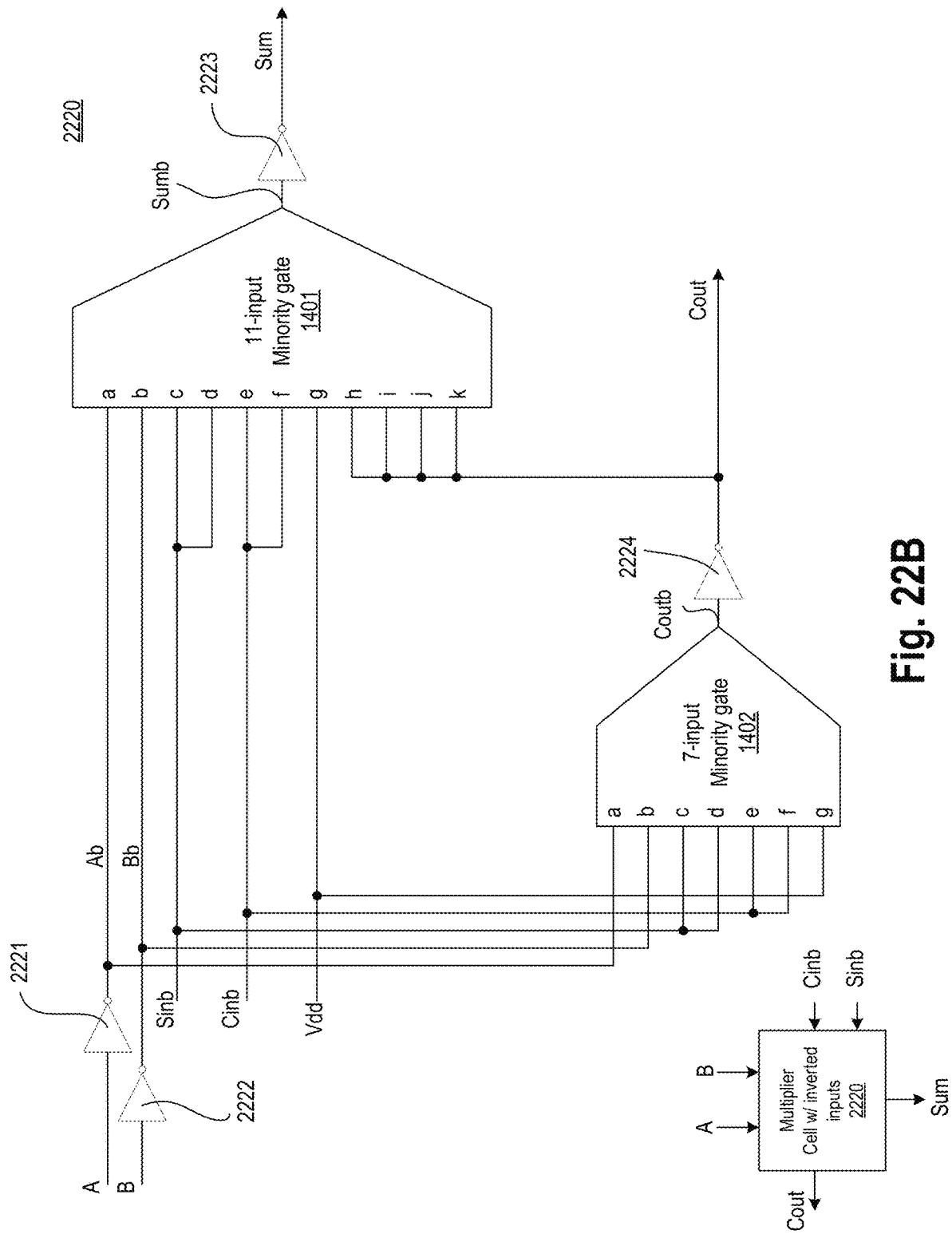
FIG. 22B illustrates a multiplier cell using wide-input minority gates and with inverted inputs, in accordance with some embodiments.

FIG. 22B illustrates multiplier cell 2200 using wide-input minority gates and with inverted inputs, in accordance with some embodiments. Multiplier cell 2200 comprises 11-input Minority gate 1401, 7-input minority gate 1402, inverter 2221, inverter 2222, and inverter 2224.

In some embodiments, input 'a' of 11-input minority gate 1401 receives inverted version of multiplier input A (i.e., Ab). Inverter 2221 inverts multiplier input A to Ab. In some embodiments, input 'b' of 11-input minority gate 1401 receives inverted version of multiplicand input B (i.e., Bb). In some embodiments, inverter 2222 inverts multiplicand input B to Bb. In some embodiments, input 'c' and input 'd' of 11-input minority gate 1401 receives inverted version of sum input S_in (i.e., Sinb). In some embodiments, input 'e' and input 'f' of 11-input minority gate 1401 receives inverted version of carry input C_in (i.e., Cinb). In some embodiments, input 'g' of 11-input minority gate 1401 receives a fixed voltage (e.g., Vdd, which is equal to a positive supply voltage). In some embodiments, input 'h', input 'i', input 'j', and input 'k' of 11-input minority gate 1401 receive carry output Cout generated by 7-input minority gate 1402 via inverter 2224. The output of 11-input minority gate 1401 is Sumb, which is inverted by inverter 2223 to generate Sum. In some embodiments, input 'a' of 7-input minority gate 1402 receives input Ab. In some embodiments, input 'b' of 7-input minority gate 1402 receives multiplicand input Bb. In some embodiments, input 'c' and input 'd' of 7-input minority gate 1402 receives inverted sum input Sinb. In some embodiments, input 'e' and input 'f' of 7-input minority gate 1402 receives inverted version of carry input Cin. In some embodiments, input 'g' is coupled to Vdd. The output of 7-input minority gate 1402 is Coutb which is inverted by inverter 2224, to generate Cout. Multiplier cell 2220 is a cell with inverted inputs Cinb and Sinb.

The functions of Sum and Cout can be expressed as:

Cout=(Majority((A AND B),NOT(Sinb),NOT(Cinb))

Sum=(XOR((A AND B),S_in,C_in))

In various embodiments, the input configuration of 7-input minority gate 1402 performs an integrated AND function of inputs A and B, and the result of this AND function is used in the majority function with other inputs NOT of Sinb and NOT of Cinb. The output of the majority function is Cout. In various embodiments, the input configuration of 11-input minority gate 1401 performs an integrated AND function of inputs A and B, and then an exclusive-OR (XOR) function of the AND result, NOT of Sinb, and NOT of Cinb. The output of the exclusive OR is inverted to generate Sum. By using a wide-input ferroelectric or paraelectric based inverted multiplier cell 1400 allows for shorter propagation delay because the depth of majority or minority gates is 2.

Figure 23C:
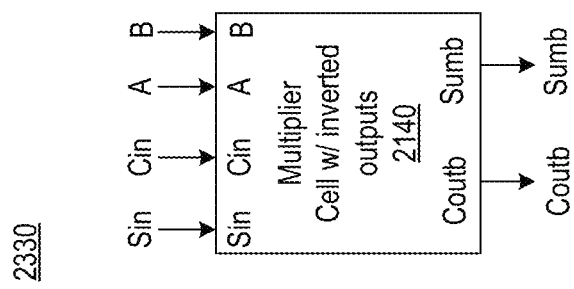
FIGS. 23A-C illustrate a 1-bit inverted full-adder coupled to AND gate for inputs, a 1-bit inverted full-adder coupled to NAND gate for inputs, and multiplier cell with inverted outputs, respectively, in accordance with some embodiments.
Figure 23B:
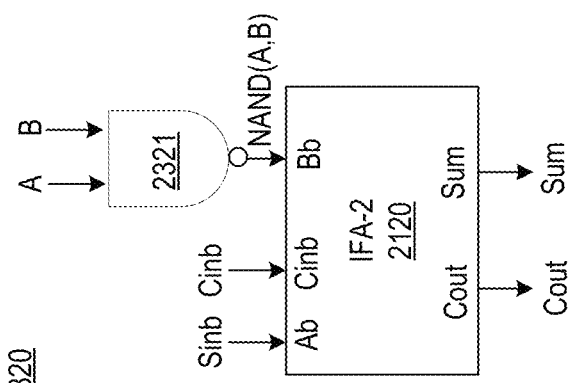
Figure 23A:
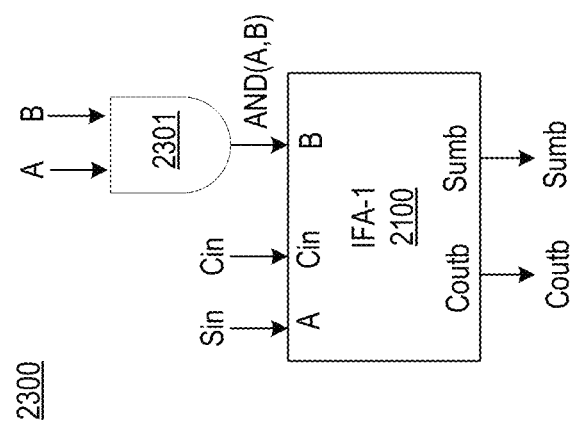

FIGS. 23A-C illustrate cell 2300 comprising 1-bit inverted full-adder 2100 coupled to AND gate 2301 for inputs A and B, cell 2320 comprising 1-bit inverted full-adder 2120 coupled to NAND gate 2321 for inputs A and B, and multiplier cell 2140 with inverted outputs Coutb and Sumb, respectively, in accordance with some embodiments. Cell 2300 is a type of multiplier cell with inverted outputs.

In some embodiments, there are opportunities that arise in bigger circuits such as adders and multipliers that are based on cells 2300, 2320, and 2330, where an optimize the overall number of inverters can be optimized (e.g., reduced). For example, IFA-1 2100 cell and IFA-2 2120 cell remove inverters from within the cells and allows circuits to work with either inverted inputs or outputs. In a multiplier circuit or an adder circuit, IFA-1 2100 cell and IFA-2 2120 cell can complement each other, where cell produces inverted outputs which go on to other cell as inverted inputs and thus reducing the overall number of inverters. This inverter optimization saves on area, power, and delay.

The basis of cells 2300 and 2320 is cell 200, but with either inverted outputs or inverted inputs. A carry save multiplier made from cells 2300 and 2320 can reduce the overall number of inverters, thus resulting in a smaller multiplier, in accordance with some embodiments. Cell 2330 is a symbolic view of cell 2140 of FIG. 23. In some embodiments, cell 2330 removes the inverters inside the cell from both the sum and carry paths and results in an inverted output. For the bigger circuits where the connectivity can be optimized to feed in inverted inputs, these cells (e.g., cell 2330) are helpful in reducing the overall total number of inverters inside those, such as bigger multipliers and adders.

FIGS. 24A-D illustrate cell 2400 with 1-bit inverted full-adder (IFA-1) 2100 coupled to two AND gates 2402 and 2301, cell 2420 with 1-bit inverted full-adder (IFA-2) 2120 coupled to two NAND gates 2422 and 2321, cell 2430 with inverted multiplier (IM-1) cell 2140 coupled to AND gate 2432, and cell 2440 with inverted multiplier cell (IM-2) 2220 coupled to NAND gate 2442, respectively, in accordance with some embodiments.

Creating these standard cells (e.g., 2400, 2420, 2430, 2440 cells) gives higher freedom to optimize a layout. Layout is a physical manifestation of a circuit. In a capacitive logic circuit, capacitors can be fabricated in a backend of a die and stacked on top of transistor layers (e.g., in the frontend of the die). In those scenarios, extra CMOS transistor gates such as NAND and/or AND combined with capacitor-based logic cells gives more flexibility for the placement of capacitors and transistors in the layout and allow for better optimization of area and parasitic capacitance. A carry save multiplier made from cells 2400, 2420, 2430, and/or 2440 can reduce the overall number of inverters, thus resulting in a smaller multiplier, in accordance with some embodiments.

Figure 25:
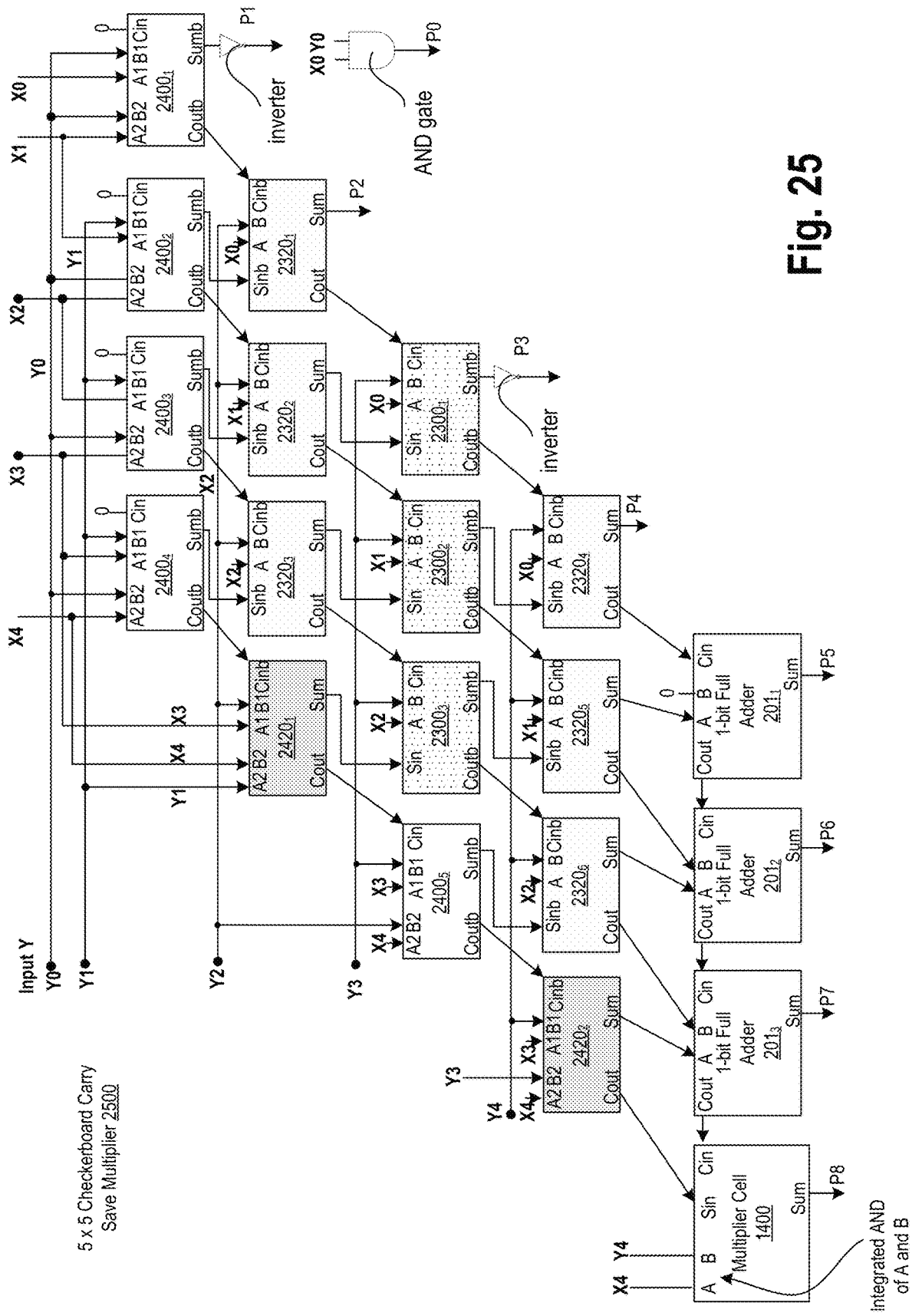
FIG. 25 illustrates a carry save multiplier with checkerboard pattern, in accordance with some embodiments.

FIG. 25 illustrates carry save multiplier 2500 with checkerboard pattern, in accordance with some embodiments. Carry save multiplier 2500 is a 5×5 array with checkerboard pattern. The inputs are X (e.g., X0 through X4) and Y (e.g., Y0 through Y4) which are multiplied to generate product bits P0 through P7. P0 bit is generated by a simple AND operation of X0 and Y0 inputs. The AND gate can be based on a minority gate of FIG. 4B, with one input tied to ground while the other inputs coupled to X0 and Y0. In some embodiments, the AND gate is a CMOS based implementation (e.g., a NAND gate followed by an inverter).

In some embodiments, the first row of the array includes cells $2400_1$ through $2400_4$ as described with reference to FIG. 24A. Cell 2400 comprises an inverted full adder (IFA-1) 2100 with two AND gates. The outputs of the AND gates are provided as inputs (multiplier and multiplicand) of IFA-1 cells 2100. The outputs of IFA-1 cell are inverted Cout and Sum (i.e., Coutb and Sumb, respectively). The carry-in input (Cin) is set to zero for the first row of cells 2400 because there is no carry output from a previous stage. Cells $2400_1$ through $2400_4$ receive inputs X0, X1, X2, and X4, and Y0 and Y1 as shown. The Sumb output of the first cell $2400_1$ is inverted to generate product bit P1. The outputs Coutb and Sumb of each cell 2400 are then used by cells of a next row (i.e., the second row).

The second row comprises cells 2320 (e.g., $2320_1$ through $2320_3$) and $2320_1$. The sum output of cell $2320_1$ is the second product bit P2. The Coutb output from cell $2400_1$ is received as Cinb of cell 23201. The Sumb output of cell 24002 is received as Sinb input of cell $2320_1$. Inputs A and B for cells 2320 are the X inputs (e.g., X0, X1, and X2) and Y2. The last cell in the second row is cell $2420_1$ which is repeated in an alternate fashion as a last cell in alternate rows.

The third row comprises cells 2300 (e.g., $2300_1$ through $2300_3$) and 2400 (e.g., $2400_5$). Each cell 2300 includes an IFA-2 cell and an AND gate to perform AND function on inputs A and B. The Cout of cell $2320_1$ is received as Cin of cell $2300_1$. The Sum of cell $2320_2$ is received as Sin of cell $2300_1$. Other connections are made as shown. The last cell in row three is cell $2300_5$ which is repeated in an alternate fashion as a last cell in alternate rows. In this example of a 5×5 array, cell 2300 is not repeated. However, for arrays larger than 5×5, the cell would be repeated as described. The Sumb output of the first cell $2300_1$ in the third row is inverted to generate product bit P3. The fourth row is a repeat of the second row and comprises cells 2320 (e.g., $2320_4$ through $2320_6$).

The cells in the fourth row are connected in a similar fashion as cells in the second row. The last row is a row of adder cells 201 (e.g., $201_1$ through $201_3$) and multiplier cell 1400. The carry-out from each adder cell is fed as a carry-in to the subsequent or next adder cell. The Sin input of multiplier cell 1400 receives the Cout of the last cell $2420_2$. Multiplier cell 1400 has an integrated AND as discussed with reference to FIG. 14. The Sum outputs of cells $201_1$ through $201_3$ and cell 1400 are product bits P5, P6, P7, and P8. As such, product bits P0 through P8 are generated using cells in a checkerboard fashion.

In the carry save multiplier architecture of FIG. 25, partial products which are the results of ANDing two input bits are continuously added through the connectivity with full adder and half adder cells or variants of those, in accordance with some embodiments. Each row of the cells feeds their outputs to the next row, where the sum output feeds into the cell in the same column and the carry output goes to the column left to the current one. Once all the partial products are added, the last row is row of adders, receiving its inputs from the upper row and summing those outputs while propagating the carry. While FIG. 25 illustrates a carry propagate adder, the last stage can be replaced with other fast adders which have lower depth, thereby minimizing the final delay.

The checkerboard type of structure of FIG. 25 saves the total number of inverters used in the circuit, thereby minimizing area, delay, and power. Inverted full-adder and inverted multiplier cells, which are made with fewer transistors, are connected such that the next cells can take inverted inputs. As such, the function of the circuit remains the same, but the total number of transistors is reduced. In some embodiments, similar pattern of cells can be used to connect multiple complementary cells to minimize the number of inverters.

Figure 26:
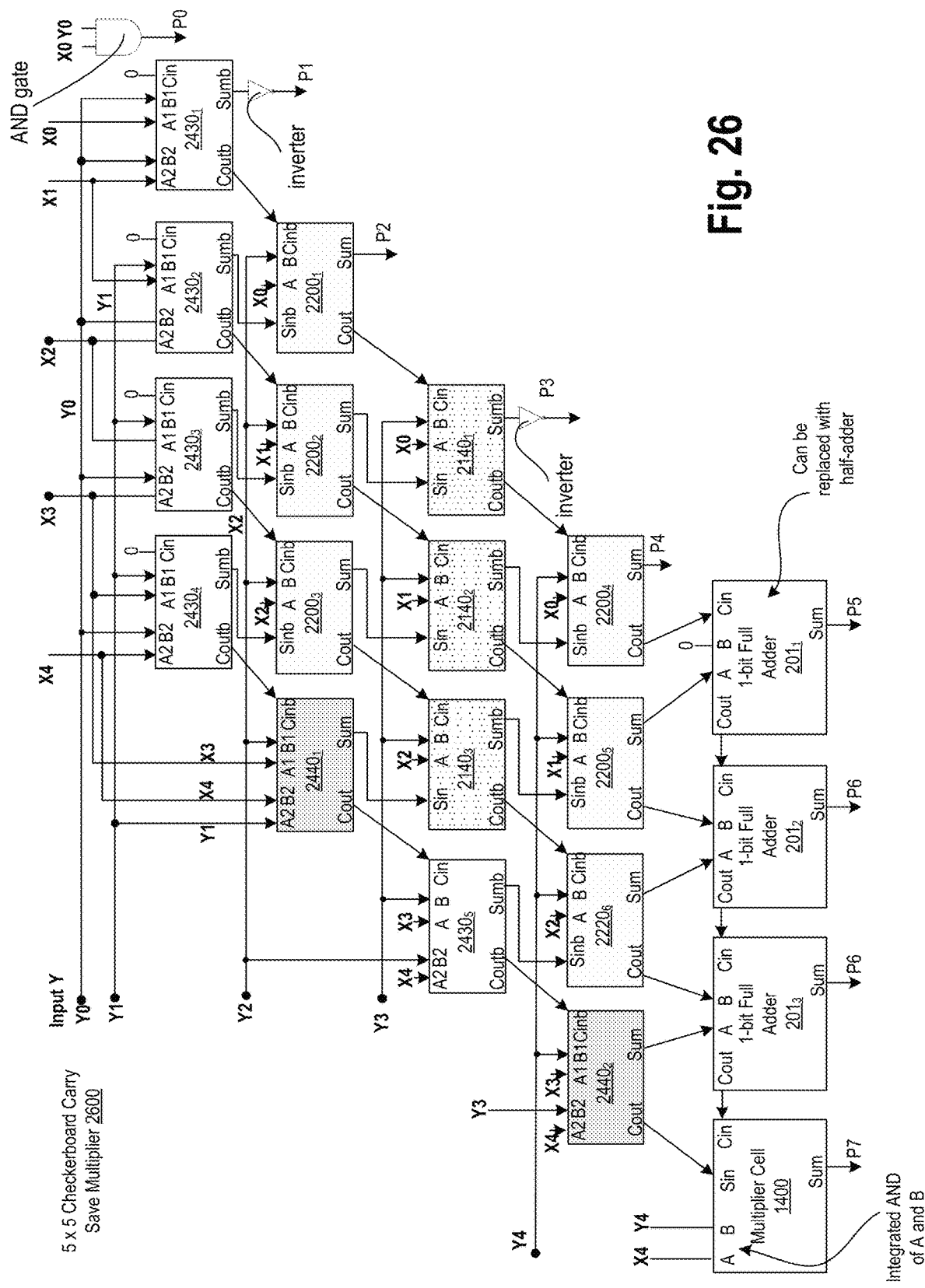
FIG. 26 illustrates a carry save multiplier with checkerboard pattern, in accordance with some embodiments.

FIG. 26 illustrates carry save multiplier 2600 with checkerboard pattern, in accordance with some embodiments. Carry save multiplier 2600 has a similar concept as carry save multiplier 2500 but uses inverted multiplier cells instead of inverted full adder cells. The inputs are X (e.g., X0 through X4) and Y (e.g., Y0 through Y4) which are multiplied to generate product bits P0 through P7. P0 bit is generated by a simple AND operation of X0 and Y0 inputs. The AND gate can be based on a minority gate of FIG. 4B, with one input tied to ground while the other inputs coupled to X0 and Y0. In some embodiments, the AND gate is a CMOS based implementation (e.g., a NAND gate followed by an inverter).

In some embodiments, the first row of the array includes cells 2430₁ through 2430₄ as described with reference to FIG. 24C. Cell 2430 comprises an inverted multiplier cell (IM-1) 2140 with one AND gate. The outputs of the AND gates are provided as Sin input of IM-1 cell 2130. The outputs of IM-1 cell 2140 (e.g., FIG. 22A) are inverted Cout and Sum (i.e., Coutb and Sumb, respectively). The carry-in input (Cin) is set to zero for the first row of cells 2430 because there is no carry output from a previous stage. Cells 2430₁ through 2430₄ receive inputs X0, X1, X2, and X4, and Y0 and Y1 as shown. The Sumb output of the first cell 2430₁ is inverted to generate product bit P1. The outputs Coutb and Sumb of each cell 2430 are then used by cells of a next row (i.e., the second row).

The second row comprises cells 2200 (e.g., 2200₁ through 2200₃) and 2440₁. The sum output of cell 2220₁ is the second product bit P2. The Coutb output from cell 2430₁ is received as Cinb of cell 2220₁. The Sumb output of cell 2430₂ is received as Sinb input of cell 2220₁. Inputs A and B for cells 2220 are the X inputs (e.g., X0, X1, and X2) and Y2. The last cell in the second row is cell 2440₁ which is repeated in an alternate fashion as a last cell in alternate rows.

The third row comprises cells 2140 (e.g., 2140₁ through 2140₃) and 2430 (e.g., 2430₅). Each cell 2140 (e.g., FIG. 22A) includes an IM-2 cell with an integrated AND gate and generated inverted Cout and Sum (e.g., Coutb and Sumb). The Cout of cell 2220₁ is received as Cin of cell 2140₁. The Sum of cell 2220₂ is received as Sin of cell 2140₁. Other connections are made as shown. The last cell in row three is cell 2430₅ which is repeated in an alternate fashion as a last cell in alternate rows. In this example of a 5×5 array, cell 2140 is not repeated. However, for arrays larger than 5×5, cell 2140 would be repeated as described. The Sumb output of the first cell 2140₁ in the third row is inverted to generate product bit P3. The fourth row is a repeat of the second row and comprises cells 2200 (e.g., 2200₄ through 2220₆).

The cells in the fourth row are connected in a similar fashion as cells in the second row. The last row is a row of adder cells 201 (e.g., 201₁ through 201₃) and multiplier cell 1400. The carry-out from each adder cell is fed as a carry-in to the subsequent or next adder cell. The Sin input of multiplier cell 1400 receives the Cout of the last cell 2440₂. Multiplier cell 1400 has an integrated AND as discussed with reference to FIG. 14. The Sum outputs of cells 201₁ through 201₃ and cell 1400 are product bits P5, P6, P7, and P8. As such, product bits P0 through P8 are generated using cells in a checkerboard fashion.

FIG. 26 like FIG. 25 also uses checkerboard structure to minimize the number of inverters by using complementary cells, one producing inverted outputs and others using the inverted inputs. Thereby, keeping the function intact, by removing redundant components. In some of these cells, an AND gate is combined with a full-adder cell and synthesized using a higher fan-in minority or majority gate. Minority gates can be broken down into an inverter and a majority gate and can be fabricated as needed depending upon the gate specs from a certain manufacturing process. Combining an AND gate with a full adder also gives the same opportunity to create cells with lesser number of inverters if the outputs or the inputs are allowed to be inverted signals. This design flexibility that uses complementary cells can be combined in a way to remove redundant inverters to save power, delay, and area, in accordance with some embodiments.

Figure 27:
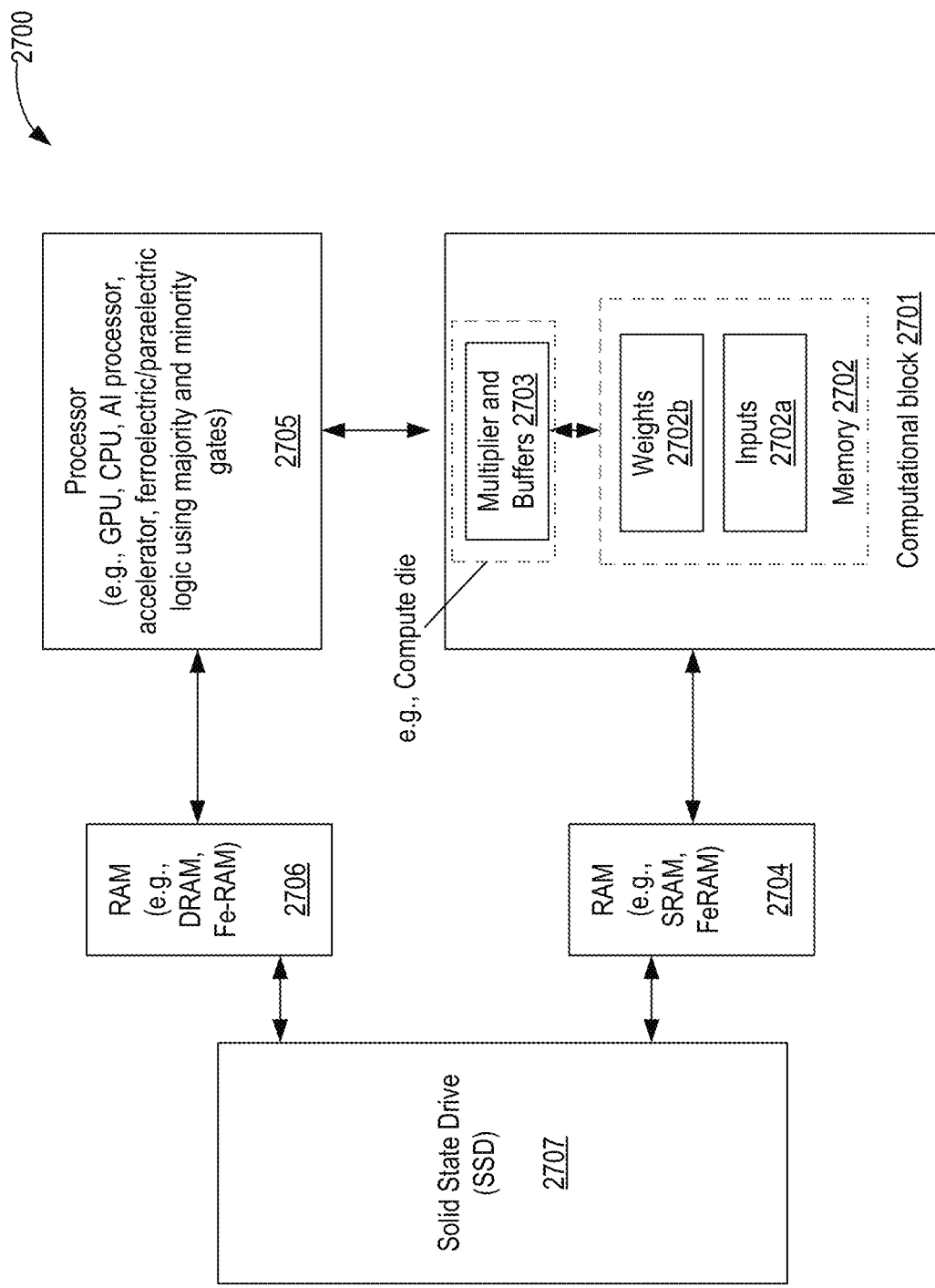
FIG. 27 illustrates a high-level architecture of an artificial intelligence (AI) machine comprising a compute die positioned on top of a memory die, wherein the compute die includes one or more multipliers in accordance with some embodiments.

FIG. 27 illustrates a high-level architecture of an artificial intelligence (AI) machine 2700 comprising a compute die positioned on top of a memory die, wherein the compute die includes one or more multipliers in accordance with some embodiments. Any of the blocks here can have the multiplier of various embodiments. AI machine 2700 comprises computational block 2701 or processor having random-access memory (RAM) 2702 and computational logic 2703; first random-access memory 2704 (e.g., static RAM (SRAM), ferroelectric or paraelectric RAM (FeRAM), ferroelectric or paraelectric static random-access memory (FeSRAM)), main processor 2705, second random-access memory 2706 (dynamic RAM (DRAM), FeRAM), and solid-state memory or drive (SSD) 2707. In some embodiments, some or all components of AI machine 2700 are packaged in a single package forming a system-on-chip (SoC). The SoC can be configured as a logic-on-logic configuration, which can be in a 3D configuration or a 2.5D configuration.

In some embodiments, computational block 2701 is packaged in a single package and then coupled to processor 2705 and memories 2704, 2706, and 2707 on a printed circuit board (PCB). In some embodiments, computational block 2701 is configured as a logic-on-logic configuration, which can be in a 3D configuration or a 2.5D configuration. In some embodiments, computational block 2701 comprises a special purpose compute die 2703 or microprocessor. For example, compute die 2703 is a compute chiplet that performs a function of an accelerator or inference. In some embodiments, memory 2702 is DRAM which forms a special memory/cache for the special purpose compute die 2703. The DRAM can be embedded DRAM (eDRAM) such as 1T-1C (one transistor and one capacitor) based memories. In some embodiments, RAM 2702 is ferroelectric or paraelectric RAM (Fe-RAM).

In some embodiments, compute die 2703 is specialized for applications such as Artificial Intelligence, graph processing, and algorithms for data processing. In some embodiments, compute die 2703 further has logic computational blocks, for example, for multipliers and buffers, a special data memory block (e.g., buffers) comprising DRAM, FeRAM, or a combination of them. In some embodiments, RAM 2702 has weights and inputs stored in-order to improve the computational efficiency. The interconnects between processor 2705 (also referred to as special purpose processor), first RAM 2704 and compute die 2703 are optimized for high bandwidth and low latency. The architecture of FIG. 27 allows efficient packaging to lower the energy, power, or cost and provides for ultra-high bandwidth between RAM 2702 and compute chiplet 2703 of computational 2701.

In some embodiments, RAM 2702 is partitioned to store input data (or data to be processed) 2702a and weight factors 2702b. In some embodiments, input data 2702a is stored in a separate memory (e.g., a separate memory die) and weight factors 2702b are stored in a separate memory (e.g., separate memory die).

In some embodiments, computational logic or compute chiplet 2703 comprises matrix multiplier, adder, concatenation logic, buffers, and combinational logic. In various embodiments, compute chiplet 2703 performs multiplication operation on inputs 2702a and weights 2702b. In some embodiments, weights 2702b are fixed weights. For example, processor 2705 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2702b. In various embodiments, the input data, that is to be analyzed using a trained model, is processed by computational block 2701 with computed weights 2702b to generate an output (e.g., a classification result).

In some embodiments, first RAM 2704 is ferroelectric or paraelectric based SRAM. For example, a six transistor (6T) SRAM bit-cells having ferroelectric or paraelectric transistors are used to implement a non-volatile FeSRAM. In some embodiments, SSD 2707 comprises NAND flash cells. In some embodiments, SSD 2707 comprises NOR flash cells. In some embodiments, SSD 2707 comprises multi-threshold NAND flash cells.

In various embodiments, the non-volatility of FeRAM is used to introduce new features such as security, functional safety, and faster reboot time of architecture 2700. The non-volatile FeRAM is a low power RAM that provides fast access to data and weights. FeRAM 2704 can also serve as a fast storage for inference die 2701 (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, or Zn. A' may have the same valency of site A, with a different ferroelectric polarizability.

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted BiFeO3, BrCrO3, BuCoO3 class of materials, La or rate earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $OsO_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, the FE material comprises one or more of: Hafnium (Hf), Zirconium (Zr), Aluminum (Al), Silicon (Si), their oxides or their alloyed oxides. In some embodiments, the FE material includes one or more of: Al(1-x)Sc(x)N, Ga(1-x)Sc(x)N, Al(1-x)Y(x)N or Al(1-x-y) Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, the FE material includes Bismuth ferrite (BFO), BFO with a doping material where in the doping material is one of Lanthanum, or any element from the lanthanide series of the periodic table. In some embodiments, FE material includes lead zirconium titanate (PZT), or PZT with a doping material, wherein the doping material is one of La, Nb. In some embodiments, the FE material includes a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, the FE material includes Hafnium oxides of the form, Hf1-x Ex Oy where E can be Al, Ca, Ce, Dy, er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, the FE material comprises organic material. For example, Polyvinylidene fluoride or polyvinylidene difluoride (PVDF).

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. In some embodiments, paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Figure 28:
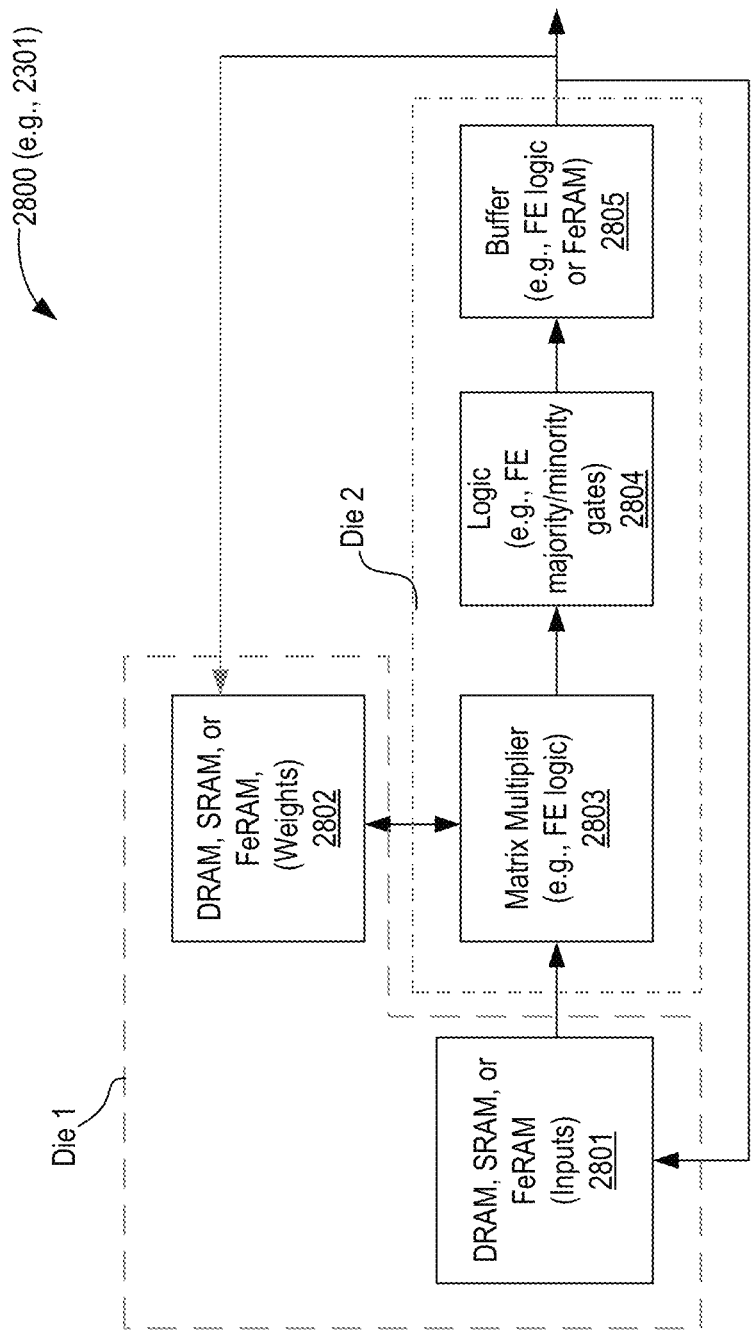
FIG. 28 illustrates an architecture of a computational block comprising a compute die positioned on top of a memory die, wherein the compute die includes one or more multipliers, in accordance with some embodiments.

FIG. 28 illustrates an architecture of a computational block 2400 comprising a compute die positioned on top of a memory die, wherein the compute die includes one or more multipliers, in accordance with some embodiments. Any of the blocks here can include the adder of various embodiments. The architecture of FIG. 28 illustrates an architecture for a special purpose compute die where RAM memory buffers for inputs and weights are split on die-1 and logic and optional memory buffers are split on die-2.

In some embodiments, memory die (e.g., Die 1) is positioned below compute die (e.g., Die 2) such that heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 2401 to store input data and a second die 2402 to store weight factors. In some embodiments, the memory die is a single die that is partitioned such that first partition 2401 of the memory die is used to store input data and second partition 2402 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 2401 and 2402, or memory dies 2401 and 2402 include one or more of: DRAM, FE-SRAM, FE-DRAM, SRAM, and/or MRAM. In some embodiments, the input data stored in memory partition or die 2401 is the data to be analyzed by a trained model with fixed weights stored in memory partition or die 2402.

In some embodiments, the compute die comprises ferroelectric or paraelectric logic (e.g., majority, minority, and/or threshold gates) to implement matrix multiplier 2403, logic 2404, and temporary buffer 2405. Matrix multiplier 2403 performs multiplication operation on input data 'X' and weights 'W' to generate an output 'Y'. This output may be further processed by logic 2404. In some embodiments, logic 2404 performs: a threshold operation, pooling and drop out operations, and/or concatenation operations to complete the AI logic primitive functions.

In some embodiments, the output of logic 2404 (e.g., processed output 'Y') is temporarily stored in buffer 2405. In some embodiments, buffer 2405 is memory such as one or more of: DRAM, Fe-SRAM, Fe-DRAM, MRAM, resistive RAM (Re-RAM) and/or SRAM. In some embodiments, buffer 2405 is part of the memory die (e.g., Die 1). In some embodiments, buffer 2405 performs the function of a retimer. In some embodiments, the output of buffer 2405 (e.g., processed output 'Y') is used to modify the weights in memory partition or die 2402. In one such embodiment, computational block 2400 not only operates as an inference circuitry, but also as a training circuitry to train a model. In some embodiments, matrix multiplier 2403 includes an array of multiplier cells, wherein the DRAMs 2401 and 2402 include arrays of memory bit-cells, respectively, wherein each multiplier cell is coupled to a corresponding memory bit-cell of DRAM 2401 and/or DRAM 2402. In some embodiments, computational block 2400 comprises an interconnect fabric coupled to the array of multiplier cells such that each multiplier cell is coupled to the interconnect fabric.

Architecture 2400 provides reduced memory accesses for the compute die (e.g., die 2) by providing data locality for weights, inputs, and outputs. In one example, data from and to the AI computational blocks (e.g., matrix multiplier 2403)

is locally processed within a same packaging unit. Architecture 2400 also segregates the memory and logic operations on to a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 29:
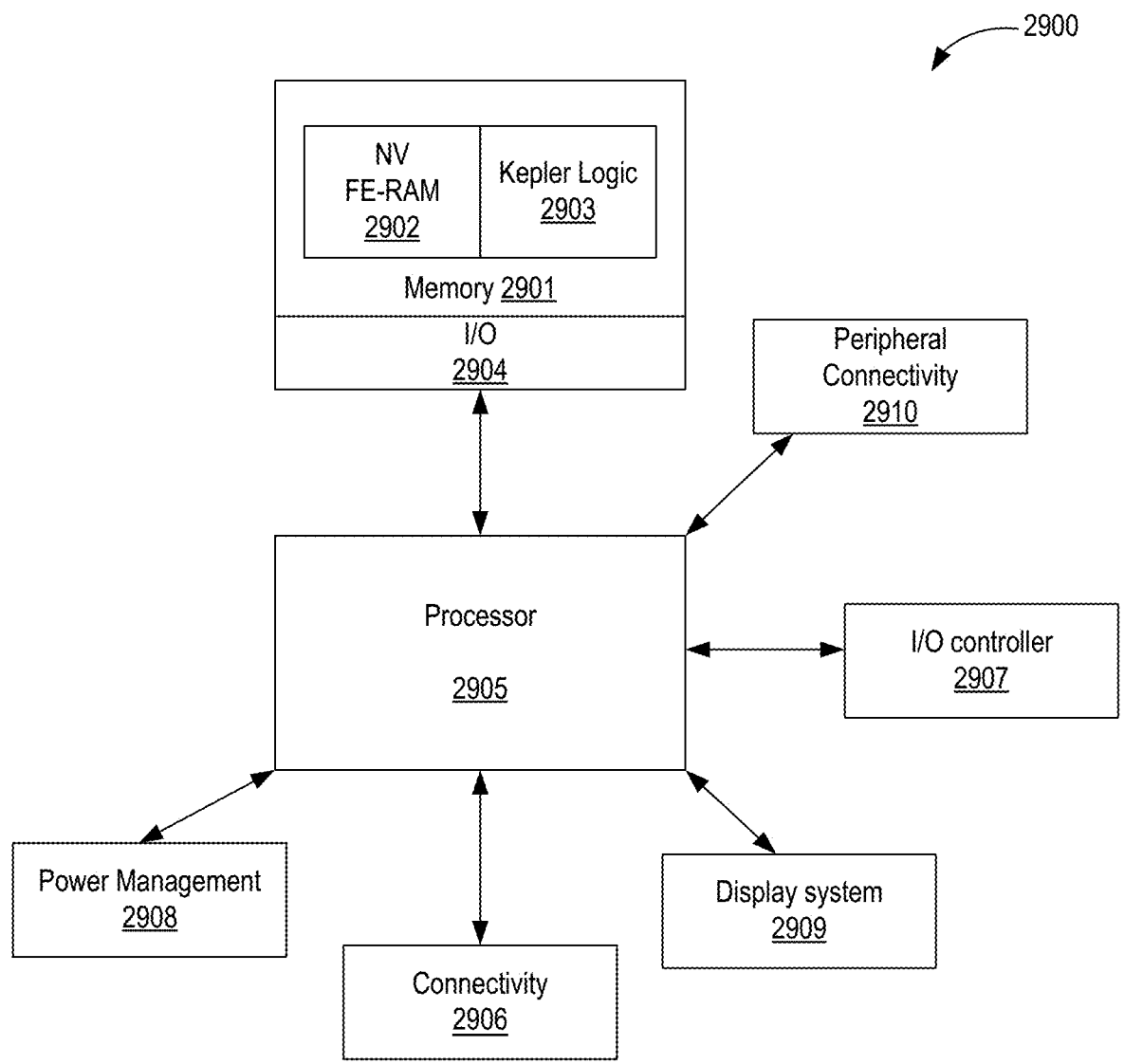
FIG. 29 illustrates a system-on-chip (SOC) that uses ferroelectric or paraelectric based multipliers, in accordance with some embodiments.

FIG. 29 illustrates a system-on-chip (SOC) 2900 that uses ferroelectric or paraelectric based multipliers, in accordance with some embodiments. Any of the blocks here can include the adder of various embodiments. System-on-chip (SoC) 2900 comprises memory 2901 having static random-access memory (SRAM) or FE based random-access memory FE-RAM, or any other suitable memory. The memory can be non-volatile (NV) or volatile memory. Memory 2901 may also comprise logic 2903 to control memory 2902. For example, write and read drivers are part of logic 2903. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 2904. The interface may be double-data rate (DDR) compliant interface or any other suitable interface to communicate with a processor. Processor 2905 of SoC 2900 can be a single core or multiple core processor. Processor 2905 can be a general-purpose processor (CPU), a digital signal processor (DSP), or an Application Specific Integrated Circuit (ASIC) processor. In some embodiments, processor 2905 is an artificial intelligence (AI) processor (e.g., a dedicated AI processor, a graphics processor configured as an AI processor). In various embodiments, processor 2905 executes instructions that are stored in memory 2901.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 2905 may be coupled to a number of other chip-lets that can be on the same die as SoC 2900 or on separate dies. These chip-lets include connectivity circuitry 2906, I/O controller 2907, power management 2908, and display system 2909, and peripheral connectivity 2906.

Connectivity 2906 represents hardware devices and software components for communicating with other devices. Connectivity 2906 may support various connectivity circuitries and standards. For example, connectivity 2906 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 2906 may support non-cellular standards such as WiFi.

I/O controller 2907 represents hardware devices and software components related to interaction with a user. I/O controller 2907 is operable to manage hardware that is part of an audio subsystem and/or display subsystem. For example, input through a microphone or other audio device can provide input or commands for one or more applications or functions of SoC 2900. In some embodiments, I/O controller 2907 illustrates a connection point for additional devices that connect to SoC 2900 through which a user might interact with the system. For example, devices that can be attached to the SoC 2900 might include microphone devices, speaker or stereo systems, video systems or other display devices, keyboard or keypad devices, or other I/O devices for use with specific applications such as card readers or other devices.

Power management 2908 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 2908 may accordingly put such logic into low power state without the worry of losing data. Power management may select a power state according to Advanced Configuration and Power Interface (ACPI) specification for one or all components of SoC 2900.

Display system 2909 represents hardware (e.g., display devices) and software (e.g., drivers) components that provide a visual and/or tactile display for a user to interact with the processor 2905. In some embodiments, display system 2909 includes a touch screen (or touch pad) device that provides both output and input to a user. Display system 2909 may include a display interface, which includes the particular screen or hardware device used to provide a display to a user. In some embodiments, the display interface includes logic separate from processor 2905 to perform at least some processing related to the display.

Peripheral connectivity 2910 may represent hardware devices and/or software devices for connecting to peripheral devices such as printers, chargers, cameras, etc. Peripheral connectivity 2910 say support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 2900 includes a coherent cache or memory-side buffer chiplet (not shown) which include ferroelectric or paraelectric memory. The coherent cache or memory-side buffer chiplet can be coupled to processor 2905 and/or memory 2901 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front." "back," "top." "bottom," "over," "under." and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method of forming those structures, and method of operation of these structures.

Following examples are provided that illustrate the various embodiments. The examples can be combined with other examples. As such, various embodiments can be combined with other embodiments without changing the scope of the invention.

Example 1: An apparatus comprising: an AND gate comprising a majority gate or a minority gate having non-linear polar material; and a 1-bit full adder comprising a majority gate or a minority gate coupled to the AND gate, wherein the 1-bit full adder comprises non-linear polar material.

Example 2: The apparatus of example 1, wherein the AND gate is to receive a multiplier and a multiplicand.

Example 3: The apparatus of example 2, wherein the AND gate comprises: a first capacitor to receive the multiplier, the first capacitor coupled to a node; a second capacitor to receive the multiplicand, the second capacitor coupled to the node; and a third capacitor coupled to a ground node, wherein the third capacitor is coupled to the node, wherein the first capacitor, the second capacitor, and the third capacitor include non-linear polar material.

Example 4: The apparatus of example 3 comprising: a driver circuitry having a capacitive input coupled to the node, and an output which is to provide a majority logic function of the multiplier, the multiplicand, and a voltage on the ground node.

Example 5: The apparatus of example 1, wherein the 1-bit full adder is to: receive a sum-in input as a first input; receive an output of the AND gate as a second input; receive a carry-in input as a third input; generate a carry-out output; and generate a sum output.

Example 6: The apparatus of example 5, wherein the 1-bit full adder comprises: a 3-input minority gate to receive the first input, the second input, and the third input, wherein the 3-input minority gate is to generate a first output which is a minority function of the first input, the second input, and the third input; and a 5-input majority gate to receive the first output, the first input, the second input, the third input, wherein the 5-input majority gate is to generate a second output which is majority function of two times the first output, the first input, the second input, the third input.

Example 7: The apparatus of example 6, wherein an inverted version of the first output is the carry-out output, wherein the second output is the sum output.

Example 8: The apparatus of example 6 comprises a buffer to drive the sum output.

Example 9: The apparatus of example 1, wherein the non-linear polar material includes one of: ferroelectric material, paraelectric material, or non-linear dielectric.

Example 10: The apparatus of example 9, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, or Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 11: The apparatus of example 9, wherein the paraelectric material includes: SrTiO3, Ba(x)Sr(y)TiO3

(where x is −0.05, and y is 0.95), HfZrO2, Hf—Si—O, La-substituted PbTiO3, or PMN-PT based relaxor ferroelectrics.

Example 12: An apparatus comprising: a first input to receive weights including an individual weight; a second input to receive inputs including an individual input; and a matrix multiplier coupled to the first input and the second input, wherein the matrix multiplier includes an array of multiplier cells, wherein an individual multiplier cell of the array of multiplier cells includes: an AND gate comprising a majority gate or a minority gate having non-linear polar material, wherein the AND gate is to receive the individual weight and the individual input; and a 1-bit full adder comprising a majority gate or a minority gate coupled to the AND gate, wherein the 1-bit full adder comprises non-linear polar material.

Example 13: The apparatus of example 12, wherein the AND gate comprises: a first capacitor to receive the individual weight, the first capacitor coupled to a node; a second capacitor to receive the individual input, the second capacitor coupled to the node; and a third capacitor coupled to a ground node, wherein the third capacitor is coupled to the node, wherein the first capacitor, the second capacitor, and the third capacitor include the non-linear polar material.

Example 14: The apparatus of example 13 comprising: a driver circuitry having a capacitive input coupled to the node, and an output which is to provide a majority logic function of the individual weight, the individual input, and a voltage on the ground node.

Example 15: The apparatus of example 12, wherein the 1-bit full adder is to: receive a sum-in input as a first input; receive an output of the AND gate as a second input; receive a carry-in input as a third input; generate a carry-out output; and generate a sum output.

Example 16: The apparatus of example 15, wherein the 1-bit full adder comprises: a 3-input minority gate to receive the first input, the second input, and the third input, wherein the 3-input minority gate is to generate a first output which is a minority function of the first input, the second input, and the third input; and a 5-input majority gate to receive the first output, the first input, the second input, the third input, wherein the 5-input majority gate is to generate a second output which is majority function of two times the first output, the first input, the second input, the third input.

Example 17: The apparatus of example 12, wherein the non-linear polar material includes one of: ferroelectric material, paraelectric material, or non-linear dielectric.

Example 18: A system comprising: a processor circuitry to execute one or more instructions; a communication interface communicatively coupled to the processor circuitry; and a memory coupled to the processor circuitry, wherein the processor circuitry comprises a multiplier circuitry which includes: an AND gate comprising a majority gate or a minority gate having non-linear polar material; and a 1-bit full adder comprising a majority gate or a minority gate coupled to the AND gate, wherein the 1-bit full adder comprises non-linear polar material.

Example 19: The system of example 18, wherein the AND gate is to receive a multiplier and a multiplicand.

Example 20: The system of example 19, wherein the AND gate comprises: a first capacitor to receive the multiplier, the first capacitor coupled to a node; a second capacitor to receive the multiplicand, the second capacitor coupled to the node; and a third capacitor coupled to a ground node, wherein the third capacitor is coupled to the node, wherein the first capacitor, the second capacitor, and the third capacitor include non-linear polar material.

Example 21: The system of example 20 comprising: a driver circuitry having a capacitive input coupled to the node, and an output which is to provide a majority logic function of the multiplier, the multiplicand, and a voltage on the ground node.

Example 1a: An apparatus comprising: an AND gate comprising a majority gate or a minority gate having non-linear polar material; a buffer coupled to an output of the AND gate; and a 1-bit full adder comprising a majority gate or a minority gate coupled to the buffer, wherein the 1-bit full adder comprises non-linear polar material.

Example 2a: The apparatus of example 1a, wherein the 1-bit full adder is to: receive a sum-in input as a first input; receive a first output of the buffer as a second input; receive a carry-in input as a third input; generate a carry-out output; and generate a sum output.

Example 3a: The apparatus of example 2a, wherein the 1-bit full adder comprises: a 3-input majority gate to receive the first input, the second input, and the third input, wherein the 3-input majority gate is to generate a second output which is a majority function of the first input, the second input, and the third input; a first inverter coupled to the second output; a second inverter coupled to a third output of the first inverter, wherein a fourth output of the second inverter is to provide the carry-out output; and a 5-input majority gate to receive the third output, the first input, the second input, the third input, wherein the 5-input majority gate is to generate a fifth output which is majority function of two times the third output, and one times the first input, the second input, and the third input.

Example 4a: The apparatus of example 3a, wherein the buffer is a first buffer, wherein the apparatus comprises a second buffer coupled to the fifth output, wherein the buffer is to generate a sixth output which is to drive the sum output.

Example 5a: The apparatus of example 4a, wherein the first buffer is a first CMOS buffer, wherein the first inverter is a first CMOS inverter, wherein the second inverter is a second CMOS inverter, and wherein the second buffer is a second CMOS buffer.

Example 6a: The apparatus of example 3a, wherein the AND gate is to receive a multiplier and a multiplicand.

Example 7a: The apparatus of example 6a, wherein the AND gate comprises: a first capacitor to receive the multiplier, the first capacitor coupled to a node, wherein the node is coupled to the buffer; a second capacitor to receive the multiplicand, the second capacitor coupled to the node; and a third capacitor coupled to a ground node, wherein the third capacitor is coupled to the node, wherein the first capacitor, the second capacitor, and the third capacitor include non-linear polar material.

Example 8a: The apparatus of example 7a, wherein the first capacitor, the second capacitor, and the third capacitor have equal capacitances, wherein the 3-input majority gate includes three capacitors, wherein the 5-input majority gate includes five capacitors, wherein an individual capacitor of the three capacitors of the 3-input majority gate and wherein an individual capacitor of the five capacitors of the 5-input majority gate have a same capacitance as one of the first capacitor, the second capacitor, or the third capacitor.

Example 9a: The apparatus of example 1a, wherein the non-linear polar material includes one of: ferroelectric material, paraelectric material, or non-linear dielectric.

Example 10a: The apparatus of example 9a, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La or Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 11a: The apparatus of example 9a, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 12a: An apparatus comprising: an AND gate comprising a majority gate or a minority gate having non-linear polar material, wherein the AND gate comprises a first capacitor, a second capacitor, and a third capacitor, wherein the first capacitor, the second capacitor, and the third capacitor have equal capacitances which is a first capacitance; and a 1-bit full adder comprising a majority gate or a minority gate coupled to the AND gate, wherein the 1-bit full adder comprises non-linear polar material, wherein the 1-bit full adder comprises eight capacitors, wherein an individual capacitor of the eight capacitors has a second capacitance, wherein the first capacitance is larger than the second capacitance.

Example 13a: The apparatus of example 12a, wherein the 1-bit full adder is to: receive a sum-in input as a first input; receive a first output of the AND gate as a second input; receive a carry-in input as a third input; generate a carry-out output; and generate a sum output.

Example 14a: The apparatus of example 13a, wherein the 1-bit full adder comprises: a 3-input majority gate to receive the first input, the second input, and the third input, wherein the 3-input majority gate is to generate a second output which is a majority function of the first input, the second input, and the third input; a first inverter coupled to the second output; a second inverter coupled to a third output of the first inverter, wherein a fourth output of the second inverter is to provide the carry-out output; and a 5-input majority gate to receive the third output, the first input, the second input, the third input, wherein the 5-input majority gate is to generate a fifth output which is majority function of two times the third output, and one times the first input, the second input, and the third input.

Example 15a: The apparatus of example 14a, comprises a buffer coupled to the fifth output, wherein the buffer is to generate a sixth output which is to drive the sum output.

Example 16a: The apparatus of example 15a, wherein the first inverter is a first CMOS inverter, wherein the second inverter is a second CMOS inverter, and wherein the buffer is a CMOS buffer.

Example 17a: An apparatus comprising: a first input to receive weights including an individual weight; a second input to receive inputs including an individual input; and a matrix multiplier coupled to the first input and the second input, wherein the matrix multiplier includes an array of multiplier cells, wherein an individual multiplier cell of the array of multiplier cells includes: an AND gate comprising a majority gate or a minority gate having non-linear polar material; a buffer coupled to an output of the AND gate; and a 1-bit full adder comprising a majority gate or a minority gate coupled to the buffer, wherein the 1-bit full adder comprises non-linear polar material.

Example 18a: The apparatus of example 17a, wherein the AND gate comprises: a first capacitor to receive the individual weight, the first capacitor coupled to a node; a second capacitor to receive the individual input, the second capacitor coupled to the node; and a third capacitor coupled to a ground node, wherein the third capacitor is coupled to the node, wherein the first capacitor, the second capacitor, and the third capacitor include the non-linear polar material.

Example 19a: The apparatus of example 17a, wherein the 1-bit full adder is to: receive a sum-in input as a third input; receive an output of the AND gate as a fourth input; receive a carry-in input as a fifth input; generate a carry-out output; and generate a sum output.

Example 20a: The apparatus of example 19a, wherein the 1-bit full adder comprises: a 3-input majority gate to receive the third input, the fourth input, and the fifth input, wherein the 3-input majority gate is to generate a second output which is a majority function of the third input, the fourth input, and the fifth input; a first inverter coupled to the second output; a second inverter coupled to a third output of the first inverter, wherein a fourth output of the second inverter is to provide the carry-out output; and a 5-input majority gate to receive the third output, the third input, the fourth input, the fifth input, wherein the 5-input majority gate is to generate a fifth output which is majority function of two times the third output, and one times the first input, the second input, and the third input.

Example 1b: An apparatus comprising: a first minority gate with eleven inputs, wherein at least four inputs of the first minority gate share a first common node; and a second minority gate with seven inputs, wherein the second minority gate is coupled to the first minority gate, wherein the second minority gate includes at least two inputs that share a second common node.

Example 2b: The apparatus of example 1, wherein the eleven inputs of the first minority gate include: a first input coupled to a multiplier input; a second input coupled to a multiplicand input; a third input coupled to a sum input; a fourth input coupled to the sum input; a fifth input coupled to a carry input; a sixth input coupled to the carry input; a seventh input coupled to ground; an eighth input coupled to an output of the second minority gate; a ninth input coupled to the output of the second minority gate; a tenth input coupled to the output of the second minority gate; and an eleventh input coupled to the output of the second minority gate, wherein the output of the second minority gate is coupled to the first common node.

Example 3b: The apparatus of example 2, wherein the seven inputs of the second minority gate include: a twelfth input coupled to the multiplier input; a thirteenth input coupled to the multiplicand input; a fourteenth input coupled to the sum input; a fifteenth input coupled to the sum input, wherein the sum input is coupled to the second common node; a sixteenth input coupled to the carry input; a seventeenth input coupled to the carry input; and an eighteenth input coupled to the ground.

Example 4b: The apparatus of example 2 comprising a first inverter coupled to an output of the first minority gate, wherein an output of the first inverter is a sum output.

Example 5b: The apparatus of example 4, wherein the output of the first inverter is an exclusive-OR function of: a first AND operation of the multiplier input and the multiplicand input; the sum input; and the carry input.

Example 6b: The apparatus of example 3 comprising a second inverter coupled to an output of the second minority gate, wherein an output of second inverter is a carry output.

Example 7b: The apparatus of example 6, wherein the output of the second inverter is a majority function of: a second AND operation of the multiplier input and the multiplicand input; the sum input; and the carry input.

Example 8b: The apparatus of example 2, wherein the first minority gate comprises: a first capacitor to receive the multiplier input, the first capacitor coupled to a node; a second capacitor to receive the multiplicand input, the second capacitor coupled to the node; a third capacitor coupled to the sum input, wherein the third capacitor is coupled to the node; a fourth capacitor coupled to the sum input, wherein the fourth capacitor is coupled to the node; a fifth capacitor coupled to the carry input, wherein the fifth capacitor is coupled to the node; a sixth capacitor coupled to the carry input, wherein the sixth capacitor is coupled to the node; a seventh capacitor coupled to the ground, wherein the seventh capacitor is coupled to the node; an eighth capacitor coupled to the output of the second minority gate, wherein the eighth capacitor is coupled to the node; an ninth capacitor coupled to the output of the second minority gate, wherein the ninth capacitor is coupled to the node; a tenth capacitor coupled to the output of the second minority gate, wherein the tenth capacitor is coupled to the node; and an eleventh capacitor coupled to the output of the second minority gate, wherein the eleventh capacitor is coupled to the node, wherein the first capacitor, the second capacitor, the third capacitor, the fourth capacitor, the fifth capacitor, the sixth capacitor, the seventh capacitor, the eighth capacitor, the ninth capacitor, the tenth capacitor, and the eleventh capacitor include non-linear polar material.

Example 9b: The apparatus of example 8 comprises a third inverter coupled to the node.

Example 10b: The apparatus of example 3, wherein the second minority gate includes: a twelfth capacitor coupled to the multiplier input, wherein the twelfth capacitor is coupled to a second node; a thirteenth capacitor coupled to the multiplicand input, wherein the thirteenth capacitor is coupled to the second node; a fourteenth capacitor coupled to the sum input, wherein the fourteenth capacitor is coupled to the second node; a fifteenth capacitor coupled to the sum input, wherein the fifteenth capacitor is coupled to the second node; a sixteenth capacitor coupled to the carry input, wherein the sixteenth capacitor is coupled to the second node; a seventeenth capacitor coupled to the carry input, wherein the seventeenth capacitor is coupled to the second node; and an eighteenth capacitor coupled to the ground, wherein the eighteenth capacitor is coupled to the second node, wherein the twelfth capacitor, the thirteenth capacitor, the fourteenth capacitor, the fifteenth capacitor, the sixteenth capacitor, the seventeenth capacitor, and the eighteenth capacitor comprise non-linear polar material.

Example 11b: The apparatus of example 10 comprises a fourth inverter coupled to the second node.

Example 12b: The apparatus of example 8, wherein the non-linear polar material includes one of: ferroelectric material, paraelectric material, or non-linear dielectric.

Example 13b: The apparatus of example 12, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La or Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 14b: The apparatus of example 12, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 15b: An apparatus comprising: a first input to receive weights including an individual weight; a second input to receive inputs including an individual input; and a matrix multiplier coupled to the first input and the second input, wherein the matrix multiplier includes an array of multiplier cells, wherein an individual multiplier cell of the array of multiplier cells includes: a first minority gate with eleven inputs, wherein the eleven inputs include the individual weight; and a second minority gate with seven inputs, wherein the seven inputs include the individual input, wherein the second minority gate is coupled to the first minority gate.

Example 16b: The apparatus of example 15b, wherein the eleven inputs of the first minority gate include: a first input coupled to the individual weight; a second input coupled to the individual input; a third input coupled to a sum input; a fourth input coupled to the sum input; a fifth input coupled to a carry input; a sixth input coupled to the carry input; a seventh input coupled to ground; an eighth input coupled to an output of the second minority gate; a ninth input coupled to the output of the second minority gate; a tenth input coupled to the output of the second minority gate; and an eleventh input coupled to the output of the second minority gate.

Example 17b: The apparatus of example 16b, wherein the seven inputs of the second minority gate include: a twelfth input coupled to the individual weight; a thirteenth input coupled to the individual input; a fourteenth input coupled to the sum input; a fifteenth input coupled to the sum input; a sixteenth input coupled to the carry input; a seventeenth input coupled to the carry input; and an eighteenth input coupled to the ground.

Example 18b: A system comprising: a processor circuitry to execute one or more instructions; a memory coupled to the processor circuitry, wherein the memory is to store the one or more instructions; and a communication interface to allow the processor circuitry to communicate with another device, wherein the processor circuitry includes a multiplier which comprises: a first minority gate with eleven inputs; and a second minority gate with seven inputs, wherein the second minority gate is coupled to the first minority gate.

Example 19b: The system of example 18b comprising a first inverter coupled to an output of the first minority gate, wherein an output of the first inverter is a sum output, wherein the output of the first inverter is an exclusive-OR function of: a first AND operation of a multiplier input and a multiplicand input; a sum input; and a carry input.

Example 20b: The system of example 19b comprising a second inverter coupled to an output of the second minority gate, wherein an output of second inverter is a carry output, wherein the output of the second inverter is a majority function of: a second AND operation of the multiplier input and the multiplicand input; the sum input; and the carry input.

Example 1c: An apparatus comprising: a first minority gate with eleven inputs; and a second minority gate with seven inputs, wherein the second minority gate is coupled to the first minority gate, wherein the first minority gate and the second minority gate receive an inverted version of a carry input and an inverted version of a sum input.

Example 2c: The apparatus of example 1c, wherein the eleven inputs of the first minority gate include: a first input coupled to an inverted version of a multiplier input; a second input coupled to an inverted version of a multiplicand input; a third input coupled to the inverted version of the sum input; a fourth input coupled to the inverted version of the sum input; a fifth input coupled to the inverted version of the carry input; a sixth input coupled to the inverted version of the carry input; a seventh input coupled to a supply node; an eighth input coupled to an inverted output of the second minority gate; a ninth input coupled to the inverted output of the second minority gate; a tenth input coupled to the inverted output of the second minority gate; and an eleventh input coupled to the inverted output of the second minority gate.

Example 3c: The apparatus of example 2c, wherein the seven inputs of the second minority gate include: a twelfth input coupled to the inverted version of the multiplier input; a thirteenth input coupled to the inverted version of the multiplicand input; a fourteenth input coupled to the inverted version of the sum input; a fifteenth input coupled to the inverted version of the sum input; a sixteenth input coupled to the inverted version of the carry input; a seventeenth input coupled to the inverted version of the carry input; and an eighteenth input coupled to the supply node.

Example 4c: The apparatus of example 2c comprising a first inverter coupled to an output of the first minority gate, wherein an output of the first inverter is a sum output.

Example 5c: The apparatus of example 4c, wherein the output of the first inverter is an exclusive-OR function of: a first AND operation of the multiplier input and the multiplicand input; the sum input; and the carry input.

Example 6c: The apparatus of example 3c comprising a second inverter coupled to an output of the second minority gate, wherein an output of second inverter is a carry output.

Example 7c: The apparatus of example 6c, wherein the output of the second inverter is a majority function of: a second AND operation of the multiplier input and the multiplicand input; the sum input; and the carry input.

Example 8c: The apparatus of example 2c, wherein the first minority gate comprises: a first capacitor to receive the inverted version of the multiplier input, the first capacitor coupled to a node; a second capacitor to receive the inverted version of the multiplicand input, the second capacitor coupled to the node; a third capacitor coupled to the inverted version of the sum input, wherein the third capacitor is coupled to the node; a fourth capacitor coupled to the inverted version of the sum input, wherein the fourth capacitor is coupled to the node; a fifth capacitor coupled to the inverted version of the carry input, wherein the fifth capacitor is coupled to the node; a sixth capacitor coupled to the inverted version of the carry input, wherein the sixth capacitor is coupled to the node; a seventh capacitor coupled to the supply node, wherein the seventh capacitor is coupled to the node; an eighth capacitor coupled to the inverted output of the second minority gate, wherein the eighth capacitor is coupled to the node; a ninth capacitor coupled to the inverted output of the second minority gate, wherein the ninth capacitor is coupled to the node; a tenth capacitor coupled to the inverted output of the second minority gate, wherein the tenth capacitor is coupled to the node; and an eleventh capacitor coupled to the inverted output of the second minority gate, wherein the eleventh capacitor is coupled to the node, wherein the first capacitor, the second capacitor, the third capacitor, the fourth capacitor, the fifth capacitor, the sixth capacitor, the seventh capacitor, the eighth capacitor, the ninth capacitor, the tenth capacitor, and the eleventh capacitor include non-linear polar material.

Example 9c: The apparatus of example 8c comprises a third inverter coupled to the node.

Example 10c: The apparatus of example 3c, wherein the second minority gate includes: a twelfth capacitor coupled to the inverted version of the multiplier input, wherein the twelfth capacitor is coupled to a second node; a thirteenth capacitor coupled to the inverted version of the multiplicand input, wherein the thirteenth capacitor is coupled to the second node; a fourteenth capacitor coupled to the inverted version of the sum input, wherein the fourteenth capacitor is coupled to the second node; a fifteenth capacitor coupled to the inverted version of the sum input, wherein the fifteenth capacitor is coupled to the second node; a sixteenth capacitor coupled to the inverted version of the carry input, wherein the sixteenth capacitor is coupled to the second node; a seventeenth capacitor coupled to the inverted version of the carry input, wherein the seventeenth capacitor is coupled to the second node; and an eighteenth capacitor coupled to the supply node, wherein the eighteenth capacitor is coupled to the second node, wherein the twelfth capacitor, the thirteenth capacitor, the fourteenth capacitor, the fifteenth capacitor, the sixteenth capacitor, the seventeenth capacitor, and the eighteenth capacitor comprise non-linear polar material.

Example 11c: The apparatus of example 10c comprises a fourth inverter coupled to the second node.

Example 12c: The apparatus of example 8c, wherein the non-linear polar material includes one of: ferroelectric material, paraelectric material, or non-linear dielectric.

Example 13c: The apparatus of example 12c, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La or Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: $BaTiO3$, $PbTiO3$, $KNbO3$, or $NaTaO3$; hexagonal ferroelectric includes one of: $YMnO3$, or $LuFeO3$; hexagonal ferroelectrics of a type h-$RMnO3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds $LiNbO3$, $LiTaO3$, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 14c: The apparatus of example 12c, wherein the paraelectric material includes: $SrTiO3$, Ba(x)Sr(y)$TiO3$ (where x is −0.05, and y is 0.95), $HfZrO2$, Hf—Si—O, La-substituted $PbTiO3$, or PMN-PT based relaxor ferroelectrics.

Example 15c: An apparatus comprising: a first input to receive weights including an individual weight; a second input to receive inputs including an individual input; and a matrix multiplier coupled to the first input and the second input, wherein the matrix multiplier includes an array of multiplier cells, wherein an individual multiplier cell of the array of multiplier cells includes: a first minority gate with eleven inputs, wherein the eleven inputs include an inverted version of the individual weight; and a second minority gate with seven inputs, wherein the second minority gate is coupled to the first minority gate, wherein the seven inputs include an inverted version of the individual input, wherein the first minority gate and the second minority gate receive an inverted carry input and an inverted sum input.

Example 16c: The apparatus of example 15c, wherein the eleven inputs of the first minority gate include: a first input coupled to the inverted version of the individual weight; a second input coupled to the inverted version of the individual input; a third input coupled to the inverted sum input; a fourth input coupled to the inverted sum input; a fifth input coupled to the inverted carry input; a sixth input coupled to the inverted carry input; a seventh input coupled to a supply node; an eighth input coupled to an inverted output of the second minority gate; a ninth input coupled to the inverted output of the second minority gate; a tenth input coupled to the inverted output of the second minority gate; and an eleventh input coupled to the inverted output of the second minority gate.

Example 17c: The apparatus of example 16c, wherein the seven inputs of the second minority gate include: a twelfth input coupled to the inverted version of the individual weight; a thirteenth input coupled to the inverted version of the individual input; a fourteenth input coupled to the inverted sum input; a fifteenth input coupled to the inverted sum input; a sixteenth input coupled to the inverted carry input; a seventeenth input coupled to the inverted carry input; and an eighteenth input coupled to the supply node.

Example 18c: A system comprising: a processor circuitry to execute one or more instructions; a memory coupled to the processor circuitry, wherein the memory is to store the one or more instructions; and a communication interface to allow the processor circuitry to communicate with another device, wherein the processor circuitry includes a multiplier which comprises: a first minority gate with eleven inputs; and a second minority gate with seven inputs, wherein the second minority gate is coupled to the first minority gate, wherein the first minority gate and the second minority gate receive an inverted version of a carry input and an inverted version of a sum input.

Example 19c: The system of example 18c comprising a first inverter coupled to an output of the first minority gate, wherein an output of the first inverter is a sum output, wherein the output of the first inverter is an exclusive-OR function of: a first AND operation of a multiplier input and a multiplicand input; the sum input; and the carry input.

Example 20c: The system of example 19c comprising a second inverter coupled to an output of the second minority gate, wherein an output of second inverter is a carry output, wherein the output of the second inverter is a majority function of: a second AND operation of the multiplier input and the multiplicand input; the sum input; and the carry input.

Example 1d: An apparatus comprising: an AND gate comprising CMOS transistors; and a 1-bit full adder coupled to the AND gate, wherein the 1-bit full adder comprises a majority gate or a minority gate, wherein the majority gate or the minority gate comprises non-linear polar material.

Example 2d: The apparatus of example 1d, wherein the 1-bit full adder is to: receive a sum input as a first input; receive a first output of the AND gate as a second input; receive a carry-in input as a third input; generate a carry-out output; and generate a sum output.

Example 3d: The apparatus of example 2d, wherein the 1-bit full adder comprises: a 3-input majority gate to receive the first input, the second input, and the third input, wherein the 3-input majority gate is to generate a second output which is a majority function of the first input, the second input, and the third input; a first inverter coupled to the second output; a second inverter coupled to a third output of the first inverter, wherein a fourth output of the second inverter is to provide the carry-out output; and a 5-input majority gate to receive the third output, the first input, the second input, the third input, wherein the 5-input majority gate is to generate a fifth output which is majority function of two times the third output, and one times the first input, the second input, and the third input.

Example 4d: The apparatus of example 3d, wherein the first inverter comprises a first CMOS inverter, wherein the second inverter comprises a second CMOS inverter.

Example 5d: The apparatus of example 1d, wherein the AND gate is to receive a multiplier and a multiplicand.

Example 6d: The apparatus of example 3d, wherein the 3-input majority gate comprises: a first capacitor to receive the first input, wherein the first capacitor is coupled to a first node; a second capacitor to receive the second input, wherein the second capacitor is coupled to the first node; and a third capacitor to receive the third input, wherein the third capacitor is coupled to the first node, wherein the first node is coupled to the first inverter, wherein the first capacitor, the second capacitor, and the third capacitor include non-linear polar material.

Example 7d: The apparatus of example 6d, wherein the first capacitor, the second capacitor, and the third capacitor have a same size.

Example 8d: The apparatus of example 3d, wherein the 5-input majority gate comprises: a first capacitor to receive the first input, wherein the first capacitor is coupled to a second node; a second capacitor to receive the second input, wherein the second capacitor is coupled to the second node; a third capacitor to receive the third input, wherein the third capacitor is coupled to the second node; a fourth capacitor to receive the third output, wherein the fourth capacitor is coupled to the second node; and a fifth capacitor to receive the third output, wherein the fifth capacitor is coupled to the second node, the first capacitor, the second capacitor, the third capacitor, the fourth capacitor, and the fifth capacitor include non-linear polar material.

Example 9d: The apparatus of example 8d, wherein the first capacitor, the second capacitor, the third capacitor, the fourth capacitor, and the fifth capacitor have a same size.

Example 10d: The apparatus of example 8d comprising a buffer coupled to the second node, wherein the buffer comprises a CMOS buffer.

Example 11d: The apparatus of example 1d, wherein the non-linear polar material includes one of: ferroelectric material, paraelectric material, or non-linear dielectric.

Example 12d: The apparatus of example 11d, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La or Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 13d: The apparatus of example 11d, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 14d: An apparatus comprising: a NAND gate; an inverter coupled to the NAND gate; and a 1-bit full adder comprising a majority gate or a minority gate coupled to the inverter, wherein the 1-bit full adder comprises non-linear polar material, wherein the 1-bit full adder comprises eight capacitors.

Example 15d: The apparatus of example 14d, wherein the 1-bit full adder is to: receive a sum input as a first input; receive a first output of the inverter as a second input; receive a carry-in input as a third input; generate a carry-out output; and generate a sum output.

Example 16d: The apparatus of example 15d, wherein the 1-bit full adder comprises: a 3-input majority gate to receive the first input, the second input, and the third input, wherein the 3-input majority gate is to generate a second output which is a majority function of the first input, the second input, and the third input; a first buffer coupled to the second output; a first inverter coupled to a third output of the first buffer, wherein the third output is to provide the carry-out output; and a 5-input majority gate to receive a fourth output, wherein the fourth output is an output of the first inverter, wherein the 5-input majority gate is to receive the first input, the second input, the third input, wherein the 5-input majority gate is to generate a fifth output which is majority function of two times the third output, and one times the first input, the second input, and the third input.

Example 17d: An apparatus comprising: a first input to receive weights including an individual weight; a second input to receive inputs including an individual input; and a matrix multiplier coupled to the first input and the second input, wherein the matrix multiplier includes an array of multiplier cells, wherein an individual multiplier cell of the array of multiplier cells includes: an AND gate comprising CMOS transistors, wherein the AND gate receives the individual weight and the individual input; and a 1-bit full adder coupled to the AND gate, wherein the 1-bit full adder comprises a majority gate or a minority gate, wherein the majority gate or the minority gate comprises non-linear polar material.

Example 18d: The apparatus of example 17d, wherein the 1-bit full adder is to: receive a sum input as a third input; receive a first output of the AND gate as a fourth input; receive a carry-in input as a fifth input; generate a carry-out output; and generate a sum output.

Example 19d: The apparatus of example 18d, wherein the 1-bit full adder comprises: a 3-input majority gate to receive the third input, the fourth input, and the fifth input, wherein the 3-input majority gate is to generate a second output which is a majority function of the third input, the fourth input, and the fifth input; a first inverter coupled to the second output; a second inverter coupled to a third output of the first inverter, wherein a fourth output of the second inverter is to provide the carry-out output; and a 5-input majority gate to receive the third output, the third input, the fourth input, the fifth input, wherein the 5-input majority gate is to generate a fifth output which is a majority function of two times the third output, and one times the third input, the fourth input, and the fifth input.

Example 20d: The apparatus of example 17d, wherein the non-linear polar material includes one of: ferroelectric material, paraelectric material, or non-linear dielectric.

Example 1e: An apparatus comprising: a plurality of multiplier inputs; a plurality of multiplicand inputs; and a plurality of multiplier cells organized in an array, wherein an individual multiplier cell of the plurality of multiplier cells includes: an AND gate that receives a multiplier input from the plurality of multiplier inputs, and a multiplicand input from the plurality of multiplicand inputs; and a 1-bit full adder coupled to the AND gate, wherein the 1-bit full adder comprises a majority or a minority gate, wherein the 1-bit full adder comprises non-linear polar material.

Example 2e: The apparatus of example 1e, wherein a carry out of a first multiplier cell of a first row of the array, is provided as a carry-in input to a first multiplier cell of a second row of the array.

Example 3e: The apparatus of example 2e, wherein a sum output of a second multiplier cell of the first row of the array, is provided as a sum input to the first multiplier cell of the second row of the array.

Example 4e: The apparatus of example 2e, wherein a last row of the array comprises a plurality of 1-bit adders that receive one or more inputs from a second to last row of multiplier cells from the plurality of multiplier cells.

Example 5e: The apparatus of example 1e, wherein the AND gate comprises a majority or minority gate.

Example 6e: The apparatus of example 5e, wherein the individual multiplier cell comprises a buffer coupled to an output of the AND gate.

Example 7e: The apparatus of example 5e, wherein the 1-bit full adder is to: receive a sum input as a first input; receive a first output from the AND gate as a second input; receive a carry-in input as a third input; generate a carry-out output; and generate a sum output.

Example 8e: The apparatus of example 7e, wherein the 1-bit full adder comprises: a 3-input majority gate to receive the first input, the second input, and the third input, wherein the 3-input majority gate is to generate a second output which is a majority function of the first input, the second input, and the third input; a first inverter coupled to the second output; a second inverter coupled to a third output of the first inverter, wherein a fourth output of the second inverter is to provide the carry-out output; and a 5-input majority gate to receive the third output, the first input, the second input, the third input, wherein the 5-input majority gate is to generate a fifth output which is majority function of two times the third output, and one times the first input, the second input, and the third input.

Example 9e: The apparatus of example 8e, comprises a second buffer coupled to the fifth output, wherein the buffer is to generate a sixth output which is to drive the sum output.

Example 10e: The apparatus of example 9e, wherein the first inverter is a first CMOS inverter, wherein the second inverter is a second CMOS inverter, and wherein the second buffer is a second CMOS buffer.

Example 11e: The apparatus of example 8e, wherein the AND gate comprises: a first capacitor to receive the multiplier input, the first capacitor coupled to a node; a second capacitor to receive the multiplicand input, the second capacitor coupled to the node; and a third capacitor coupled to a ground node, wherein the third capacitor is coupled to the node, wherein the first capacitor, the second capacitor, and the third capacitor include non-linear polar material.

Example 12e: The apparatus of example 11e, wherein the first capacitor, the second capacitor, and the third capacitor have equal capacitances, wherein the 3-input majority gate includes three capacitors, wherein the 5-input majority gate includes five capacitors, wherein an individual capacitor of the three capacitors of the 3-input majority gate and wherein an individual capacitor of the five capacitors of the 5-input majority gate have a same capacitance as one of the first capacitor, the second capacitor, or the third capacitor.

Example 13e: The apparatus of example 1e, wherein the non-linear polar material includes one of: ferroelectric material, paraelectric material, or non-linear dielectric.

Example 14e: The apparatus of example 13e, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La or Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 15e: The apparatus of example 13e, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 16e: An apparatus comprising: a plurality of multiplier inputs; a plurality of multiplicand inputs; and a plurality of multiplier cells organized in an array, wherein an individual multiplier cell of the plurality of multiplier cells includes: an AND gate that receives a multiplier input from the plurality of multiplier inputs, and a multiplicand input from the plurality of multiplicand inputs, wherein the AND gate comprises a first capacitor, a second capacitor, and a third capacitor, wherein the first capacitor, the second capacitor, and the third capacitor have equal capacitances which is a first capacitance; and a 1-bit full adder coupled to the AND gate, wherein the 1-bit full adder comprises a majority or a minority gate, wherein the 1-bit full adder comprises non-linear polar material, wherein the 1-bit full adder comprises eight capacitors, wherein an individual capacitor of the eight capacitors has a second capacitance, wherein the first capacitance is larger than the second capacitance.

Example 17e: The apparatus of example 16e, wherein the AND gate comprises a majority or minority gate, wherein the 1-bit full adder is to: receive a sum input as a first input; receive a first output of the AND gate as a second input; receive a carry-in input as a third input; generate a carry-out output; and generate a sum output.

Example 18e: The apparatus of example 17e, wherein the 1-bit full adder comprises: a 3-input majority gate to receive the first input, the second input, and the third input, wherein the 3-input majority gate is to generate a second output which is a majority function of the first input, the second input, and the third input; a first inverter coupled to the second output; a second inverter coupled to a third output of the first inverter, wherein a fourth output of the second inverter is to provide the carry-out output; and a 5-input majority gate to receive the third output, the first input, the second input, the third input, wherein the 5-input majority gate is to generate a fifth output which is majority function of two times the third output, and one times the first input, the second input, and the third input.

Example 19e: A system comprising: a processor circuitry to execute one or more instructions; a memory circuitry coupled to the processor circuitry, wherein the memory circuitry is to store the one or more instructions; and a communication interface to allow the processor circuitry to communicate with another device, wherein the processor circuitry includes a multiplier which comprises: a plurality of multiplier inputs; a plurality of multiplicand inputs; and a plurality of multiplier cells organized in an array, wherein an individual multiplier cell of the plurality of multiplier cells includes: an AND gate that receives a multiplier input from the plurality of multiplier inputs, and a multiplicand input from the plurality of multiplicand inputs; and a 1-bit full adder coupled to the AND gate, wherein the 1-bit full adder comprises a majority or a minority gate, wherein the 1-bit full adder comprises non-linear polar material.

Example 20e: The system of example 19e, wherein the non-linear polar material includes one of: ferroelectric material, paraelectric material, or non-linear dielectric.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a plurality of multiplier inputs;
a plurality of multiplicand inputs; and
a plurality of multiplier cells organized in an array, wherein an individual multiplier cell of the plurality of multiplier cells includes:
an AND gate that receives a multiplier input from the plurality of multiplier inputs, and a multiplicand input from the plurality of multiplicand inputs; and
a 1-bit full adder coupled to the AND gate, wherein the 1-bit full adder comprises a majority or a minority gate, and wherein the 1-bit full adder comprises non-linear polar material, wherein the AND gate comprises:
a first capacitor to receive the multiplier input, the first capacitor coupled to a node;
a second capacitor to receive the multiplicand input, the second capacitor coupled to the node; and
a third capacitor coupled to a ground node, wherein the third capacitor is coupled to the node, wherein the first capacitor, the second capacitor, and the third capacitor include non-linear polar material.

2. The apparatus of claim 1, wherein a carry out of a first multiplier cell of a first row of the array, is provided as a carry-in input to a first multiplier cell of a second row of the array.

3. The apparatus of claim 2, wherein a sum output of a second multiplier cell of the first row of the array, is provided as a sum input to the first multiplier cell of the second row of the array.

4. The apparatus of claim 2, wherein a last row of the array comprises a plurality of 1-bit adders that receive one or more inputs from a second to last row of multiplier cells from the plurality of multiplier cells.

5. The apparatus of claim 1, wherein the AND gate comprises a majority or minority gate.

6. The apparatus of claim 5, wherein the individual multiplier cell comprises a buffer coupled to an output of the AND gate.

7. The apparatus of claim 5, wherein the 1-bit full adder is to:
receive a sum input as a first input;
receive a first output from the AND gate as a second input;
receive a carry-in input as a third input;
generate a carry-out output; and
generate a sum output.

8. The apparatus of claim 7, wherein the 1-bit full adder comprises:
a 3-input majority gate to receive the first input, the second input, and the third input, wherein the 3-input majority gate is to generate a second output which is a first majority function of the first input, the second input, and the third input;
a first inverter coupled to the second output;
a second inverter coupled to a third output of the first inverter, wherein a fourth output of the second inverter is to provide the carry-out output; and
a 5-input majority gate to receive the third output, the first input, the second input, the third input, wherein the 5-input majority gate is to generate a fifth output which is second majority function of two times the third output, and one times the first input, the second input, and the third input.

9. The apparatus of claim 8 comprises a second buffer coupled to the fifth output, wherein the second buffer is to generate a sixth output which is to drive the sum output.

10. The apparatus of claim 9, wherein the first inverter is a first CMOS inverter, wherein the second inverter is a second CMOS inverter, and wherein the second buffer is a second CMOS buffer.

11. The apparatus of claim 8, wherein the AND gate comprises:
a first capacitor to receive the multiplier input, the first capacitor coupled to a node;
a second capacitor to receive the multiplicand input, the second capacitor coupled to the node; and
a third capacitor coupled to a ground node, wherein the third capacitor is coupled to the node, and wherein the first capacitor, the second capacitor, and the third capacitor include non-linear polar material.

12. The apparatus of claim 11, wherein the first capacitor, the second capacitor, and the third capacitor have equal capacitances, wherein the 3-input majority gate includes three capacitors, wherein the 5-input majority gate includes five capacitors, wherein an individual capacitor of the three capacitors of the 3-input majority gate, and wherein an individual capacitor of the five capacitors of the 5-input majority gate have a same capacitance as one of the first capacitor, the second capacitor, or the third capacitor.

13. The apparatus of claim 1, wherein the non-linear polar material includes one of:
a ferroelectric material, a paraelectric material, or a non-linear dielectric.

14. The apparatus of claim 12, wherein the ferroelectric material includes one of:
bismuth ferrite (BFO) or BFO with a first doping material, wherein the first doping material is one of lanthanum or elements from lanthanide series of periodic table;

lead zirconium titanate (PZT) or PZT with a second doping material, wherein the second doping material is one of La or Nb;

a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);

a perovskite which includes one of: $BaTiO_3$, $PbTiO_3$, $KNbO_3$, or $NaTaO_3$;

a hexagonal ferroelectric which includes one of: $YMnO_3$, or $LuFeO_3$;

hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

hafnium (Hf), zirconium (Zr), aluminum (Al), silicon (Si), their oxides, or their alloyed oxides;

hafnium oxides as $Hf_{(1-x)}E_xO_y$, where E includes one of: Al, Ca, Ce, Dy, Er, Gd, Ge, La, Sc, Si, Sr, Sn, Zr, or Y, wherein x and y are first and second fractions, respectively;

$Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein x and y are third and fourth fractions, respectively;

y doped $HfO_2$, where y includes one of: Al, Ca, Ce, Dy, Er, Gd, Ge, La, Sc, Si, Sr, Sn, or Y;

niobate type compounds $LiNbO_3$, $LiTaO_3$, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

15. The apparatus of claim 13, wherein the paraelectric material includes one of: $SrTiO_3$, $Ba_{(x)}Sr_{(y)}TiO_3$ (wherein x is –0.05, and y is 0.95), $HfZrO_2$, Hf—Si—O, La-substituted $PbTiO_3$, or PMN-PT based relaxor ferroelectrics.

16. An apparatus comprising:
a plurality of multiplier inputs;
a plurality of multiplicand inputs; and
a plurality of multiplier cells organized in an array, wherein an individual multiplier cell of the plurality of multiplier cells includes:
an AND gate that receives a multiplier input from the plurality of multiplier inputs, and a multiplicand input from the plurality of multiplicand inputs, wherein the AND gate comprises a first capacitor, a second capacitor, and a third capacitor, wherein the first capacitor, the second capacitor, and the third capacitor have equal capacitances which is a first capacitance; and
a 1-bit full adder coupled to the AND gate, wherein the 1-bit full adder comprises a majority or a minority gate, wherein the 1-bit full adder comprises non-linear polar material, wherein the 1-bit full adder comprises eight capacitors, wherein an individual capacitor of the eight capacitors has a second capacitance, and wherein the first capacitance is larger than the second capacitance.

17. The apparatus of claim 16, wherein the AND gate comprises a majority or minority gate, and wherein the 1-bit full adder is to:
receive a sum input as a first input;
receive a first output of the AND gate as a second input;
receive a carry-in input as a third input;
generate a carry-out output; and
generate a sum output.

18. The apparatus of claim 17, wherein the 1-bit full adder comprises:
a 3-input majority gate to receive the first input, the second input, and the third input, wherein the 3-input majority gate is to generate a second output which is a first majority function of the first input, the second input, and the third input;
a first inverter coupled to the second output;
a second inverter coupled to a third output of the first inverter, wherein a fourth output of the second inverter is to provide the carry-out output; and
a 5-input majority gate to receive the third output, the first input, the second input, the third input, wherein the 5-input majority gate is to generate a fifth output which is a second majority function of two times the third output, and one times the first input, the second input, and the third input.

19. A system comprising:
a processor circuitry to execute one or more instructions;
a memory circuitry coupled to the processor circuitry, wherein the memory circuitry is to store the one or more instructions; and
a communication interface to allow the processor circuitry to communicate with another device, wherein the processor circuitry includes a multiplier which comprises:
a plurality of multiplier inputs;
a plurality of multiplicand inputs; and
a plurality of multiplier cells organized in an array, wherein an individual multiplier cell of the plurality of multiplier cells includes:
an AND gate that receives a multiplier input from the plurality of multiplier inputs, and a multiplicand input from the plurality of multiplicand inputs; and
a 1-bit full adder coupled to the AND gate, wherein the 1-bit full adder comprises a majority or a minority gate, and wherein the 1-bit full adder comprises non-linear polar material.

20. The system of claim 18, wherein the non-linear polar material includes one of:
a ferroelectric material, a paraelectric material, or a non-linear dielectric.

* * * * *